US009246122B2

(12) United States Patent
Shinotsuka et al.

(10) Patent No.: US 9,246,122 B2
(45) Date of Patent: Jan. 26, 2016

(54) ORGANIC LIGHT EMITTING DIODE, METHOD FOR MANUFACTURING SAME, IMAGE DISPLAY DEVICE, AND ILLUMINATING DEVICE

(75) Inventors: Kei Shinotsuka, Kawasaki (JP); Takayuki Okamoto, Wako (JP)

(73) Assignee: OJI HOLDINGS CORPORATION, Tokyo (JP)

( * ) Notice: Subject to any disclaimer, the term of this patent is extended or adjusted under 35 U.S.C. 154(b) by 152 days.

(21) Appl. No.: 13/882,848

(22) PCT Filed: Nov. 2, 2011

(86) PCT No.: PCT/JP2011/075285
§ 371 (c)(1),
(2), (4) Date: Sep. 23, 2013

(87) PCT Pub. No.: WO2012/060404
PCT Pub. Date: May 10, 2012

(65) Prior Publication Data
US 2014/0001450 A1    Jan. 2, 2014

(30) Foreign Application Priority Data

Nov. 2, 2010  (JP) ................................. 2010-246653

(51) Int. Cl.
*H01L 35/24* (2006.01)
*H01L 51/52* (2006.01)

(52) U.S. Cl.
CPC ........ *H01L 51/5203* (2013.01); *H01L 51/5225* (2013.01); *H01L 51/5275* (2013.01)

(58) Field of Classification Search
CPC ............ H01L 51/5225; H01L 51/5203; H01L 51/5275
USPC .......................................................... 257/40
See application file for complete search history.

(56) References Cited

U.S. PATENT DOCUMENTS

2002/0018620 A1    2/2002  Koyama et al.
2005/0088084 A1    4/2005  Cok (Continued)

FOREIGN PATENT DOCUMENTS

CN        1678146 A      10/2005
CN      101395728 A       3/2009

(Continued)

OTHER PUBLICATIONS

International Search Report issued in PCT/JP2011/075285 on Feb. 7, 2012.

(Continued)

*Primary Examiner* — Ori Nadav
(74) *Attorney, Agent, or Firm* — Knobbe Martens Olson & Bear LLP

(57) ABSTRACT

An organic light emitting diode and a method for manufacturing the same. The organic light emitting diode includes an anodic conductive layer, an organic EL layer, and a cathodic conductive layer formed from Ag or an alloy of Ag, or the like, sequentially laminated on a substrate, such that a two-dimensional lattice structure is provided on a surface of the cathodic conductive layer on an organic EL layer side, an extraction wavelength and a distance between centers of concave portions or convex portions in the two-dimensional lattice structure are within a region surrounded by specific coordinates in a graph illustrating a relationship between the light extraction wavelength and the distance, and the depth of the concave portions or a height of the convex portions is 12 nm to 180 nm.

9 Claims, 14 Drawing Sheets

(56) References Cited

U.S. PATENT DOCUMENTS

| | | | |
|---|---|---|---|
| 2006/0192483 A1 | 8/2006 | Nakanishi et al. |
| 2007/0290608 A1 | 12/2007 | Choi et al. |
| 2008/0047600 A1 | 2/2008 | Ohashi et al. |
| 2009/0267092 A1 | 10/2009 | Fukshima et al. |
| 2010/0176717 A1 | 7/2010 | Lee et al. |

FOREIGN PATENT DOCUMENTS

| | | |
|---|---|---|
| JP | A-2002-270891 | 9/2002 |
| JP | A-2004-031350 | 1/2004 |
| JP | A-2004-055551 | 2/2004 |
| JP | A-2005-535121 | 11/2005 |
| JP | A-2006-313667 | 11/2006 |
| JP | A-2008-053615 | 3/2008 |
| JP | A-2009-158478 | 7/2009 |
| JP | A-2009-272059 | 11/2009 |
| WO | WO 2004/013921 A2 | 2/2004 |

OTHER PUBLICATIONS

Feng et al., "Highly Directional Emission Via Coupled Surface-Plasmon Tunneling From Electroluminescence in Organic Light-Emitting Devices," Applied Physics Letters, vol. 87, 241109-1 to 241109-3, Dec. 6, 2005.

Hobson et al., "Surface Plasmon Mediated Emission From Organic Light-Emitting Diodes," Advanced Materials, vol. 14, No. 19, pp. 1393-1396, Oct. 2, 2002.

Office Action in Japanese Patent Application No. 2013-108855, mailed Apr. 1, 2015.

Ishihara et al., "Organic Light-Emitting Diodes With Photonic Crystals on Glass Substrate Fabricated by Nanoimprint Lithography," Applied Physics Letters, vol. 90, pp. 111114-1 to 111114-3, published online Mar. 15, 2007.

Office Action in Chinese Application No. 201180063944.8, mailed Jun. 23, 2015.

yz-SECTION

ORGANIC LIGHT EMITTING DIODE, METHOD FOR MANUFACTURING SAME, IMAGE DISPLAY DEVICE, AND ILLUMINATING DEVICE

This application is the U.S. National Phase under 35 U.S.C. §371 of International Application PCT/JP2011/075285, filed Nov. 2, 2011, designating the U.S., and published in Japanese as WO 2012/060404 on May 10, 2012, which claims priority to Japanese Patent Application No. 2010-246653, filed Nov. 2, 2010, the contents of which are incorporated herein by reference in their entireties.

TECHNICAL FIELD

The present invention relates to an organic light emitting diode, a method for manufacturing the same, and an image display device and an illuminating device that are provided with the organic light emitting diode.

Priority is claimed on Japanese Patent Application No. 2010-246653, filed Nov. 2, 2010, the content of which is incorporated herein by reference.

BACKGROUND ART

An organic light emitting diode is a light emitting device using an organic electroluminescence (hereinafter, referred to as "organic EL"), and generally, has a configuration in which an anode and a cathode are provided on both surfaces of an organic EL layer that includes a light emitting layer containing an organic light emitting material. As the organic EL layer, an electron transport layer, a hole transport layer, and the like are provided as necessary in addition to the light emitting layer. Examples of an organic light emitting diode include a bottom emission type in which an anode formed from a transparent conductive material such as ITO, an organic EL layer including a light emitting layer, and a cathode formed from a metal are sequentially formed on a transparent substrate such as a glass substrate, and light is extracted from a substrate side, a top emission type in which the cathode, the organic EL layer, and the anode are sequentially formed on the substrate, and light is extracted from a side opposite to the substrate side, and the like.

The organic light emitting diode has advantages in that the viewing angle dependency is small, the power consumption is low, and the thickness thereof is very small. On the other hand, the organic light emitting diode has a problem in that the light extraction efficiency is low. The light extraction efficiency represents a ratio of energy of light emitted to the air from a light extraction surface (for example, in a case of a bottom emission type, a substrate surface) to energy of light emitted from the light emitting layer. For example, light emitted from the light emitting layer is output in all directions, and thus the light enters into a waveguide mode in which the majority thereof repeats total reflection on an interface between a plurality of layers having refractive indexes different from each other. As a result, the light is converted into heat while propagating between layers, or emitted from a side surface, and thus the light extraction efficiency decreases. In addition, since the light emitting layer is close to the cathode formed from a metal, a part of near-field light from the light emitting layer is converted into a surface plasmon on a surface of the cathode, and disappears. As a result, the light extraction efficiency decreases.

The light extraction efficiency has an effect on brightness of a display, an illuminating device, and the like that are provided with the organic light emitting diode, and thus various methods has been reviewed to improve the light extraction efficiency. As one of the methods of improving the light extraction efficiency, a method of using surface plasmon resonance is suggested. For example, PTL 1 to PTL 4 disclose a method of providing a one-directional or two-directional periodic microstructure on a surface of a metallic layer (cathode). In this method, the periodic microstructure functions as a diffraction lattice. Due to this, energy, which disappears as the surface plasmon on the surface of the cathode is extracted as light, and thus the light extraction efficiency is improved.

CITATION LIST

Patent Literature

[PTL 1] Japanese Unexamined Patent Application, First Publication No. 2002-270891
[PTL 2] Japanese Unexamined Patent Application, First Publication No. 2004-31350
[PTL 3] Published Japanese Translation No. 2005-535121
[PTL 4] Japanese Unexamined Patent Application, First Publication No. 2009-158478

DISCLOSURE OF INVENTION

Problems to be Solved by the Invention

However, when preparing the periodic microstructure as described above, since there is no information about the distance between the centers of concave portions or convex portions that efficiently convert the surface plasmon into propagation light, or about structural height in the related art, it was difficult to maximize the light extraction efficiency.

The invention has been made in consideration of the above-described circumstances, and an object thereof is to provide an organic light emitting diode excellent in light extraction efficiency, a method for manufacturing the same, and an image display device and an illuminating device that are provided with the organic light emitting diode.

Means to Solve the Problems

The present inventors have made a thorough investigation. As a result, they have found that when a two-dimensional periodic microstructure is formed to satisfy specific parameters, the light extraction efficiency may be significantly improved, and they have completed the invention.

The invention has the following aspects.

[1] An organic light emitting diode in which at least an anodic conductive layer, an organic EL layer that includes a light emitting layer containing an organic light emitting material, and a cathodic conductive layer formed from Ag or an alloy containing 70% by mass or more of Ag are sequentially laminated on a substrate, and a two-dimensional lattice structure, in which a plurality of concave portions are periodically and two-dimensionally ordered, is provided on a surface of the cathodic conductive layer on an organic EL layer side;

wherein an extraction wavelength λ (nm) of light from the organic light emitting diode and a distance p (nm) between centers of the concave portions in the two-dimensional lattice structure are within a region surrounded by straight lines sequentially connecting the following coordinates A, B, C, D, E, F, G, H, I, J, and A in a graph illustrating a relationship between the light extraction wavelength and the distance; and the depth of the concave portions is 12 nm to 180 nm;

A (λ=450, p=258+W(½)), B (λ=500, p=319+W(½)), C (λ=600, p=406+W(½)), D (λ=700, p=484+W(½)), E ($\lambda$=800, p=561+W(½)), F ($\lambda$=800, p=493−W(½)), G ($\lambda$=700, p=425−W(½)), H ($\lambda$=600, p=353−W(½)), I ($\lambda$=500, p=262−W(½)), and J ($\lambda$=450, p=110−W(½)), in which W(½) represents a half width at half maximum of a light emitting peak in a spectrum of the light emitting material that constitutes the light emitting layer.

[2] A method for manufacturing the organic light emitting diode according to [1], the method including: preparing a substrate having a structure in which a plurality of convex portions corresponding to the two-dimensional lattice structure are periodically and two-dimensionally ordered on a surface; and sequentially laminating the anodic conductive layer, the organic EL layer, and the cathodic conductive layer on the structure.

[3] The method for manufacturing the organic light emitting diode according to [2], wherein the substrate is prepared according to a dry etching method using a particle mono-layer film as an etching mask.

[4] The method for manufacturing the organic light emitting diode according to [2], further including: preparing the substrate using the two-dimensional lattice structure as a mold, wherein the mold is a master mold that is manufactured according to the dry etching method using the particle mono-layer film as the etching mask, or a metallic electroformed mold or resin mold that is obtained by transfer of the master mold.

[5] An organic light emitting diode in which at least a cathodic conductive layer formed from Ag or an alloy containing 70% by mass or more of Ag, an organic EL layer that includes a light emitting layer containing an organic light emitting material, and an anodic conductive layer are sequentially laminated on a substrate, and a two-dimensional lattice structure, in which a plurality of concave portions are periodically and two-dimensionally ordered, is provided on a surface of the cathodic conductive layer on an organic EL layer side;

wherein an extraction wavelength $\lambda$ (nm) of light from the organic light emitting diode and a distance p (nm) between centers of the concave portions in the two-dimensional lattice structure are within a region surrounded by straight lines sequentially connecting the following coordinates A, B, C, D, E, F, G, H, I, J, and A in a graph illustrating a relationship between the light extraction wavelength and the distance; and the depth of the concave portions is 12 nm to 180 nm;

A ($\lambda$=450, p=258+W(½)), B ($\lambda$=500, p=319+W(½)), C ($\lambda$=600, p=406+W(½)), D ($\lambda$=700, p=484+W(½)), E ($\lambda$=800, p=561+W(½)), F ($\lambda$=800, p=493−W(½)), G ($\lambda$=700, p=425−W(½)), H ($\lambda$=600, p=353−W(½)), I ($\lambda$=500, p=262−W(½)), and J ($\lambda$=450, p=110−W(½)), in which W(½) represents a half width at half maximum of a light emitting peak in a spectrum of the light emitting material that constitutes the light emitting layer.

[6] A method for manufacturing the organic light emitting diode according to [5], the method including: preparing a substrate having a structure in which a plurality of concave portions corresponding to the two-dimensional lattice structure are periodically and two-dimensionally ordered on a surface; and sequentially laminating the cathodic conductive layer, the organic EL layer, and the anodic conductive layer on the structure.

[7] The method for manufacturing the organic light emitting diode according to [6], further including: preparing the substrate using the two-dimensional lattice structure as a mold, wherein the mold is a master mold that is manufactured according to a dry etching method using a particle mono-layer film as an etching mask, or a metallic electroformed mold or resin mold that is obtained by transfer of the master mold.

[8] The method for manufacturing the organic light emitting diode according to [6], wherein the substrate is prepared according to a dry etching method in which a particle mono-layer film is prepared on a surface, a metal selected from the group consisting of Cr, Ni, Fe, and Co is vacuum-deposited on the particle mono-layer film, a mesh-shaped metallic deposition layer, which reaches a surface of an original plate of the substrate from a gap between particles of the particle mono-layer film, is formed, the particle mono-layer film is removed, and the mesh-shaped metallic deposition layer is used as an etching mask.

[9] An organic light emitting diode in which at least an anodic conductive layer, an organic electroluminescence layer that includes a light emitting layer containing an organic light emitting material, and a cathodic conductive layer formed from Ag or an alloy containing 70% by mass or more of Ag are sequentially laminated on a substrate, and a two-dimensional lattice structure, in which a plurality of convex portions are periodically and two-dimensionally ordered, is provided on a surface of the cathodic conductive layer on an organic electroluminescence layer side;

wherein an extraction wavelength $\lambda$ (nm) of light from the organic light emitting diode and a distance p (nm) between centers of the convex portions in the two-dimensional lattice structure are within a region surrounded by straight lines sequentially connecting the following coordinates A, B, C, D, E, F, G, H, I, J, and A in a graph illustrating a relationship between the light extraction wavelength and the distance; and the height of the convex portions is 12 nm to 180 nm;

A ($\lambda$=450, p=258+W(½)), B ($\lambda$=500, p=319+W(½)), C ($\lambda$=600, p=406+W(½)), D ($\lambda$=700, p=484+W(½)), E ($\lambda$=800, p=561+W(½)), F ($\lambda$=800, p=493−W(½)), G ($\lambda$=700, p=425−W(½)), H ($\lambda$=600, p=353−W(½)), I ($\lambda$=500, p=262−W(½)), and J ($\lambda$=450, p=110−W(½)), in which W(½) represents a half width at half maximum of a light emitting peak in a spectrum of the light emitting material that constitutes the light emitting layer.

[10] An organic light emitting diode in which at least a cathodic conductive layer formed from Ag or an alloy containing 70% by mass or more of Ag, an organic electroluminescence layer that includes a light emitting layer containing an organic light emitting material, and an anodic conductive layer are sequentially laminated on a substrate, and a two-dimensional lattice structure, in which a plurality of convex portions are periodically and two-dimensionally ordered, is provided on a surface of the cathodic conductive layer on an organic electroluminescence layer side;

wherein an extraction wavelength $\lambda$ (nm) of light from the organic light emitting diode and a distance p (nm) between centers of the convex portions in the two-dimensional lattice structure are within a region surrounded by straight lines sequentially connecting the following coordinates A, B, C, D, E, F, G, H, I, J, and A in a graph illustrating a relationship between the light extraction wavelength and the distance; and the height of the convex portions is 12 nm to 180 nm;

A ($\lambda$=450, p=258+W(½)), B ($\lambda$=500, p=319+W(½)), C ($\lambda$=600, p=406+W(½)), D ($\lambda$=700, p=484+W(½)), E ($\lambda$=800, p=561+W(½)), F ($\lambda$=800, p=493−W(½)), G ($\lambda$=700, p=425−W(½)), H ($\lambda$=600, p=353−W(½)), I ($\lambda$=500, p=262−W(½)), and J ($\lambda$=450, p=110−W(½)), in which W(½) represents a half width at half maximum of a light emitting peak in a spectrum of the light emitting material that constitutes the light emitting layer.

[11] An organic light emitting diode in which at least an anodic conductive layer, an organic electroluminescence layer that includes a light emitting layer containing an organic light emitting material, and a cathodic conductive layer formed from Al or an alloy containing 70% by mass or more of Al are sequentially laminated on a substrate, and a two-dimensional lattice structure, in which a plurality of concave portions are periodically and two-dimensionally ordered, is provided on a surface of the cathodic conductive layer on an organic electroluminescence layer side;

wherein an extraction wavelength λ (nm) of light from the organic light emitting diode and a distance p (nm) between centers of the concave portions in the two-dimensional lattice structure are within a region surrounded by straight lines sequentially connecting the following coordinates A', B', C', D', E', F', G', H', I', J', K', L', and A' in a graph illustrating a relationship between the light extraction wavelength and the distance; and the depth of the concave portions is 12 nm to 180 nm;

A' (λ=300, p=220+W(½)), B' (λ=400, p=295+W(½)), C' (λ=500, p=368+W(½)), D' (λ=600, p=438+W(½)), E' (λ=700, p=508+W(½)), F' (λ=800, p=575+W(½)), G' (λ=800, p=505−W(½)), H' (λ=700, p=438−W(½)), I' (λ=600, p=368−W(½)), J' (λ=500, p=298−W(½)), K' (λ=400, p=225−W(½)), and L' (λ=300, p=150−W(½)), in which W(½) represents a half width at half maximum of a light emitting peak in a spectrum of the light emitting material that constitutes the light emitting layer.

[12] An organic light emitting diode in which at least a cathodic conductive layer formed from Al or an alloy containing 70% by mass or more of Al, an organic electroluminescence layer that includes a light emitting layer containing an organic light emitting material, and an anodic conductive layer are sequentially laminated on a substrate, and a two-dimensional lattice structure, in which a plurality of concave portions are periodically and two-dimensionally ordered, is provided on a surface of the cathodic conductive layer on an organic electroluminescence layer side;

wherein an extraction wavelength λ (nm) of light from the organic light emitting diode and a distance p (nm) between centers of the concave portions in the two-dimensional lattice structure are within a region surrounded by straight lines sequentially connecting the following coordinates A', B', C', D', E', F', G', H', I', J', K', L', and A' in a graph illustrating a relationship between the light extraction wavelength and the distance; and the depth of the concave portions is 12 nm to 180 nm;

A' (λ=300, p=220+W(½)), B' (λ=400, p=295+W(½)), C' (λ=500, p=368+W(½)), D' (λ=600, p=438+W(½)), E' (λ=700, p=508+W(½)), F' (λ=800, p=575+W(½)), G' (λ=800, p=505−W(½)), H' (λ=700, p=438−W(½)), I' (λ=600, p=368−W(½)), J' (λ=500, p=298−W(½)), K' (λ=400, p=225−W(½)), and L' (λ=300, p=150−W(½)), in which W(½) represents a half width at half maximum of a light emitting peak in a spectrum of the light emitting material that constitutes the light emitting layer.

[13] An organic light emitting diode in which at least an anodic conductive layer, an organic electroluminescence layer that includes a light emitting layer containing an organic light emitting material, and a cathodic conductive layer formed from Al or an alloy containing 70% by mass or more of Al are sequentially laminated on a substrate, and a two-dimensional lattice structure, in which a plurality of convex portions are periodically and two-dimensionally ordered, is provided on a surface of the cathodic conductive layer on an organic electroluminescence layer side;

wherein an extraction wavelength λ (nm) of light from the organic light emitting diode and a distance p (nm) between centers of the convex portions in the two-dimensional lattice structure are within a region surrounded by straight lines sequentially connecting the following coordinates A', B', C', D', E', F', G', H', I', J', K', L', and A' in a graph illustrating a relationship between the light extraction wavelength and the distance; and the height of the convex portions is 12 nm to 180 nm;

A' (λ=300, p=220+W(½)), B' (λ=400, p=295+W(½)), C' (λ=500, p=368+W(½)), D' (λ=600, p=438+W(½)), E' (λ=700, p=508+W(½)), F' (λ=800, p=575+W(½)), G' (λ=800, p=505−W(½)), H' (λ=700, p=438−W(½)), I' (λ=600, p=368−W(½)), J' (λ=500, p=298−W(½)), K' (λ=400, p=225−W(½)), and L' (λ=300, p=150−W(½)), in which W(½) represents a half width at half maximum of a light emitting peak in a spectrum of the light emitting material that constitutes the light emitting layer.

[14] An organic light emitting diode in which at least a cathodic conductive layer formed from Al or an alloy containing 70% by mass or more of Al, an organic electroluminescence layer that includes a light emitting layer containing an organic light emitting material, and an anodic conductive layer are sequentially laminated on a substrate, and a two-dimensional lattice structure, in which a plurality of convex portions are periodically and two-dimensionally ordered, is provided on a surface of the cathodic conductive layer on an organic electroluminescence layer side;

wherein an extraction wavelength λ (nm) of light from the organic light emitting diode and a distance p (nm) between centers of the convex portions in the two-dimensional lattice structure are within a region surrounded by straight lines sequentially connecting the following coordinates A', B', C', D', E', F', G', H', I', J', K', L', and A' in a graph illustrating a relationship between the light extraction wavelength and the distance; and the height of the convex portions is 12 nm to 180 nm;

A' (λ=300, p=220+W(½)), B' (λ=400, p=295+W(½)), C' (λ=500, p=368+W(½)), D' (λ=600, p=438+W(½)), E' (λ=700, p=508+W(½)), F' (λ=800, p=575+W(½)), G' (λ=800, p=505−W(½)), H' (λ=700, p=438−W(½)), I' (λ=600, p=368−W(½)), J' (λ=500, p=298−W(½)), K' (λ=400, p=225−W(½)), and L' (λ=300, p=150−W(½)), in which W(½) represents a half width at half maximum of a light emitting peak in a spectrum of the light emitting material that constitutes the light emitting layer.

[15] The organic light emitting diode according to [1], [5], [11], or [12], wherein the depth of the concave portions is 15 nm to 70 nm.

[16] The organic light emitting diode according to [1], [5], [11], or [12], wherein the shape of the concave portions is a shape obtained by transfer of a truncated conical shape or a columnar shape on the substrate, and the depth is 15 nm to 70 nm.

[17] The organic light emitting diode according to [1], [5], [11], or [12], wherein the shape of the concave portions is a shape obtained by transfer of a sinusoidal wave shape on the substrate, and the depth is 50 nm to 160 nm.

[18] The organic light emitting diode according to [1], [5], [11], or [12], wherein the shape of the concave portions is a shape obtained by transfer of a conical shape on the substrate, and the depth is 60 nm to 170 nm.

[19] The organic light emitting diode according to [9], [10], [13], or [14], wherein the shape of the convex portions is a truncated conical shape or a columnar shape on the substrate, and the height is 15 nm to 70 nm.

[20] The organic light emitting diode according to [9], [10], [13], or [14], wherein the shape of the convex portions is a sinusoidal wave shape on the substrate, and the height is 50 nm to 160 nm.

[21] The organic light emitting diode according to [9], [10], [13], or [14], wherein the shape of the convex portions is a conical shape on the substrate, and the height is 60 to 170 nm.

[22] An image display device including the organic light emitting diode according to any one of [1], [5], and [9] to [14].

[23] An illuminating device including the organic light emitting diode according to any one of [1], [5], and [9] to [14].

[24] A method for manufacturing the organic light emitting diode according to [10], [11], or [14], the method including: preparing a substrate having a structure in which a plurality of convex portions corresponding to the two-dimensional lattice structure are periodically and two-dimensionally ordered on a surface; and sequentially laminating the anodic conductive layer, the organic EL layer, and the cathodic conductive layer on the structure.

[25] The method for manufacturing the organic light emitting diode according to [24], wherein the substrate is prepared according to a dry etching method using a particle mono-layer film as an etching mask.

[26] The method for manufacturing the organic light emitting diode according to [24], further including: preparing the substrate using the two-dimensional lattice structure as a mold, wherein the mold is a master mold that is manufactured according to the dry etching method using the particle mono-layer film as the etching mask, or a metallic electroformed mold or resin mold that is obtained by transfer of the master mold.

[27] A method for manufacturing the organic light emitting diode according to [9], [12], or [13], the method including: preparing a substrate having a structure in which a plurality of concave portions corresponding to the two-dimensional lattice structure are periodically and two-dimensionally ordered on a surface; and sequentially laminating the cathodic conductive layer, the organic EL layer, and the anodic conductive layer on the structure.

[28] The method for manufacturing the organic light emitting diode according to [27], further including: preparing the substrate using the two-dimensional lattice structure as a mold, wherein the mold is a master mold that is manufactured according to the dry etching method using the particle mono-layer film as the etching mask, or a metallic electroformed mold or resin mold that is obtained by transfer of the master mold.

[29] The method for manufacturing the organic light emitting diode according to [27], wherein the substrate is prepared according to a dry etching method in which a particle mono-layer film is prepared on a surface, a metal selected from the group consisting of Cr, Ni, Fe, and Co is vacuum-deposited on the particle mono-layer film, a mesh-shaped metallic deposition layer, which reaches a surface of an original plate of the substrate from a gap between particles of the particle mono-layer film, is formed, the particle mono-layer film is removed, and the mesh-shaped metallic deposition layer is used as an etching mask.

In a case where the two-dimensional lattice structure is a square lattice, it is preferable to make a correction by multiplying coordinate values of the distance p (nm) between the centers of the concave portions or the distance p (nm) between the centers of the convex portions by ($\sqrt{3}/2$). That is, the invention includes the following aspects.

[30] An organic light emitting diode in which at least an anodic conductive layer, an organic EL layer that includes a light emitting layer containing an organic light emitting material, and a cathodic conductive layer formed from Ag or an alloy containing 70% by mass or more of Ag are sequentially laminated on a substrate, and a two-dimensional lattice structure (square lattice structure), in which a plurality of concave portions are periodically and two-dimensionally ordered, is provided on a surface of the cathodic conductive layer on an organic EL layer side;

wherein an extraction wavelength $\lambda$ (nm) of light from the organic light emitting diode and a distance p (nm) between centers of the concave portions in the two-dimensional lattice structure are within a region surrounded by straight lines sequentially connecting the following coordinates A, B, C, D, E, F, G, H, I, J, and A in a graph illustrating a relationship between the light extraction wavelength and the distance; and the depth of the concave portions is 12 nm to 180 nm;

A ($\lambda$=450, p=($\sqrt{3}/2$)(258+W(½))), B($\lambda$=500, p=($\sqrt{3}/2$)(319+W(½))), C ($\lambda$=600, p=($\sqrt{3}/2$)(406+W(½))), D ($\lambda$=700, p=($\sqrt{3}/2$)(484+W(½))), E ($\lambda$=800, p=($\sqrt{3}/2$)(561+W(½))), F ($\lambda$=800, p=($\sqrt{3}/2$)(493−W(½))), G ($\lambda$=700, p=($\sqrt{3}/2$)(425−W(½))), H ($\lambda$=600, p=($\sqrt{3}/2$)(353−W(½))), I ($\lambda$=500, p=($\sqrt{3}/2$)(262−W(½))), and J ($\lambda$=450, p=($\sqrt{3}/2$)(110−W(½))), in which W(½) represents a half width at half maximum of a light emitting peak in a spectrum of the light emitting material that constitutes the light emitting layer.

[31] An organic light emitting diode in which at least a cathodic conductive layer formed from Ag or an alloy containing 70% by mass or more of Ag, an organic EL layer that includes a light emitting layer containing an organic light emitting material, and an anodic conductive layer are sequentially laminated on a substrate, and a two-dimensional lattice structure (square lattice structure), in which a plurality of concave portions are periodically and two-dimensionally ordered, is provided on a surface of the cathodic conductive layer on an organic EL layer side;

wherein an extraction wavelength $\lambda$ (nm) of light from the organic light emitting diode and a distance p (nm) between centers of the concave portions in the two-dimensional lattice structure are within a region surrounded by straight lines sequentially connecting the following coordinates A, B, C, D, E, F, G, H, I, J, and A in a graph illustrating a relationship between the light extraction wavelength and the distance; and the depth of the concave portions is 12 nm to 180 nm;

A ($\lambda$=450, p=($\sqrt{3}/2$)(258+W(½))), B($\lambda$=500, p=($\sqrt{3}/2$)(319+W(½))), C ($\lambda$=600, p=($\sqrt{3}/2$)(406+W(½))), D ($\lambda$=700, p=($\sqrt{3}/2$)(484+W(½))), E ($\lambda$=800, p=($\sqrt{3}/2$)(561+W(½))), F ($\lambda$=800, p=($\sqrt{3}/2$)(493−W(½))), G ($\lambda$=700, p=($\sqrt{3}/2$)(425−W(½))), H ($\lambda$=600, p=($\sqrt{3}/2$)(353−W(½))), I ($\lambda$=500, p=($\sqrt{3}/2$)(262−W(½))), and J ($\lambda$=450, p=($\sqrt{3}/2$)(110−W(½))), in which W(½) represents a half width at half maximum of a light emitting peak in a spectrum of the light emitting material that constitutes the light emitting layer.

[32] An organic light emitting diode in which at least an anodic conductive layer, an organic electroluminescence layer that includes a light emitting layer containing an organic light emitting material, and a cathodic conductive layer formed from Ag or an alloy containing 70% by mass or more of Ag are sequentially laminated on a substrate, and a two-dimensional lattice structure (square lattice structure), in which a plurality of convex portions are periodically and two-dimensionally ordered, is provided on a surface of the cathodic conductive layer on an organic electroluminescence layer side;

wherein an extraction wavelength $\lambda$ (nm) of light from the organic light emitting diode and a distance p (nm) between centers of the convex portions in the two-dimensional lattice structure are within a region surrounded by straight lines sequentially connecting the following coordinates A, B, C, D, E, F, G, H, I, J, and A in a graph illustrating a relationship between the light extraction wavelength and the distance; and the height of the convex portions is 12 nm to 180 nm1;

A ($\lambda$=450, p=($\sqrt{3}/2$)(258+W(½))), B($\lambda$=500, p=($\sqrt{3}/2$)(319+W(½))), C ($\lambda$=600, p=($\sqrt{3}/2$)(406+W(½))), D ($\lambda$=700, p=($\sqrt{3}/2$)(484+W(½))), E ($\lambda$=800, p=($\sqrt{3}/2$)(561+W(½))), F ($\lambda$=800, p=($\sqrt{3}/2$)(493−W(½))), G ($\lambda$=700, p=($\sqrt{3}/2$)(425−W(½))), H ($\lambda$=600, p=($\sqrt{3}/2$)(353−W(½))), I ($\lambda$=500, p=($\sqrt{3}/2$)(262−W(½))), and J ($\lambda$=450, p=($\sqrt{3}/2$)(110−W(½))), in which W(½) represents a half width at half maximum of a light emitting peak in a spectrum of the light emitting material that constitutes the light emitting layer.

[33] An organic light emitting diode in which at least a cathodic conductive layer formed from Ag or an alloy containing 70% by mass or more of Ag, an organic electroluminescence layer that includes a light emitting layer containing an organic light emitting material, and an anodic conductive layer are sequentially laminated on a substrate, and a two-dimensional lattice structure (square lattice structure), in which a plurality of convex portions are periodically and two-dimensionally ordered, is provided on a surface of the cathodic conductive layer on an organic electroluminescence layer side;

wherein an extraction wavelength $\lambda$ (nm) of light from the organic light emitting diode and a distance p (nm) between centers of the convex portions in the two-dimensional lattice structure are within a region surrounded by straight lines sequentially connecting the following coordinates A, B, C, D, E, F, G, H, I, J, and A in a graph illustrating a relationship between the light extraction wavelength and the distance; and the height of the convex portions is 12 nm to 180 nm;

A ($\lambda$=450, p=($\sqrt{3}/2$)(258+W(½))), B($\lambda$=500, p=($\sqrt{3}/2$)(319+W(½))), C ($\lambda$=600, p=($\sqrt{3}/2$)(406+W(½))), D ($\lambda$=700, p=($\sqrt{3}/2$)(484+W(½))), E ($\lambda$=800, p=($\sqrt{3}/2$)(561+W(½))), F ($\lambda$=800, p=($\sqrt{3}/2$)(493−W(½))), G ($\lambda$=700, p=($\sqrt{3}/2$)(425−W(½))), H ($\lambda$=600, p=($\sqrt{3}/2$)(353−W(½))), I ($\lambda$=500, p=($\sqrt{3}/2$)(262−W(½))), and J ($\lambda$=450, p=($\sqrt{3}/2$)(110−W(½))), in which W(½) represents a half width at half maximum of a light emitting peak in a spectrum of the light emitting material that constitutes the light emitting layer.

[34] An organic light emitting diode in which at least an anodic conductive layer, an organic electroluminescence layer that includes a light emitting layer containing an organic light emitting material, and a cathodic conductive layer formed from Al or an alloy containing 70% by mass or more of Al are sequentially laminated on a substrate, and a two-dimensional lattice structure (square lattice structure), in which a plurality of concave portions are periodically and two-dimensionally ordered, is provided on a surface of the cathodic conductive layer on an organic electroluminescence layer side;

wherein an extraction wavelength $\lambda$ (nm) of light from the organic light emitting diode and a distance p (nm) between centers of the concave portions in the two-dimensional lattice structure are within a region surrounded by straight lines sequentially connecting the following coordinates A', B', C', D', E', F', G', H', I', J', K', L', and A' in a graph illustrating a relationship between the light extraction wavelength and the distance; and the depth of the concave portions is 12 nm to 180 nm;

A' ($\lambda$=300, p=($\sqrt{3}/2$)(220+W(½))), B' ($\lambda$=400, p=($\sqrt{3}/2$)(295+W(½))), C' ($\lambda$=500, p=($\sqrt{3}/2$)(368+W(½))), D' ($\lambda$=600, p=($\sqrt{3}/2$)(438+W(½))), E' ($\lambda$=700, p=($\sqrt{3}/2$)(508+W(½))), F' ($\lambda$=800, p=($\sqrt{3}/2$)(575+W(½))), G' ($\lambda$=800, p=($\sqrt{3}/2$)(505−W(½))), H' ($\lambda$=700, p=($\sqrt{3}/2$)(438−W(½))), I' ($\lambda$=600, p=($\sqrt{3}/2$)(368−W(½))), J' ($\lambda$=500, p=($\sqrt{3}/2$)(298−W(½))), K' ($\lambda$=400, p=($\sqrt{3}/2$)(225−W(½))), and L' ($\lambda$=300, p=($\sqrt{3}/2$)(150−W(½))), in which W(½) represents a half width at half maximum of a light emitting peak in a spectrum of the light emitting material that constitutes the light emitting layer.

[35] An organic light emitting diode in which at least a cathodic conductive layer formed from Al or an alloy containing 70% by mass or more of Al, an organic electroluminescence layer that includes a light emitting layer containing an organic light emitting material, and an anodic conductive layer are sequentially laminated on a substrate, and a two-dimensional lattice structure (square lattice structure), in which a plurality of concave portions are periodically and two-dimensionally ordered, is provided on a surface of the cathodic conductive layer on an organic electroluminescence layer side;

wherein an extraction wavelength $\lambda$ (nm) of light from the organic light emitting diode and a distance p (nm) between centers of the concave portions in the two-dimensional lattice structure are within a region surrounded by straight lines sequentially connecting the following coordinates A', B', C', D', E', F', G', H', I', J', K', L', and A' in a graph illustrating a relationship between the light extraction wavelength and the distance; and the depth of the concave portions is 12 nm to 180 nm;

A' ($\lambda$=300, p=($\sqrt{3}/2$)(220+W(½))), B' ($\lambda$=400, p=($\sqrt{3}/2$)(295+W(½))), C' ($\lambda$=500, p=($\sqrt{3}/2$)(368+W(½))), D' ($\lambda$=600, p=($\sqrt{3}/2$)(438+W(½))), E' ($\lambda$=700, p=($\sqrt{3}/2$)(508+W(½))), F' ($\lambda$=800, p=($\sqrt{3}/2$)(575+W(½))), G' ($\lambda$=800, p=($\sqrt{3}/2$)(505−W(½))), H' ($\lambda$=700, p=($\sqrt{3}/2$)(438−W(½))), I' ($\lambda$=600, p=($\sqrt{3}/2$)(368−W(½))), J' ($\lambda$=500, p=($\sqrt{3}/2$)(298−W(½))), K' ($\lambda$=400, p=($\sqrt{3}/2$)(225−W(½))), and L' ($\lambda$=300, p=($\sqrt{3}/2$)(150−W(½))), in which W(½) represents a half width at half maximum of a light emitting peak in a spectrum of the light emitting material that constitutes the light emitting layer.

[36] An organic light emitting diode in which at least an anodic conductive layer, an organic electroluminescence layer that includes a light emitting layer containing an organic light emitting material, and a cathodic conductive layer formed from Al or an alloy containing 70% by mass or more of Al are sequentially laminated on a substrate, and a two-dimensional lattice structure (square lattice structure), in which a plurality of convex portions are periodically and two-dimensionally ordered, is provided on a surface of the cathodic conductive layer on an organic electroluminescence layer side;

wherein an extraction wavelength $\lambda$ (nm) of light from the organic light emitting diode and a distance p (nm) between centers of the convex portions in the two-dimensional lattice structure are within a region surrounded by straight lines sequentially connecting the following coordinates A', B', C', D', E', F', G', H', I', J', K', L', and A' in a graph illustrating a relationship between the light extraction wavelength and the distance; and the height of the convex portions is 12 nm to 180 nm;

A' ($\lambda$=300, p=($\sqrt{3}/2$)(220+W(½))), B' ($\lambda$=400, p=($\sqrt{3}/2$)(295+W(½))), C' ($\lambda$=500, p=($\sqrt{3}/2$)(368+W(½))), D' ($\lambda$=600, p=($\sqrt{3}/2$)(438+W(½))), E' ($\lambda$=700, p=($\sqrt{3}/2$)(508+W(½))), F' ($\lambda$=800, p=($\sqrt{3}/2$)(575+W(½))), G' ($\lambda$=800, p=($\sqrt{3}/2$)(505−W(½))), H' ($\lambda$=700, p=($\sqrt{3}/2$)(438−W(½))), I' ($\lambda$=600, p=($\sqrt{3}/2$)(368−W(½))), J' ($\lambda$=500, p=($\sqrt{3}/2$)(298−W(½))), K' ($\lambda$=400, p=($\sqrt{3}/2$)(225−W(½))), and L' ($\lambda$=300, p=($\sqrt{3}/2$)(150−W(½))), in which W(½) represents a half width at half maximum of a light emitting peak in a spectrum of the light emitting material that constitutes the light emitting layer.

[37] An organic light emitting diode in which at least a cathodic conductive layer formed from Al or an alloy containing 70% by mass or more of Al, an organic electroluminescence layer that includes a light emitting layer containing an organic light emitting material, and an anodic conductive layer are sequentially laminated on a substrate, and a two-dimensional lattice structure (square lattice structure), in which a plurality of convex portions are periodically and two-dimensionally ordered, is provided on a surface of the cathodic conductive layer on an organic electroluminescence layer side;

wherein an extraction wavelength λ (nm) of light from the organic light emitting diode and a distance p (nm) between centers of the convex portions in the two-dimensional lattice structure are within a region surrounded by straight lines sequentially connecting the following coordinates A', B', C', D', E', F', G', H', I', J', K', L', and A' in a graph illustrating a relationship between the light extraction wavelength and the distance; and the height of the convex portions is 12 nm to 180 nm;

A' (λ=300, p=(√3/2)(220+W(½))), B' (λ=400, p=(√3/2)(295+W(½))), C' (λ=500, p=(√3/2)(368+W(½))), D' (λ=600, p=(√3/2)(438+W(½))), E' (λ=700, p=(√3/2)(508+W(½))), F' (λ=800, p=(√3/2)(575+W(½))), G' (λ=800, p=(√3/2)(505−W(½))), H' (λ=700, p=(√3/2)(438−W(½))), I' (λ=600, p=(√3/2)(368−W(½))), J' (λ=500, p=(√3/2)(298−W(½))), K' (λ=400, p=(√3/2)(225−W(½))), and L' (λ=300, p=(√3/2)(150−W(½))), in which W(½) represents a half width at half maximum of a light emitting peak in a spectrum of the light emitting material that constitutes the light emitting layer.

Effect of the Invention

According to the invention, an organic light emitting diode excellent in light extraction efficiency, a method for manufacturing the same, and an image display device and an illuminating device that are provided with the organic light emitting diode may be provided.

EMBODIMENTS FOR CARRYING OUT THE INVENTION

<<Organic Light Emitting Diode of First Aspect>>

In an organic light emitting diode according to a first aspect of the invention, at least an anodic conductive layer, an organic EL layer including a light emitting layer, and a cathodic conductive layer formed from Ag or an alloy containing 70% by mass or more of Ag are sequentially laminated on a substrate. A two-dimensional lattice structure, in which a plurality of concave portions are periodically and two-dimensionally ordered, is provided on a surface of the cathodic conductive layer on an organic EL layer side.

An extraction wavelength λ (nm) of light from the organic light emitting diode and a distance p (nm) between centers of the concave portions in the two-dimensional lattice structure are within a region surrounded by straight lines sequentially connecting the following coordinates A, B, C, D, E, F, G, H, I, J, and A in a graph illustrating a relationship between the light extraction wavelength and the distance, and the depth of the concave portions is 15 nm to 70 nm.

A (λ=450, p=258+W(½)), B (λ=500, p=319+W(½)), C (λ=600, p=406+W(½)), D (λ=700, p=484+W(½)), E (λ=800, p=561+W(½)), F (λ=800, p=493−W(½)), G (λ=700, p=425−W(½)), H (λ=600, p=353−W(½)), I (λ=500, p=262−W(½)), and J (λ=450, p=110−W(½)), in which W(½) represents a half width at half maximum of a light emitting peak in a spectrum of the light emitting material that constitutes the light emitting layer.

Hereinafter, the organic light emitting diodes of the aspects will be described with reference to the attached drawings.

Figure 1:
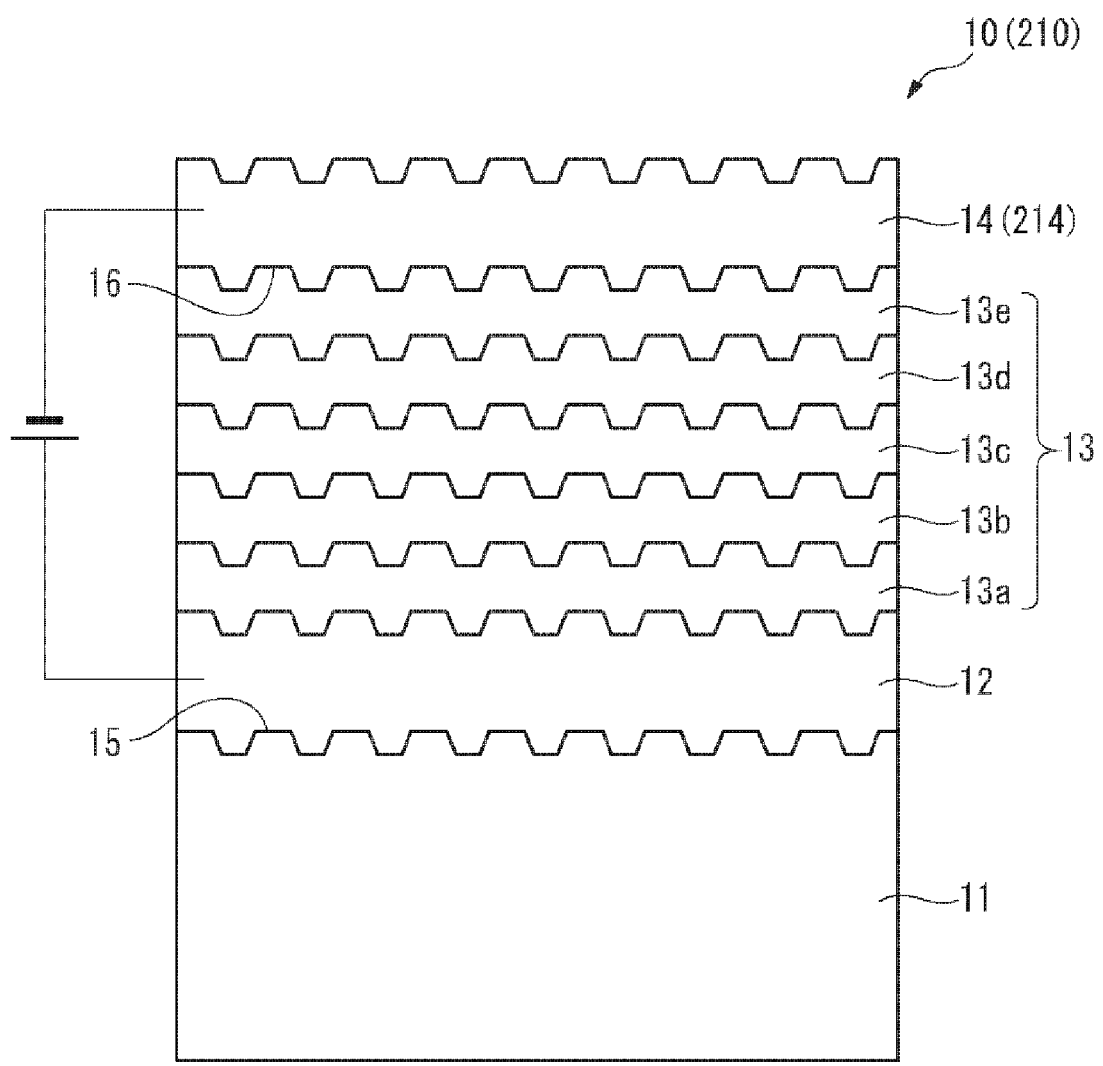
FIG. 1 is a schematic diagram illustrating an example of the structure of organic light emitting diodes of first and fifth aspects.

FIG. 1 shows a partial schematic cross-sectional diagram illustrating a configuration according to an embodiment of the organic light emitting diode of a first aspect of the invention.

The organic light emitting diode 10 of this embodiment is an organic light emitting diode having a layer configuration of a type generally called a bottom emission type. In the organic light emitting diode 10, an anodic conductive layer 12 formed from a transparent conductor, an organic EL layer 13, and a cathodic conductive layer 14 formed from Ag or an alloy containing 70% by mass or more of Ag are sequentially laminated on a transparent substrate 11.

The organic EL layer 13 includes a hole implantation layer 13a, a hole transport layer 13b, a light emitting layer 13c containing an organic light emitting material, an electron transport layer 13d, and an electron implantation layer 13e that are sequentially laminated from the side of the anodic conductive layer 12. In the layers, the function of one layer may be one, or two or more. For example, the electron transport layer and the light emitting layer may be realized by one layer.

A voltage is applied to the anodic conductive layer 12 and the cathodic conductive layer 14.

In the organic light emitting diode 10, when a voltage may be applied to the anodic conductive layer 12 and the cathodic conductive layer 14, holes and electrons are implanted to the organic EL layer 13 from the anodic conductive layer 12 and the cathodic conductive layer 14, respectively. The holes and electrons that are implanted are coupled with each other in the light emitting layer 13c, and thus excitons are generated. When the excitons are recoupled, light is generated.

A structure (two-dimensional lattice structure), in which a plurality of convex portions 15 are periodically and two-dimensionally ordered, is provided on a surface of the substrate 11 on a side at which the anodic conductive layer 12 is laminated. When the anodic conductive layer 12, the organic EL layer 13 (the hole implantation layer 13a, the hole transport layer 13b, the light emitting layer 13c, the electron transport layer 13d, and the electron implantation layer 13e) are sequentially laminated on the structure, the same structure as the surface of the substrate 11 is formed on surfaces of the respective layers on a cathodic conductive layer 14 side. Accordingly, when the cathodic conductive layer 14 is finally laminated on the organic EL layer 13, a structure inverted from the structure of the surface of the substrate 11, that is, a two-dimensional lattice structure, in which a plurality of concave portions 16 are periodically and two-dimensionally ordered, is formed on a surface of the cathodic conductive layer 14 on an organic EL layer 13 side.

When the two-dimensional lattice structure is provided, a surface plasmon is converted into propagation light on a surface of the cathodic conductive layer 14.

When light emission occurs from light emitting molecules in the light emitting layer 13c, near-field light is generated at a very close portion. Since a distance between the light emitting layer 13c and the cathodic conductive layer 14 is very short, the near-field light is converted into energy of a propagation type surface plasmon on a surface of the cathodic conductive layer 14.

The propagation-type surface plasmon on the metal surface represents that a compression wave of free electrons occurred by an incident electromagnetic wave (near-field light or the like) is accompanied with a surface electromagnetic field. In a case of the surface plasmon that is present on a flat metal surface, a dispersion curve of the surface plasmon and a dispersion straight line of light (spatial propagation light) do not intersect each other, and thus energy of the surface plasmon may not be extracted as light. Conversely, when a lattice structure is formed in the metal surface, the dispersion curve of the spatial propagation light diffracted by the lattice structure intersects the dispersion curve of the surface plasmon, and thus the energy of the surface plasmon may be extracted as radiant light.

As described above, when the two-dimensional lattice structure is provided, energy of the light that has disappeared as the surface plasmon is extracted. The extracted energy is radiated from a surface of the cathodic conductive layer 14 as radiant light. At this time, the light that is radiated from the cathodic conductive layer 14 is highly directional, and the majority thereof faces to an extraction surface. Accordingly, light with high intensity is emitted from the extraction surface, and thus the extraction efficiency is improved.

Here, "periodically and two-dimensionally ordered" represents a state in which the plurality of concave portions 16 are periodically disposed in at least two directions on a plane. When being two-dimensionally ordered, the extraction efficiency is higher compared to a case of one-dimension (a structure in which an arrangement direction is one direction. For example, a plurality of grooves (or peaks) are disposed in parallel with each other).

Preferred specific examples of the two-dimensional lattice structure include a lattice structure in which the arrangement direction includes two directions and an intersection angle thereof is 90° (square lattice), a lattice structure in which the arrangement direction includes three directions and an intersection angle thereof is 60° (triangular lattice (also, referred to as a hexagonal lattice)), and the like, and the triangular lattice structure is particularly preferable. As the arrangement direction increases, conditions capable of obtaining diffracted light increase, and thus the surface plasmon may be converted into propagation light with high efficiency.

A method of preparing the triangular lattice structure is not particularly limited. However, for example, electron beam lithography, mechanical cutting, laser thermal lithography, interference exposure, more specifically, two-beam interference exposure and reduction exposure, an anodic oxidation method of alumina, a nano imprint method from a master mold manufactured by the above-described methods, and the like may be used. In a method in which a particle mono-layer film to be described later is used, particles constituting the particle mono-layer film may be disposed in two-dimensional hexagonal closest packing, and thus when dry etching is carried out using the particle mono-layer film as an etching mask, the triangular lattice structure may be conveniently formed.

A method of preparing the square lattice structure is not particularly limited. However, for example, electron beam lithography, mechanical cutting, laser thermal lithography, interference exposure, more specifically, two-beam interference exposure and reduction exposure, a nano imprint method from a master mold manufactured by the above-described methods, and the like may be used.

The shorter the distance from the surface of the cathodic metallic layer on a light emitting layer side to the light emitting layer is, the larger a shift proportion of light emitting energy to the surface plasmon is. The invention functions in a relatively effective manner with respect to such a device.

The depth of the concave portions 16 is 12 nm to 180 nm, and more preferably 15 nm to 70 nm.

When the depth is less than 12 nm or exceeds 180 nm, an improvement effect of the light extraction efficiency is not sufficient.

The reason why the depth of the concave portions 16 is limited to the above-described range is as follows. That is, when the depth of the concave portions 16 is less than 12 nm, the diffraction wave of the surface plasmon may not be sufficiently generated by the two-dimensional lattice structure, and thus the effect of extracting the surface plasmon as radiant light decreases. In addition, when the depth of the concave portions 16 exceeds 180 nm, the surface plasmon starts to have localized type properties instead of the propagation type, and thus the extraction efficiency of the radiant light decreases. Furthermore, in a case where the depth of the concave portions 16 exceeds 180 nm, when sequentially laminating an anodic layer, an organic thin film layer, and a cathodic layer of the organic light emitting diode, concavities and convexities become steep. Therefore, a possibility that the anode and the cathode are short-circuited increases, and thus this range is not preferable.

The depth of the concave portions 16 is the same as the height of the convex portions 15, and thus the height of the convex portions 15 may be indirectly determined by measurement using AFM (atomic force microscope). Specifically, first, with regard to one site of randomly selected region of 5 μm×5 μm in the two-dimensional lattice structure, an AFM image is obtained. Next, a line is drawn in a diagonal direction of the AFM image, and the height of the convex portions 15 that interest the line is individually obtained. An average value of the height of the convex portions 15 is obtained. This process is carried out in the same manner with respect to total 25 sites of randomly selected regions of 5 μm×5 μm, and an average value of the height of the convex portions 15 at each of the regions is obtained. The average values of the 25 sites of regions, which are obtained in this manner, are further averaged, and the resultant average value is set as the height of the convex portions 15.

A shape of the convex portions 15 is not particularly limited as long as the effect of the invention is obtained, and examples of the shape include a columnar shape, a conical shape, a truncated conical shape, a sinusoidal wave shape, a hemispheric shape, an approximately hemispheric shape, an elliptical shape, shapes derived from the shapes, and the like. Another aspect of the shape of the convex portions 15 includes shapes in which a cross-section along an axis is a rectangular shape, a triangular shape, a trapezoidal shape, a sinusoidal wave shape, a semicircular shape, an approximately semicircular shape, an elliptical shape, shapes derived from the shapes, and the like. In addition, tangential lines between the convex portions 15 and a substrate surface may come into contact with each other, or may be separated from each other as long as the effect of the invention is provided.

The light extraction efficiency from the surface plasmon varies according to the shape and the height of the convex portions.

In a case where the shape of the convex portions 15 is the truncated conical shape, the height is preferably 12 nm to 180 nm, more preferably 15 nm to 70 nm, and still more preferably 20 nm to 50 nm. The truncated conical shape that is exemplified here represents a structure in which the upper bottom and the lower bottom have a circular shape, a diameter ration thereof is within a range of 10/100 to 90/100, planes of the upper bottom and the lower bottom are parallel with each other, and each generating line is a straight line. As a microstructure, from arrangement in which two lower bottoms of two adjacent columns come into contact with each other to arrangement in which the two lower bottoms are apart from each other by a distance of approximately five times the diameter of the lower bottoms are preferable.

Figure 20:
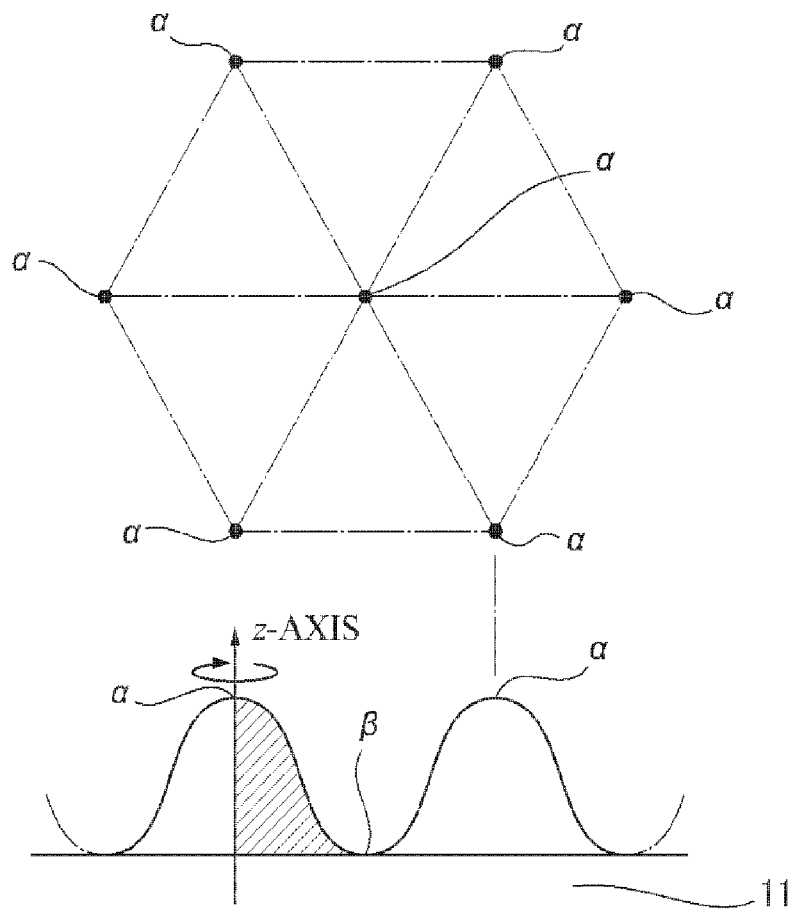
FIG. 20 is a diagram illustrating an example of the structure of the convex portions having a sinusoidal wave shape of the invention.
Figure 21:
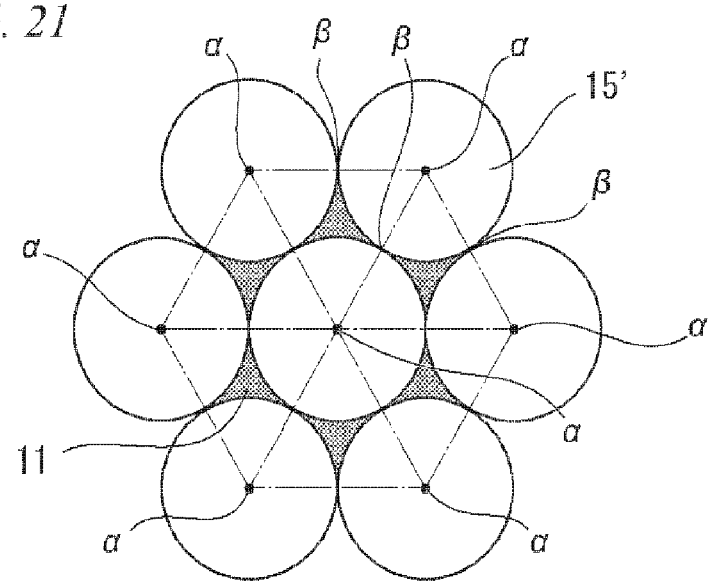
FIG. 21 is a top view illustrating an example of arrangement of the convex portions having a sinusoidal wave shape of the invention.

In addition, in a case where the shape of the convex portions 15 is the sinusoidal wave shape, the height is preferably 12 nm to 180 nm, more preferably 50 nm to 160 nm, and still more preferably 70 nm to 140 nm. Here, for example, when drawing a straight line connecting two adjacent points of lattice points α of hexagonal closest arrangement on a plane, and considering a sinusoidal wave in which a plane including the straight line and the Z-axis is set as a vibrating surface, and when assuming a sinusoidal wave of a wavelength in which each of the respective lattice points α has the maximum value, and an intermediate point β of the lattice points adjacent to each other has the minimum value, the sinusoidal wave shape represents a stereoscopic shape (FIG. 20) that is constituted by a plane obtained by cutting the sinusoidal wave at a position β apart from arbitrary lattice point α by ±½ wavelength and by rotating the cut sinusoidal wave about the Z-axis passing through the lattice point. When the stereoscopic shape 15' is set as a constituent unit, FIG. 21 shows a top view of a structure in which a plurality of the constituent units are disposed in such a manner that the vertex α of the sinusoidal wave coincides with the lattice point α of the hexagonal closest packing arrangement. In FIG. 21, a region, which is located in the vicinity of the center of an equilateral triangle constituted by three lattice points closest to each other and which is not coated with by a rotation plane, has the same height as the lowest height (the minimum value of the sinusoidal wave) of the rotation plane that is a top horizontal plane of the substrate 11.

In a case where the shape of the convex portions 15 is the conical shape, the height is preferably 12 nm to 180 nm, more preferably 60 nm to 170 nm, and still more preferably 80 nm to 150 nm. Here, for example, the conical shape represents a structure in which the lower bottom has a circular shape and a generating line is a straight line. As a microstructure, from arrangement in which two lower bottoms of two adjacent columns come into contact with each other to arrangement in which the two lower bottoms are apart from each other by a distance of approximately five times the diameter of the lower bottoms are preferable.

In addition, in a case where the shape of the convex portions 15 is a columnar shape, the height is preferably 12 nm to 180 nm, more preferably 15 nm to 70 nm, and still more preferably 20 nm to 50 nm. Here, for example, the columnar shape represents a structure in which the upper bottom and lower bottom have a circular shape, the diameters of the upper bottom and lower bottom are the same as each other, an upper bottom plane and a lower bottom plane are parallel with each other, and a generating line is a straight line. As a microstructure, from an arrangement in which two lower bottoms of two adjacent columns come into contact with each other to an arrangement in which the two lower bottoms are apart from each other by a distance of approximately five times the diameter of the lower bottoms are preferable.

The truncated conical shape, the sinusoidal wave shape, the conical shape, and the columnar shape represent typical shapes, and the structure of the convex portions or concave portions of the invention is not strictly limited to any of the above-described shapes as long as the effect of the invention is provided. That is, shapes (approximate shapes) that are slightly deviated from the definition of the basic shapes are included in the scope of the invention as long as the effect of the invention is provided.

All of the structures of the truncated conical shape, the sinusoidal wave shape, the conical shape, and the columnar shape are given for explanation of a convex type, but the effect of the invention may be obtained with respect to a concave type that is an inverted type thereof. The definition of the shape of the concave type structure relates to a plane symmetry structure (mirror image) with a basal plane (a plane including the lowest portion of a plurality of structural protrusions) of the convex type surface structure set as a reference plane (mirror plane). For example, when the plane symmetry structure is formed on a surface of a glass substrate, a space on a surface of the structure on a reference plane side is a void, and a space on the surface of the structure on a side opposite to the reference plane is constituted by a glass material.

Figure 12:
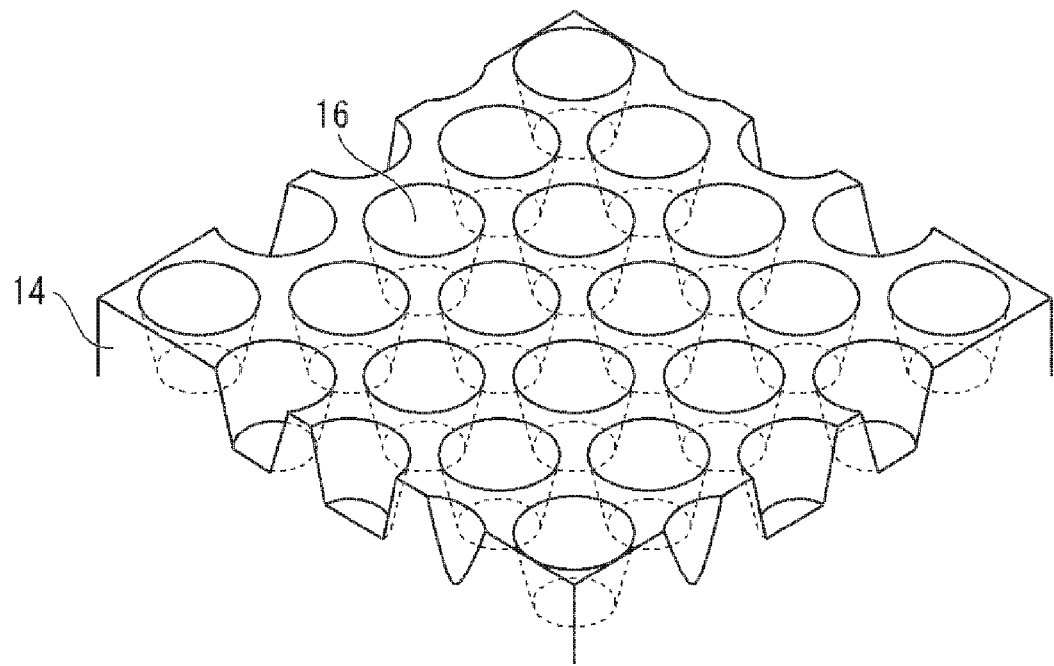
FIG. 12 is a perspective diagram illustrating an example of a cathodic conductive layer that includes concave portions having a truncated conical shape on a surface on an organic EL layer side.

FIG. 12 shows a perspective diagram illustrating a surface of the cathodic conductive layer 14 on an organic EL layer side in a case of using the substrate 11 having a structure in which the plurality of convex portions are periodically and two-dimensionally ordered. FIG. 12 shows an example in which a plurality of concave portions 16 having a truncated conical shape are periodically formed to be apart from each other. The organic EL layer 13 (not shown) having a refractive index n comes into contact with an upper side of the cathodic conductive layer 14.

Figure 13:
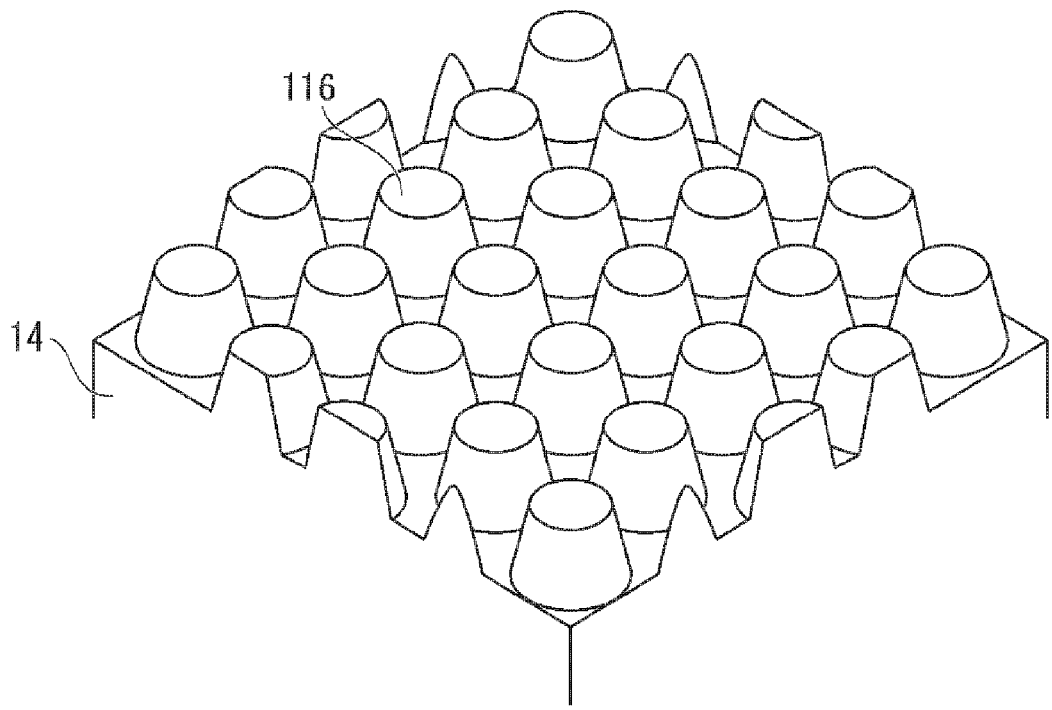
FIG. 13 is a perspective diagram illustrating an example of the cathodic conductive layer that includes convex portions having a truncated conical shape on the surface of the organic EL layer side.

FIG. 13 shows an example in which a plurality of convex portions 116 having a truncated conical shape are periodically formed to be apart from each other on a surface of the cathodic conductive layer 14 of a third aspect to be described later on an organic EL layer side. The organic EL layer 13 (not shown) having a refractive index n comes into contact with an upper side of the cathodic conductive layer 14.

Figure 14:
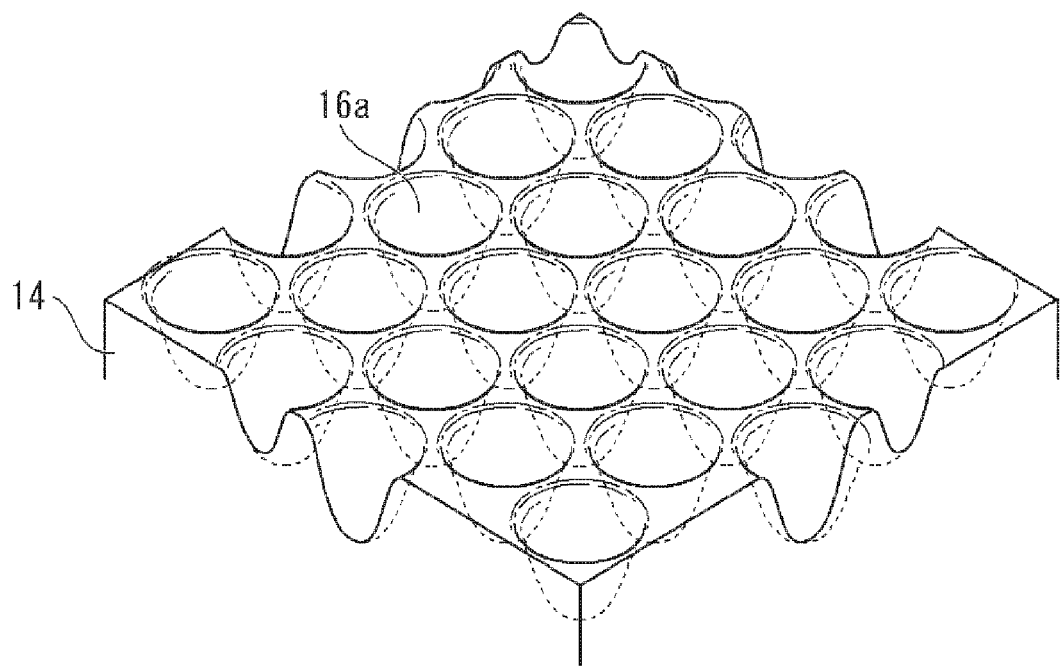
FIG. 14 is a perspective diagram illustrating an example of the cathodic conductive layer that includes concave portions having a sinusoidal wave shape on the surface of the organic EL layer side.

FIG. 14 shows a perspective diagram illustrating a surface of the cathodic conductive layer 14 on an organic EL layer side in a case of using the substrate 11 having a structure in which the plurality of convex portions are periodically and two-dimensionally ordered. FIG. 14 shows an example in which a plurality of concave portions 16a having a sinusoidal wave shape are periodically formed. The organic EL layer 13 (not shown) having a refractive index n comes into contact with an upper side of the cathodic conductive layer 14.

Figure 15:
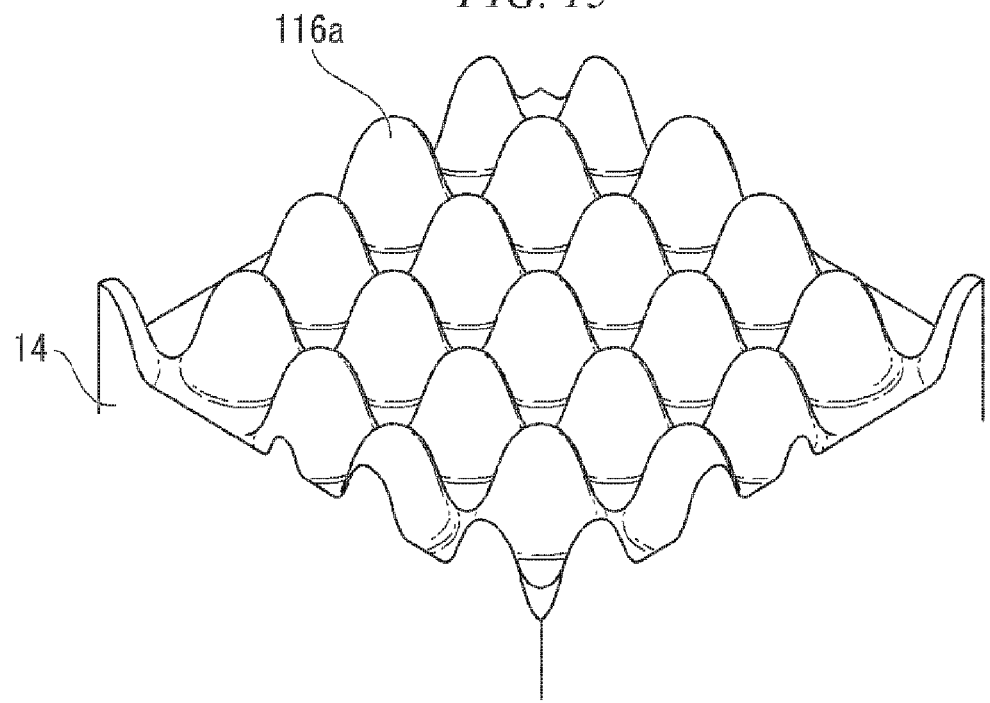
FIG. 15 is a perspective diagram illustrating an example of the cathodic conductive layer that includes convex portions having a sinusoidal wave shape on the surface of the organic EL layer side.

FIG. 15 shows an example in which a plurality of convex portions 116a having a sinusoidal wave shape are periodically formed on a surface of the cathodic conductive layer 14 of a third aspect to be described later on an organic EL layer side. The organic EL layer 13 (not shown) having a refractive index n comes into contact with an upper side of the cathodic conductive layer 14.

Figure 16:
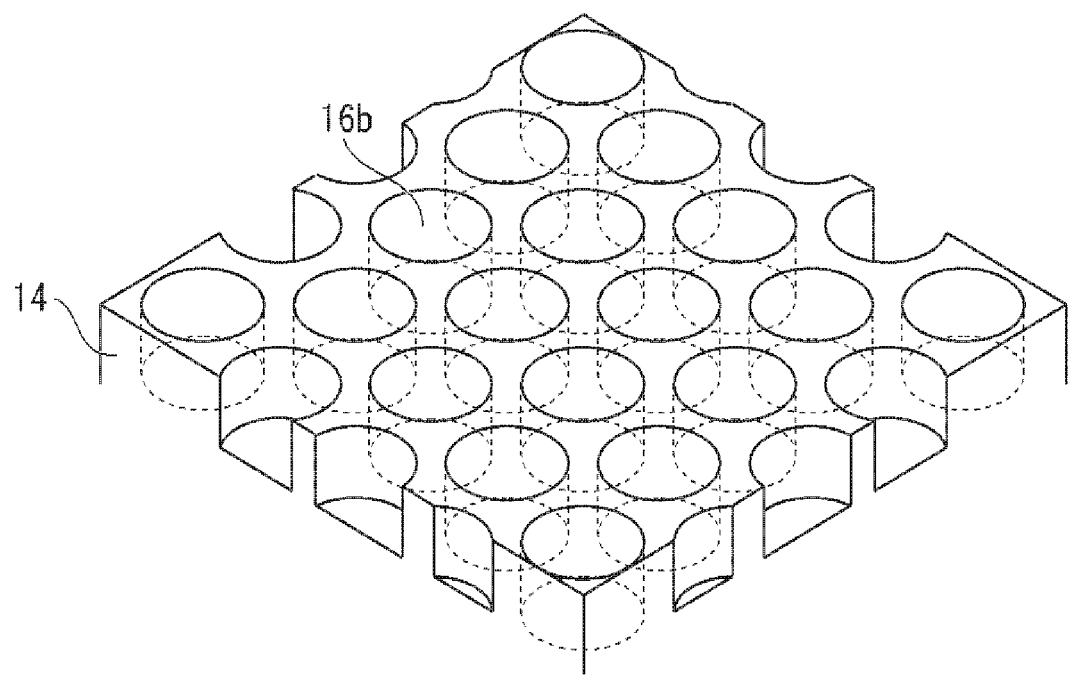
FIG. 16 is a perspective diagram illustrating an example of the cathodic conductive layer that includes columnar concave portions on the surface of the organic EL layer side.

FIG. 16 shows a perspective diagram illustrating a surface of the cathodic conductive layer 14 on an organic EL layer side in a case of using the substrate 11 having a structure in which the plurality of convex portions are periodically and two-dimensionally ordered. FIG. 16 shows an example in which a plurality of concave portions 16b having a columnar shape are periodically formed to be apart from each other. The organic EL layer 13 (not shown) having a refractive index n comes into contact with an upper side of the cathodic conductive layer 14.

Figure 17:
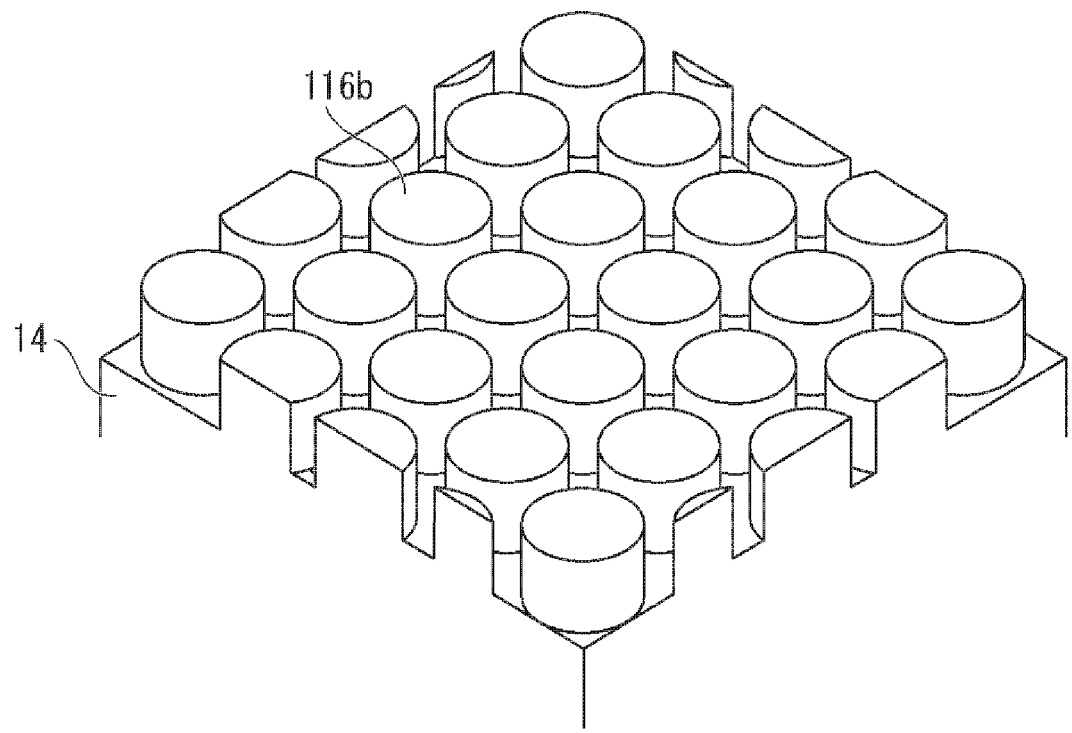
FIG. 17 is a perspective diagram illustrating an example of the cathodic conductive layer that includes columnar convex portions on the surface of the organic EL layer side.

FIG. 17 shows an example in which a plurality of convex portions 116b having a columnar shape are periodically formed to be apart from each other on a surface of the cathodic conductive layer 14 of a third aspect to be described later on an organic EL layer side. The organic EL layer 13 (not shown) having a refractive index n comes into contact with an upper side of the cathodic conductive layer 14.

Figure 18:
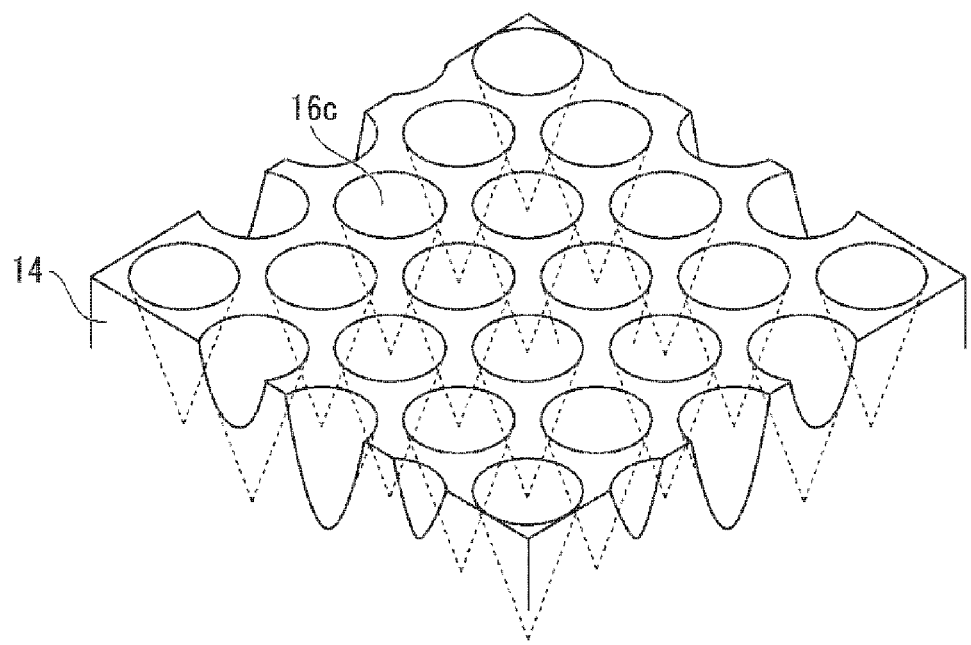
FIG. 18 is a perspective diagram illustrating an example of the cathodic conductive layer that includes conical concave portions on the surface of the organic EL layer side.

FIG. 18 shows a perspective diagram illustrating a surface of the cathodic conductive layer 14 on an organic EL layer side in a case of using the substrate 11 having a structure in which the plurality of convex portions are periodically and two-dimensionally ordered. FIG. 18 shows an example in which a plurality of concave portions 16c having a conical shape are periodically formed spaced apart from each other. The organic EL layer 13 (not shown) having a refractive index n comes into contact with an upper side of the cathodic conductive layer 14.

Figure 19:
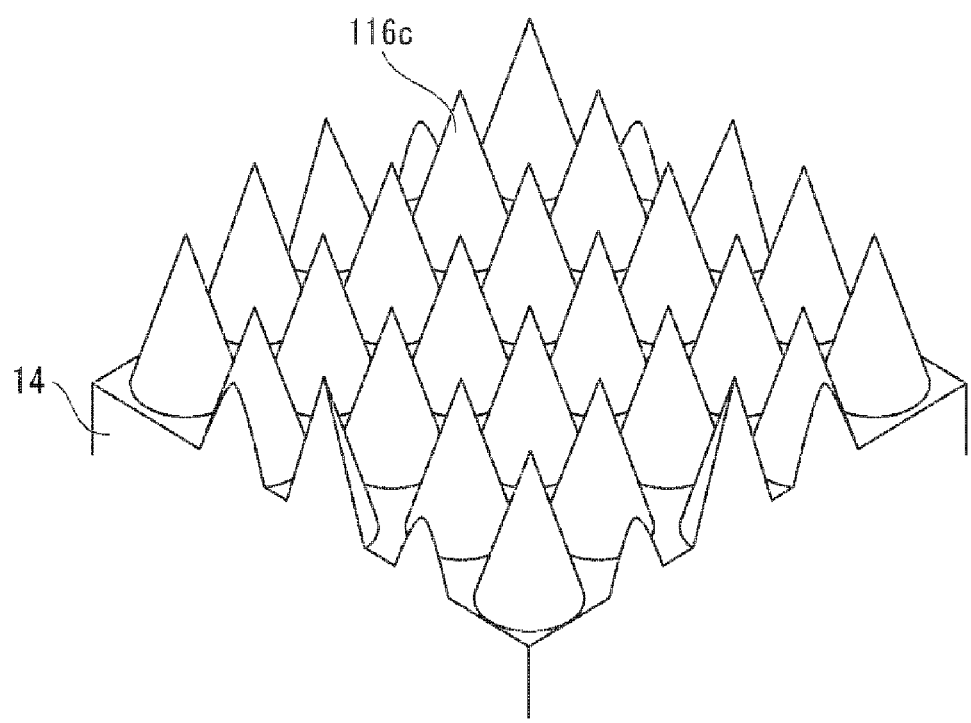
FIG. 19 is a perspective diagram illustrating an example of the cathodic conductive layer that includes conical convex portions on the surface of the organic EL layer side.

FIG. 19 shows an example in which a plurality of convex portions 116c having a conical shape are periodically formed with spaced from each other on a surface of the cathodic conductive layer 14 of a third aspect to be described later on an organic EL layer side. The organic EL layer 13 (not shown) having a refractive index n comes into contact with an upper side of the cathodic conductive layer 14.

In the first aspect of the invention, an extraction wavelength $\lambda$ (nm) of light from the organic light emitting diode 10 and a distance p (nm) between centers of the concave portions 16 in the two-dimensional lattice structure are within a region surrounded by straight lines sequentially connecting the following coordinates A, B, C, D, E, F, G, H, I, J, and A in a graph illustrating a relationship between the light extraction wavelength and the distance. In addition, the depth of the concave portions 16 is 12 nm to 180 nm, and preferably 15 nm to 70 nm. According to this, the light extraction efficiency is significantly improved.

A ($\lambda$=450, p=258+W(½)), B ($\lambda$=500, p=319+W(½)), C ($\lambda$=600, p=406+W(½)), D ($\lambda$=700, p=484+W(½)), E ($\lambda$=800, p=561+W(½)), F ($\lambda$=800, p=493−W(½)), G ($\lambda$=700, p=425−W(½)), H ($\lambda$=600, p=353−W(½)), I ($\lambda$=500, p=262−W(½)), and J ($\lambda$=450, p=110−W(½))

W(½) represents a half width at half maximum of a light emitting peak in a spectrum of the light emitting material contained in the light emitting layer 13c. The half width at half maximum represents a half value of a width (half width) when horizontally cutting the light emitting peak at a position of a half height of the peak height.

The spectrum of the light emitting material is peculiar to the light emitting material, and W(½) is determined depending on a light emitting material that is used. In a case where a plurality of peaks appear in a spectrum of a single light emitting material, W(½) of the highest peak is measured.

The spectrum of the light emitting material is obtained by a visible light spectrophotometer or the like.

The distance p (nm) between the centers of the concave portions 16 is determined by the extraction wavelength $\lambda$ (nm).

The extraction wavelength $\lambda$ (nm) is a wavelength when extracting energy from the surface plasmon as radiant light, and most commonly, the $\lambda$ (nm) is an emission peak wavelength of the light emitting material.

When a specific extraction wavelength is $\lambda_1$ [$\lambda_1$ is a specific value within a range of 450 nm to 800 nm], the distance p between the centers of the concave portions 16 may take an arbitrary value corresponding to a coordinate of $\lambda=\lambda_1$ within the above-described region. For example, in a case where $\lambda_1$ is 600 nm, the distance p may take an arbitrary value from [353−W(½)] nm to [406+W(½)] nm.

The distance p between the centers of the concave portions 16 is the same as the distance between the centers of the convex portions 15 in the two-dimensional lattice structure of the surface of the substrate 11, and thus the distance p is indirectly obtained as a lattice constant of the two-dimensional lattice structure by measuring the distance between the centers of the convex portions 15 by a laser diffraction method. That is, when laser light passes through a lattice (diffraction lattice), a phenomenon (diffraction) in which light turns round occurs. The distance by which the diffracted light proceeds after being emitted from each point of the lattice until reaching one point at which a screen is positioned is different in each case, and thus light beams having phases different from each other according to a proceeding distance overlap on the screen. As a result, interference (intensifying or weakening) occurs.

With regard to parameters that specify a gap of the lattice, the following definition is used as a parameter $\Lambda$. In a case of a triangular lattice, the height of the smallest equilateral triangle formed by lattice points (vertexes) of concavities and convexities is set as $\Lambda$, and in a case of a square lattice, the distance (lattice constant) between the closest lattices is set as $\Lambda$.

When a parameter of the lattice is set as $\Lambda$, a wavelength of laser light is set as $\lambda_x$, and an angle made by incident light and diffracted light is set as $\theta$, a screen is illuminated brightly with light emitted from the lattice at an angle $\theta$ with which a mathematical expression of $\Lambda \sin\theta = n\lambda_x$ [n=0, ±1, ±2, . . . ] is satisfied.

At the angle $\theta$, proceeding distances of diffracted light beams emitted from one convex portion and another adjacent convex portion are correctly different from each other by an integer (here, n) wavelength, and thus interference, which intensifies the light beams, occurs on the screen. The lattice parameter $\Lambda$ may be obtained by measuring $\theta$ using the above-described properties. The distance between the centers of the convex portions 15, that is, the distance p between the centers of the concave portions 16 may be obtained from the lattice parameter $\Lambda$. For example, in a case of the square lattice, the lattice parameter $\Lambda$ that is calculated becomes the distance p between the centers of the concave portions 16 as is, and in a case of a trigonal lattice (hexagonal lattice), a value obtained by multiplying the lattice parameter $\Lambda$, which is calculated, by $2/\sqrt{3}$ becomes the distance p between the centers of the concave portions 16.

A relationship between the extraction wavelength $\lambda$ (nm) and the distance p (nm) between the centers of the concave portions 16 will be described in more detail with reference to FIG. 2.

Figure 2:
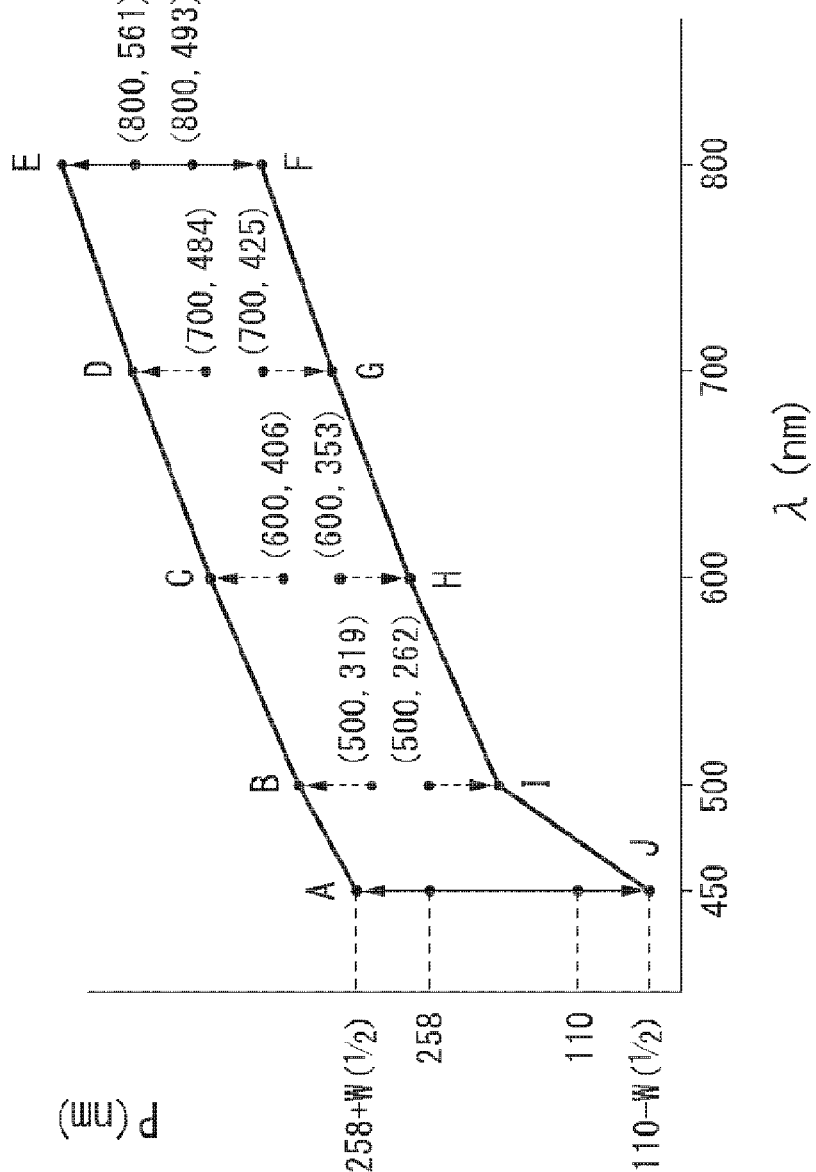
FIG. 2 is a graph in which an extraction wavelength λ (nm) of light from an organic light emitting diode is shown in the horizontal axis, and a distance p (nm) between the centers of concave portions or a distance p (nm) between the centers of convex portions in a two-dimensional lattice structure is shown in the vertical axis, and which illustrates a relationship between the extraction wavelength λ and the distance p in the first to fourth aspects of the invention.

FIG. 2 is a graph in which the extraction wavelength $\lambda$ (nm) is shown in the horizontal axis, and the distance p (nm) between the centers of the concave portions is shown in the vertical axis.

As shown in FIG. 2, the coordinates A, B, C, D, and E are coordinates obtained by shifting p of coordinates ($\lambda$, p) of (450, 258), (500, 319), (600, 406), (700, 484), and (800, 561) in a positive direction by W(½), and the coordinates F, G, H, I, and J are coordinates obtained by shifting a distance p of coordinates ($\lambda$, p) of (800, 493), (700, 425), (600, 353), (500, 262), and (450, 110) in a negative direction by W(½). When the shift width exceed W(½), the light extraction efficiency is improved, but the effect is greatly inferior to a case where the shift width is within W(½).

The smaller the shift width is, the more preferable. It is preferable that the shift width be ⅕ W, more preferably ⅒ W, and still more preferably 0. That is, it is particularly preferable that the extraction wavelength $\lambda$ (nm) and the distance p (nm) between the centers of the concave portions 16 be within a region surrounded by straight lines sequentially connecting coordinates ($\lambda$, p) of (450, 258), (500, 319), (600, 406), (700, 484), (800, 561), (800, 493), (700, 425), (600, 353), (500, 262), and (450, 110) in a graph illustrating the relationship between the light extraction wavelength and the distance.

The coordinates of 10 points of A to J are obtained by calculating conversion efficiency from the surface plasmon to light. In addition, practically, a significant improvement in the light extraction efficiency when the extraction wavelength and the distance are within the region surrounded by straight lines sequentially connecting the coordinates of the 10 points was confirmed with regard to a case where the extraction wavelength $\lambda$ is 625 nm or 565 nm in [Examples] to be described later.

Hereinafter, a method of calculating the light conversion efficiency from the surface plasmon to light, which is carried out to specify the coordinates, will be described.

Figure 3A:
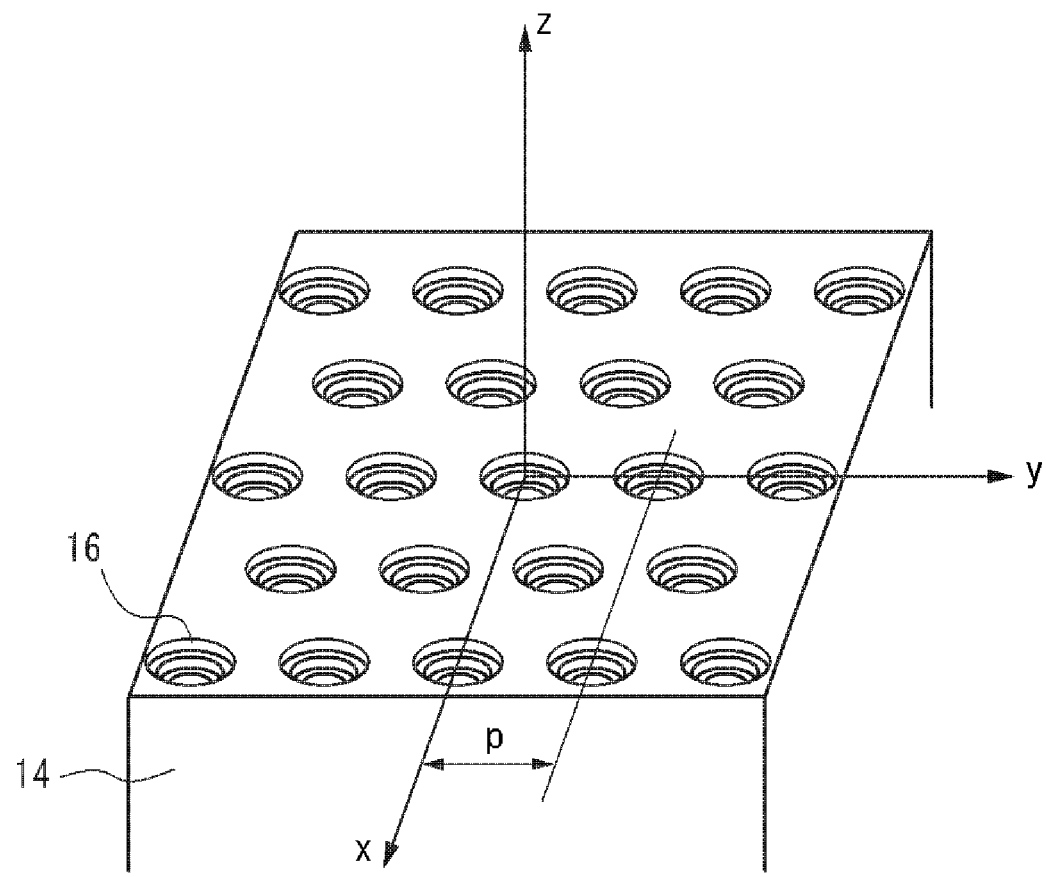
FIG. 3A is a schematic diagram of a surface of a cathodic conductive layer on an organic EL layer side, which is used for calculation of conversion efficiency from a surface plasmon to light.
Figure 3B:
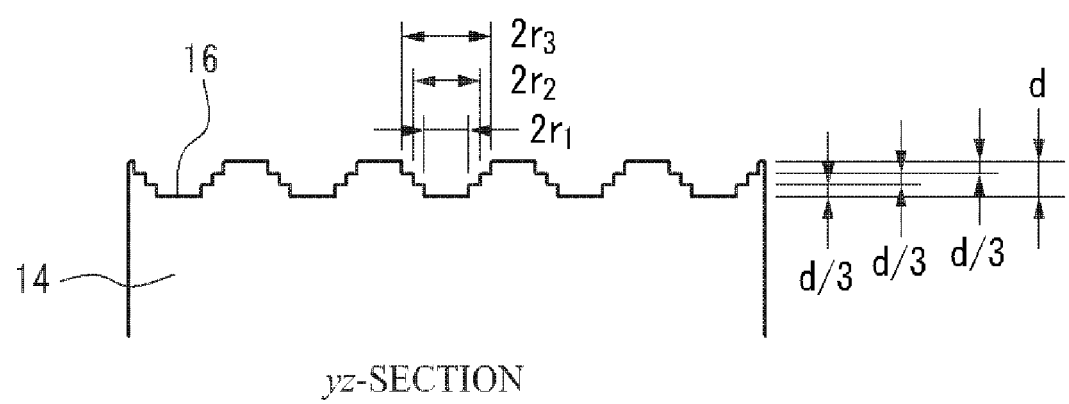
FIG. 3B is a cross-sectional diagram of the cathodic conductive layer of FIG. 3A.

First, a structure of the organic light emitting diode 10 is modeled as shown in FIG. 3. FIG. 3A shows a perspective diagram of the cathodic conductive layer 14, and FIG. 3B shows a cross-sectional diagram of the cathodic conductive layer 14 in a case where a surface thereof on an organic EL layer 13 side is set as an upper side.

In the model shown in FIGS. 3A and 3B, the cathodic conductive layer 14 is formed from silver. The thickness of the cathodic conductive layer 14 is semi-infinite, and also spreads infinitely in an xy direction. The organic EL layer 13 (not shown) having a semi-infinite thickness and a refractive index n comes into contact with the upper side of the cathodic conductive layer 14.

The concave portions 16 are formed on a surface of the cathodic conductive layer 14 on an organic EL layer 13 side. The concave portions 16 are holes, each being constituted by three-stage concentric columns. The height of each of the concentric columns is d/3, and the depth of the concave portions 16 is d. The radii of the respective concentric columns are r1, r2, and r3 from the lower side of the concave portions 16. As shown in FIG. 3A, the concave portions 16 are disposed in a triangular (hexagonal) lattice shape, and the gap between the centers of the concave portions 16 adjacent to each other is indicated as p.

A reflectance in a case where a monochromatic plane wave is vertically incident to the structure from an organic EL layer side is calculated using a supercomputer. A method used for the calculation is a rigorous coupled wave analysis (RCWA) method. The RCWA method is not a scalar analysis method but a kind of differential method among rigorous electromagnetic field analysis methods of a lattice structure in consideration of the fact that an electric field and a magnetic field are vector fields. In this method, the diffraction lattice is expressed by Fourier-series development, a coupling equation with an electromagnetic filed is obtained, and the coupling equation is numerically solved under boundary conditions to calculate diffraction efficiency [with regard to the details of the RCWA method, refer to L. Li, "New formulation of the Fourier modal method for crossed surface-relief gratings," J. Opt. Soc. Am. A14, 2758-2767 (1997)]. Accuracy of the calculation depends on a diffraction order that is put into for the calculation, and the larger the diffraction order is, the higher the accuracy becomes. However, calculation time and a memory are also consumed. The diffraction order considered in the calculation is 2601 orders (51 orders×51 orders).

The reflectance is calculated by assuming the refractive index n of the organic EL layer as 1.6, 1.7, or 1.8 and by systematically changing the distance p between the centers of the holes and depth d of the holes with respect to cases where a wavelength (corresponding to the extraction wavelength λ) of the monochromatic plane wave is 450 nm, 500 nm, 600 nm, 700 nm, and 800 nm.

The lower the obtained reflectance is, the higher efficiency of conversion of incident light into the surface plasmon becomes. This represents that from reciprocal theorem of Lorenz, the conversion efficiency from the surface plasmon to light is high at a portion having a small reflectance.

In addition, among the above-described coordinates, coordinates at which the reflectance becomes the minimum value when the refractive index n is 1.6 include coordinates (λ, P) of (450, 258), (500, 319), (600, 406), (700, 484), and (800, 561). In addition, coordinates at which the reflectance becomes the minimum value when the refractive index n is 1.8 include coordinates (λ, P) of (450, 110), (500, 262), (600, 353), (700, 425), and (800, 493). Coordinates at which the reflectance becomes the minimum value when the refractive index n is 1.7 are approximately intermediate values between the case where the refractive index n is 1.6 and the case where the refractive index n is 1.8.

In the above-described calculation, the reason why the lower limit of the refractive index n of the organic EL layer is assumed to 1.6, and the upper limit is assumed to 1.8 is that commonly, the refractive index of the organic EL layer of the organic light emitting diode is within a range of 1.6 to 1.8.

In a case where the organic EL layer is constituted by multiple layers, the refractive index in the organic EL layer is not necessarily constant, but in the calculation of the conversion efficiency, the calculation may be carried out by assuming that the organic EL layer is substituted with a dielectric substance (uniform dielectric substance) having an uniform refractive index with which a wave number of the surface plasmon becomes the same as that in the case of the multiple layers. When the refractive indexes of the respective layers are within a range of 1.6 to 1.8, the respective layers may be substituted with a uniform dielectric substance having the refractive index within a range of 1.6 to 1.8.

In addition, an equivalent refractive index of a uniform dielectric substance, with which the wave number of the surface plasmon in the case where the organic EL layer is constituted by multiple layers and the wave number of the surface plasmon in the case where the organic EL layer is substituted with a uniform dielectric substance become the same as each other, may be obtained in the following manner.

Figure 4A:
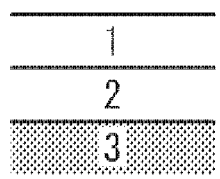
FIG. 4A is a diagram illustrating a structure of a multi-layer dielectric substance, which is used to explain a method of obtaining an equivalent refractive index of a uniform dielectric substance in a case where the organic EL layer is constituted by two layers.
Figure 4B:
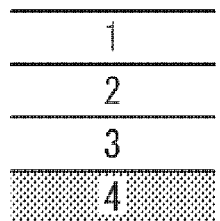
FIG. 4B is a diagram illustrating the structure of the multi-layer dielectric substance, which is used to explain the method of obtaining the equivalent refractive index of the uniform dielectric substance in a case where the organic EL layer is constituted by three layers.
Figure 4C:
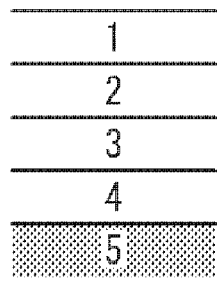
FIG. 4C is a diagram illustrating the structure of the multi-layer dielectric substance, which is used to explain the method of obtaining the equivalent refractive index of the uniform dielectric substance in a case where the organic EL layer is constituted by four layers.

FIGS. 4A, 4B, and 4C show diagrams illustrating a structure of the multi-layer dielectric substance that is used for the calculation of the equivalent refractive index of the uniform dielectric substance.

FIGS. 4A, 4B, and 4C illustrate cases where the organic EL layer is constituted by two layers, three layers, and four layers, respectively, and a gray portion represents the cathodic conductive layer.

First, an equivalent refractive index $n_{\mathit{eff}}$ with respect to the surface plasmon in an original system (actual multi-layer structure) is obtained. The equivalent refractive index $n_{\mathit{eff}}$ is given by Expression (1) described below by using a wave number $k_{sp}$ of the surface plasmon and a wave number $k_0$ of propagation light in vacuum.

[Mathematical Expression 1]

$$n_{\mathit{eff}} = k_{sp}/k_0 \qquad (1)$$

The wave number $k_{sp}$ of the surface plasmon is given as a pole of a reflection coefficient of the system.

For example, a case where the dielectric substance is constituted by two layers (total three layers including the cathodic conductive layer as a medium) as shown in FIG. 4A is adapted.

A reflection coefficient $r_{123}$ in a system shown in FIG. 4A is given by Expression (2) described below.

[Mathematical Expression 2]

$$r_{123} = \frac{r_{12} + r_{23}\exp(2ik_{z2}h_2)}{1 + r_{12}r_{23}\exp(2ik_{z2}h_2)} \qquad (2)$$

Here, $h_i$ represents the thickness of a medium i, and $r_{ij}$ represents a reflection coefficient of p-polarized light at an interface with a medium j when viewed from the medium i side, and is given by Expression (3) described below.

[Mathematical Expression 3]

$$r_{ij} = \frac{\frac{k_{zi}}{\varepsilon_i} - \frac{k_{zj}}{\varepsilon_j}}{\frac{k_{zi}}{\varepsilon_i} - \frac{k_{zj}}{\varepsilon_j}} \qquad (3)$$

$\varepsilon_i$ represents a specific dielectric constant of the medium i and has a relationship represented by Expression (4) described below with a refractive index $n_i$ of the medium i.

$k_{zi}$ represents a normal component of a wave number vector at the medium i, and satisfies a relationship shown by Expression (5) described below.

[Mathematical Expression 4]

$$\varepsilon_i = n_i^2 \qquad (4)$$

[Mathematical Expression 5]

$$k_{zi}^2 + k_x^2 = \varepsilon_i k_0^2 \qquad (5)$$

Here, $k_x$ represents a tangential component of a wave number vector, and has a value common in the respective layers.

The pole of the reflection coefficient is obtained using the relationships. More specifically, the pole is $k_x$ satisfying an equation in which a denominator of the reflection coefficient $r_{123}$ is set to 0, and thus is a root of Expression (6) described below rather than Expression (2) described previously.

[Mathematical Expression 6]

$$1 + r_{12}r_{23}\exp(2ik_{z2}h_2) = 0 \qquad (6)$$

A value of $k_x$ that is the root becomes the wave number $k_{sp}$ of the surface plasmon. The equivalent refractive index $n_{\mathit{eff}}$ is obtained from the wave number $k_{sp}$. Furthermore, the refractive index $n_a$ of the uniform dielectric substance is obtained using Expression (7) described below.

[Mathematical Expression 7]

$$n_{\mathit{eff}}^2 = \frac{n_a^2 n_3^2}{n_a^2 + n_3^2} \qquad (7)$$

In a case of four or more layers, the refractive index is also obtained in the same manner.

For example, in a case of four layers (the organic EL layer is constituted by three layers, and the cathodic conductive layer is constituted by one layer) as shown in FIG. 4B, a reflection coefficient $r_{1234}$ may be recursively obtained using the reflection coefficient $r_{123}$ in the case of the three layers. Specifically, reflection coefficient $r_{1234}$ may be obtained by Expression (8) described below using the $r_{123}$ as $r_{234}$.

In a case of five layers as shown in FIG. 4C or a case of six or more layers, the reflection coefficient is also obtained in the same manner.

[Mathematical Expression 8]

$$r_{1234} = \frac{r_{12} + r_{234}\exp(2ik_{z2}h_2)}{1 + r_{12} + r_{234}\exp(2ik_{z2}h_2)}$$
$$= \frac{r_{12} + [1 + r_{23}r_{34}\exp(2ik_{z3}h_3)] + [r_{23} + r_{34}\exp(2ik_{z3}h_3)]\exp(2ik_{z2}h_2)}{1 + r_{23}r_{34}\exp(2ik_{z3}h_3) + r_{12}[r_{23} + r_{34}\exp(2ik_{z3}h_3)]\exp(2ik_{z2}h_2)}$$

In addition, as is described in a manufacturing method to be described later, in a case where the manufacturing of the organic light emitting diode 10 is carried out by preparing the substrate 11 having a structure in which a plurality of convex portions corresponding to the two-dimensional lattice structure are periodically and two-dimensionally ordered on a surface, and by sequentially laminating the anodic conductive layer 12, the organic EL layer 13, and the cathodic conductive layer 14 on the structure, the two-dimensional lattice structure, which is formed on the surface of the cathodic conductive layer 14 on an organic EL layer 13 side, corresponds to the structure of the surface of the substrate 11. That is, the distance p between the centers of the concave portions 16 is equal to the distance between the centers of the convex portions on the surface of the substrate 11, and the depth of the concave portions 16 is equal to the height of the convex portions. Accordingly, the distance p between the centers of the concave portions 16 and the depth of the convex portions 16 in the two-dimensional lattice structure on the surface of the cathodic conductive layer 14 may be obtained by measuring the distance between the centers of the convex portions 15 on the surface of the substrate 11, and the height of the convex portions 15, respectively.

As described above, the distance p between the centers of the concave portions 16 may be indirectly obtained by measuring the distance between the centers of the convex portions 15 using a laser diffraction method. In addition, similarly, the depth of the concave portions 16 may be indirectly obtained by measuring the height of the convex portions 15 using AFM.

Hereinafter, the respective layers that constitute the organic light emitting diode 10 will be described in more detail.

[Substrate 11]

A transparent body through which visible light passes is used for the substrate 11 of this embodiment.

As a material constituting the substrate 11 may be an inorganic material, an organic material, or a combination thereof. Examples of the inorganic material include various kinds of glass such as quartz glass, alkali-free glass, and super white glass, transparent inorganic minerals such as mica, and the like. Examples of the organic material include resin films such as a cycloolefin-based film and a polyester-based film, fiber-reinforced plastic materials in which a microfiber such as a cellulose nanofiber is mixed in the resin films, and the like.

Although different depending on uses, a material having a high visible-light transmittance is generally used for the substrate 11. In addition, a material, which has a transmittance of 70% or more, preferably 80% or more, and more preferably 90% or more without applying deflection to a spectrum in a visible light range (a wavelength of 380 nm to 800 nm), is used.

[Anodic Conductive Layer 12]

A transparent conductor through which visible light passes is used for the anodic conductive layer 12 in this embodiment.

The transparent conductor constituting the anodic conductive layer 12 is not particularly limited, and materials in the related art may be used as the transparent conductive material. Examples of the transparent conductor include indium tin oxide (ITO), indium zinc oxide (IZO), zinc oxide (ZnO), zinc tin oxide (ZTO), and the like.

The thickness of the anodic conductive layer 12 is commonly 50 nm to 500 nm.

In addition, the thickness of the respective layers constituting the organic light emitting diode 10 may be measured by a spectroscopic ellipsometer, a contact-type step gauge, an AFM, and the like.

[Organic EL Layer 13]

In the invention, the organic EL layer (electroluminescence) layer is a layer including at least a light emitting layer containing an organic light emitting material, and may be configured by only the light emitting layer. However, the organic EL layer generally includes a separate layer in addition to the light emitting layer. The separate layer may be constituted by an organic material or an inorganic material as long as the function of the light emitting layer does not deteriorate.

In this embodiment, the organic EL layer 13 is constituted by five layers of the hole implantation layer 13a, the hole transport layer 13b, the light emitting layer 13c, the electron transport layer 13d, and the electron implantation layer 13e. Among these layers, the light emitting layer is the most important, and for example, the hole implantation layer or the electron implantation layer may be omitted depending on a layer configuration. In addition, the electron transport layer may also serve as the light emitting layer. A material that constitutes these layers is not particularly limited, and materials in the related art may be used.

Among the materials, an organic light emitting material is used as a material constituting the light emitting layer 13c.

Examples of the organic light emitting material include pigment compounds such as Tris[1-phenylisoquinoline-C2, N]iridium (III) (Ir(piq)$_3$), 1,4-bis[4-(N,N-diphenylaminostyrylbenzene)] (DPAVB), and Bis[2-(2-benzoxazolyl)phenolato] Zinc (II) (ZnPBO). In addition, a material that is obtained by doping a separate material (host material) with a fluorescent pigment compound or a phosphorescence emitting material may be used. In this case, examples of the host material include a hole transport material, an electron transport material, and the like.

As materials constituting the hole implantation layer 13a, the hole transport layer 13b, and the electron transport layer 13d, organic materials are generally used, respectively.

Examples of the material (hole implantation material) constituting the hole implantation layer 13a include compounds such as 4,4',4''-tris(N,N-2-naphthylphenylamino)triphenylamine (2-TNATA).

Examples of the material (hole transport material) constituting the hole transport layer 13b include aromatic amine compounds such as N,N'-diphenyl-N,N'-bis(1-naphthyl)-(1, 1'-biphenyl)-4,4'-diamine (NPD), copper phthalocyanine (CuPc), and N,N'-Diphenyl-N,N'-di(m-tolyl)benzidine (TPD).

Examples of the material (electron transport material) constituting the electron transport layer 13d include oxadiol-based compounds such as 2,5-Bis(1-naphthyl)-1,3,4-oxadiazole (BND), and 2-(4-tert-Butylphenyl)-5-(4-biphenylyl)-1, 3,4-oxadiazole (PBD), metal complex-based compounds such as Tris(8-quinolinolato)aluminum (Alq), and the like.

The electron implantation layer 13e is not requisite. However, when the electron implantation layer 13e is provided between the electron transport layer 13d and the cathodic conductive layer 14, a difference in a work function may be reduced, and thus migration of electrons from the cathodic conductive layer 14 to the electron transport layer 13d becomes easy.

However, when a magnesium alloy such as Mg/Ag=10/90 is used as the cathodic conductive layer 14, even when the electron implantation layer 13e is not provided, the electron implantation effect may be obtained.

As the material constituting the electron implantation layer 13e, lithium fluoride (LiF) and the like may be used.

The total thickness of the organic EL layer 13 is commonly 30 to 500 nm.

[Cathodic Conductive Layer 14]

The cathodic conductive layer 14 is formed from Ag or an ally containing 70% by mass or more of Ag.

Specific examples of the alloy containing 70% by mass or more of Ag include magnesium alloys such as the above-described Mg/Ag=10/90.

The thickness of the cathodic conductive layer 14 is commonly 50 to 3,000 nm.

<Method for Manufacturing Organic Light Emitting Diode 10>

The method for manufacturing the organic light emitting diode 10 is not particularly limited. However, the organic light emitting diode 10 is appropriately manufactured by preparing the substrate 11 having a structure in which a plurality of convex portions corresponding to the two-dimensional lattice structure are periodically and two-dimensionally ordered on a surface, and by sequentially laminating the anodic conductive layer 12, the organic EL layer 13 (the hole implantation layer 13a, the hole transport layer 13b, the light emitting layer 13c, the electron transport layer 13d, and the electron implantation layer 13e), and the cathodic conductive layer 14 on the structure.

Examples of the method for manufacturing the substrate having a structure in which the plurality of convex portions corresponding to the two-dimensional lattice structure is periodically and two-dimensionally ordered include electron beam lithography, mechanical cutting, laser thermal lithography, interference exposure, more specifically, two-beam interference exposure and reduction exposure, an anodic oxidation method of alumina, a nano imprint method from a master mold manufactured by the above-described methods, and the like. However, among the methods, methods other than the two-beam interference exposure and the laser thermal lithography are not suitable for manufacturing a periodic lattice structure in a large area, and thus have restrictions on an area in an industrial use aspect. In addition, the two-beam interference exposure may manufacture a substrate having a small area to a certain degree. However, in a case of an large area in which a side length is several cm or more, the manufacturing is affected by various disturbance factors such as vibration, wind, thermal expansion and shrinkage, fluctuation of air, and voltage variation with respect to the entirety of optical setup, and thus it is very difficult to prepare a uniform, correct, and periodic lattice structure.

Therefore, in the invention, as the method for preparing the substrate, a dry etching method in which a particle mono-layer film is used as an etching mask is preferable. In this method, a mono-layer film of particles having a primary particle size equal to or less than an effective wavelength of light emission color is prepared on a surface of a base material using the principle of Langmuir-Blodgett method (hereinafter, also referred as "LB method"), and thus a two-dimensional closest packing lattice in which control of a gap between particles is performed with high accuracy may be obtained. The method is disclosed in detail, for example, in Japanese Unexamined Patent Application, First Publication No. 2009-158478.

In the particle mono-layer film, since the particles are closely packed in two dimensions, when a surface of the original substrate is dry-etched using the particle mono-layer film as an etching mask, a two-dimensional lattice structure having a triangular lattice (hexagonal lattice) shape with high accuracy may be formed. A two-dimensional lattice structure, which is formed on the surface of the cathodic conductive layer 14 using the substrate having the above-described two-dimensional lattice structure, is highly accurate. Accordingly, even in a large area, a diffraction wave of the surface plasmon may be obtained with high efficiency, and thus the light extraction efficiency is further improved. As a result, the organic light emitting diode 10 with high luminance may be obtained.

More specifically, the substrate may be prepared by carrying out a coating process of coating a surface of the original substrate (substrate before forming the structure) of the substrate with a particle mono-layer film, and a process (dry etching process) of dry-etching the original plate of the substrate using the particle mono-layer film as an etching mask.

Hereinafter, the respective processes will be described in more detail.

{Coating Process}

The coating process may be carried out by performing a particle mono-layer film forming process of putting a liquid (lower-layer liquid), which develops particles on a liquid surface of a water tank, into the water tank, adding dropwise a dispersed solution in which particles are dispersed in a solvent to the liquid surface of the lower-layer liquid, and vaporizing the solvent to form a particle mono-layer film constituted by particles on the liquid surface; and a transition process of moving the particle mono-layer film onto the substrate.

In addition, here, description is made with respect to an example in which hydrophobic particles and a hydrophobic organic solvent are selected as the particles and the organic solvent, and a hydrophilic liquid is used as the lower-layer liquid, but hydrophilic particles and a hydrophilic organic solvent may be selected as the particles and the organic solvent, and a hydrophobic liquid may be used as the lower-layer liquid.

[Particle Mono-Layer Film Forming Process]

In the particle mono-layer film forming process, first, particles having a hydrophobic surface are added into a highly volatile solvent (for example, chloroform, methanol, ethanol, methyl ethyl ketone, methyl isobutyl ketone, hexane, or the like) to prepared a dispersed solution. Separately, a water tank (trough) is prepared, and water (hereinafter, may be referred to as "lower-layer water") as a lower-layer liquid is put into the water tank (trough). Next, when the dispersed solution is added dropwise onto a liquid surface of the lower-layer water, particles in the dispersed solution are developed on the liquid surface of the lower-layer water due to a dispersion medium. Accordingly, when the solvent that is a dispersion medium is vaporized, a mono-layer film in which the particles are closely packed in two-dimensions is formed.

A particle size of the particles that are used for formation of the particle mono-layer film is set in consideration of a distance between the centers of the convex portions 15 to be formed. When the particle size of the particles that are used becomes a distance between the centers of the convex portions 15 to be formed on the surface of the substrate 11, that is, a distance p between the centers of the concave portions 16.

In addition, in the particles, it is preferable that a variation coefficient (a value obtained by dividing standard deviation by an average value) of the particle size be 15% or less, more preferably 10% or less, and still more preferably 5% or less. As described above, particles in which the variation coefficient of a particle size is small and a variation in the particle size is small are used, a defective site at which particles are not present is not likely to occur in the particle mono-layer film to be formed. Accordingly, a particle mono-layer film in which a deviation in arrangement is small may be formed. When the deviation in the arrangement of the particle mono-layer film is small, a deviation in arrangement in a two-dimensional lattice structure that is formed on a surface of the cathodic conductive layer 14 ultimately decreases. The smaller the deviation in the arrangement in the two-dimensional lattice structure, the more efficiently the surface plasmon is converted into light on the surface of the cathodic conductive layer 14, and thus is preferable.

Examples of a material of particles constituting the particle mono-layer film include metals such as Al, Au, Ti, Pt, Ag, Cu, Cr, Fe, Ni, and Si, metal oxides such as $SiO_2$, $Al_2O_3$, $TiO_2$, $MgO_2$, and $CaO_2$, organic polymers such as polystyrene and polymethylmetacrylate, semiconductor materials, inorganic polymer, and the like. These may be used alone or in combination of two or more kinds thereof.

When the material of the particles and dry etching conditions to be described later are selected, the height or shape of the convex portions to be formed, that is, the depth and shape of the concave portions 16 may be adjusted.

In a case where water is used as the lower-layer liquid, it is preferable that the surface of the particles have hydrophobicity. In a case where the surface of the particles has hydrophobicity, as described above, when the dispersed solution of particles is developed on the liquid surface of the lower-layer liquid of the water tank (trough) to form the particle mono-layer film, the particle mono-layer film may be easily formed using water as the lower-layer liquid, and the particle mono-layer film may be easily moved onto a substrate surface.

Among particles exemplified above, particles of the organic polymer such as polystyrene have a hydrophobic surface, and thus the particles may be used as is. However, with regard to the metal particles or metal oxide particles, the particles may be used after the surface is treated using a hydrophobizing agent to be relatively hydrophobic.

Examples of the hydrophobizing agent include a surfactant, alkoxysilane, and the like.

A method in which the surfactant is used as the hydrophobizing agent is effective for hydrophobization of various materials, and is effective for a case where the particles are formed from a metal, a metal oxide, or the like.

As the surfactant, cationic surfactants such as hexadecyltrimethylammonium bromide and decyltrimethylammonium bromide, and anionic surfactants such as sodium dodecyl sulfate, sodium 4-octylbenzene sulfonate may be appropriately used. In addition, alkanethiol, a disulfide compound, tetradecanoic acid, and octadecanoic acid may be used.

The hydrophobization treatment using the surfactant may be carried out in a liquid after dispersing the particles in the liquid such as an organic solvent and water, or may be carried out with respect to particles in a dried state.

In the case of carrying out the hydrophobization treatment in the liquid, particle to be hydrophobized are added to and diffused in a volatile organic solvent composed of one or more kinds selected from chloroform, methanol, ethanol, isopropanol, acetone, methyl ethyl ketone, ethyl ethyl ketone, toluene, n-hexane, cyclohexane, ethyl acetate, and butyl acetate, and then a surfactant may further mixed to the resultant mixture to further carry out the dispersion. As described above, when the particles are dispersed in advance, and then the surfactant is added, the surface may be further uniformly hydrophobized. The dispersed solution after the hydrophobization treatment may be used as is as a dispersed solution that is added dropwise to the liquid surface of the lower-layer water.

In a case where the particles to be hydrophobized is in a state of an aqueous dispersion, the following method is also effective. In the method, a surfactant is added to the aqueous dispersion to carry out the hydrophobization treatment of a particle surface in a water phase, and then an organic solvent is added to the resultant material to perform oil-phase extraction of the particle after being subjected to the hydrophobization treatment. The dispersed solution (dispersed solution in which particles are dispersed in an organic solvent) that is obtained in this manner may be used as is as a dispersed solution that is added dropwise to the liquid surface of the lower-layer water.

In addition, to raise particle dispersion properties of the dispersed solution, it is preferable to appropriately select and combine a kind of organic solvent and a kind of surfactant. When the dispersed solution having high particle dispersion properties is used, agglomeration of the particles into a cluster shape is suppressed, and thus a particle mono-layer film in which the respective particles are closely packed in two dimensions with high accuracy may be obtained in a relatively easy manner. For example, in a case of selecting chloroform as the organic solvent, it is preferable to use decyltrimethylammonium bromide as the surfactant. In addition to this, a combination of ethanol and sodium dodecyl sulfate, a combination of methanol and sodium 4-octylbenzene sulfonate, a combination of methyl ethyl ketone and octadecanoic acid, and the like may be preferably exemplified.

With regard to a ratio between the particles to be hydrophobized and the surfactant, it is preferable that the mass of the surfactant be $1/3$ to $1/15$ times the mass of the particles to be hydrophobized.

In addition, during the hydropobization treatment, it is effective that the dispersed solution is stirred or the dispersed solution is irradiated with ultrasonic waves from the viewpoint of improvement of the particle dispersion properties.

A method in which alkoxysilane is used as the hydrophobizing agent is effective during hydrophobization of particles of Si, Fe, Al, and the like, or oxide particles of $SiO_2$, $Al_2O_3$, $TiO_2$, and the like. However, the method is not limited to the particles, and the method is applicable to any particle as long as the particle basically has a hydroxyl group or the like on a surface thereof.

Examples of alkoxysilane include monomethyltrimethoxysilane, monomethyltriethoxysilane, dimethyldiethoxysilane, phenyltriethoxysilane, hexyltrimethoxysilane, decyltrimethoxysilane, vinyltrichlorosilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxytrimethoxysilane, N-2(aminoethyl)3-aminopropylmethyldimethoxysilane, N-2(aminoethyl)3-aminopropyltrimethoxysilane, N-2(aminoethyl)3-aminopropyltriethoxysilane, 3-aminopropyltrimethoxysilane, 3-aminopropyltriethoxysilane, N-phenyl-3-aminopropyltrimethoxysilane, 3-ureidopropyltriethoxysilane, 3-chloropropyltrimethoxysilane, 3-mercaptopropylmethyldimethoxysilane, 3-mercaptopropyltrimethoxysilane, 3-isocyanatepropyltriethoxysilane, and the like.

In a case of using alkoxysilane as the hydrophobizing agent, the hydrophobization is carried out in such a manner that an alkoxysilyl group in the alkoxysilane is hydrolyzed to a silanol group, and the silanol group is dehydrated and condensed to a hydroxyl group on a particle surface. Accordingly, it is preferable to carry out the hydrophobization using alkoxysilane in water.

In a case of carrying out the hydrophobization in water, for example, it is preferable to use a dispersant such as a surfactant in combination to stabilize a dispersed state of the particles before the hydrophobization. However, an hydrophobization effect of alkoxysilane may be reduced depending on a kind of dispersant, and thus a combination of the dispersant and the alkoxysilane is appropriately selected.

As a specific method of carrying out the hydrophobization using alkoxysilane, first, particles are dispersed in water, an aqueous alkoxysilane-containing solution (aqueous solution containing a hydrolysate of alkoxysilane) is mixed to the dispersed solution, and these are allowed to react with each other for a predetermined time, and preferably 6 to 12 hours while being appropriately stirred in a range of from room temperature to 40° C. When the reaction is allowed to occur under these conditions, the reaction appropriately proceeds, and thus a dispersed solution of sufficiently hydrophobized particles may be obtained. When the reaction excessively proceeds, silanol groups react with each other, and thus particles are coupled to each other. Therefore, the particle dispersion properties of the dispersed solution decreases, and there is a tendency for the particle mono-layer film that is obtained to be constituted by two or more layers partially agglomerated into a cluster shape. On the other hand, when the reaction is not sufficient, the hydrophobization of the particle surface is also not sufficient. As a result, in the particle mono-layer film, there is a tendency for a pitch between particles that are obtained to broaden.

In addition, alkoxysilane other than amine-based alkoxysilane is hydrolyzed under acid or alkali conditions, and thus it is necessary to adjust the pH of the dispersed solution to acidity or alkalinity during reaction. The pH adjustment method is not limited. However, according to a method in which an aqueous acetic acid solution having a concentration of 0.1 to 2.0% by mass, in addition to promotion of hydrolysis, an effect of stabilizing the silanol group may be also obtained, and thus this method is preferable.

With regard to a ratio between the particles to be hydrophobized and the alkoxysilane, it is preferable that the mass of the alkoxysilane be $1/10$ to $1/100$ times the mass of the particles to be hydrophobized.

After reaction for a predetermined time, one or more kinds of the above-described volatile organic solvents are added to the dispersed solution to perform oil-phase extraction of the particles that are hydrophobized in water. At this time, the volume of the organic solvent that is added is preferably 0.3 to 3 times that of the dispersion solution before addition of the organic solvent. The dispersed solution (dispersed solution in which particles are dispersed in an organic solvent) that is obtained in this manner may be used as is as a dispersed solution that is added dropwise to the liquid surface of the lower-layer water during a dropwise adding process. In addition, in the hydrophobization treatment, it is preferable to carry out stirring, irradiation of ultrasonic wave, and the like to increase the particle dispersion properties of the dispersed solution during the treatment. When the particle dispersion properties of the dispersed solution increases, agglomeration of the particles into a cluster shape may be suppressed. Accordingly, a particle mono-layer film in which the respective particles are closely packed in two dimensions may be obtained in a relatively easy manner.

It is preferable that a concentration of particles in the dispersed solution be set to 1 to 10% by mass. In addition, it is preferable that a dropwise addition rate be set to 0.001 to 0.01 ml/second. When the concentration of particles in the dispersed solution and an amount of dropwise addition are within the ranges, a tendency in which the particles are partially agglomerated into a cluster shape and thus the particles are constituted by two or more layers, a tendency in which defective sites at which the particles are not present occur, a tendency in which a pitch between the particles broadens, and the like are suppressed. Accordingly, a particle mono-layer film in which the respective particles are closely packed in two dimensions with high accuracy may be obtained in a relatively easy manner.

It is preferable that the process of forming the particle mono-layer film be carried out under ultrasonic irradiation conditions. When the process of forming the particle mono-layer film is carried out while emitting ultrasonic waves toward the water surface from the lower-layer water, closest packing of the particle is promoted. Accordingly, a particle mono-layer film, in which the respective particles are closely packed in two dimensions with relatively high accuracy, may be obtained.

At this time, it is preferable that an output of the ultrasonic waves be 1 to 1,200 W, and more preferably 50 to 600 W.

In addition, a frequency of the ultrasonic waves is not particularly limited. However, for example, 28 kHz to 5 MHz is preferable, and 700 kHz to 2 MHz is more preferable. Generally, when the frequency of vibration is too high, energy absorption of water molecules begins to start, and thus a phenomenon in which water vapor or water droplets rise up from a water surface occurs. Therefore, this range is not appropriate for the LB method of the invention. In addition, generally, when the frequency of vibration is too low, a cavitation radius in lower-layer water increases, and thus bubbles are generated in water and emerges toward the water surface. When the bubbles are collected under the particle mono-layer film, flatness of the water surface disappears, and thus this is not appropriate for carrying out the invention. In addition, a stationary wave is generated on the water surface due to the irradiation of ultrasonic waves. When an output is too high at any frequency, or the wave height of the water surface is too high according to tuning conditions of an ultrasonic vibrator and a transmitter, the particle mono-layer film may be broken due to surface waves.

As described above, when the frequency of the ultrasonic waves is appropriately set, the closest packing of the particles may be effectively promoted without breaking the particle mono-layer film that is formed. However, for example, when the particles are composed of small particles having a particle size of 100 nm or less, an acoustic natural frequency of vibration of the particles becomes very high, and thus it is difficult to apply the same ultrasonic vibration as a calculation result.

In this case, when calculation is carried out by assuming that natural vibration corresponding to the mass to a degree of a dimer, a trimer, . . . an eicosamer of particles is applied, a necessary frequency of vibration may be reduced to a practical range. Even when ultrasonic vibration corresponding to a natural frequency of vibration of an assembly of particles is applied, an effect of improving a packing ratio of particles is shown. An irradiation time of ultrasonic waves may be sufficiently set in order for rearrangement of particles to be completed, and the necessary time may vary depending on a particle size, a frequency of ultrasonic waves, a water temperature, and the like. However, it is preferable to carry out the irradiation of ultrasonic waves for 10 seconds to 60 minutes under common preparation conditions, and more preferably for 3 minutes to 30 minutes.

Advantages that may be obtained by the irradiation of ultrasonic waves include an effect of breaking a soft agglomerate of the particle, which is easily generated during preparation of the dispersed solution, and an effect of recovering a point defect, a line defect, crystal transition, and the like, which are generated once, to a certain degree in addition to the closest packing (random arrangement is converted into hexagonal closest packing) of the particles.

The formation of the above-described particle mono-layer film is obtained by self-assembly of the particles. The principle is as follows. When the particles are collected, surface tension operates due to a dispersion medium that is present between the particles. As a result, the particles are not randomly present, and automatically form a two-dimensional closest packed structure. The closest packing due to the surface tension is also referred to as arrangement by a horizontal capillary force.

Particularly, for example, three particles, which have a spherical shape and high particle size uniformity like colloidal silica, are collected and come into contact with each other in a state of remaining on a water surface, surface tension operates in such a manner that the total length of a water line of a particle group becomes the minimum, and thus the three particles are stabilized with arrangement that is based on an equilateral triangle. In a case where the water line is located at the vertex of the particle group, that is, the particles get into the underside of the liquid surface, the self-assembly does not occur, and the particle mono-layer film is not formed. Accordingly, with regard to the particles and the lower-layer water, when one side has hydrophobicity, it is important that the other side is set to have hydrophilicity in order for the particle group not to get into the underside of the liquid surface.

As the lower-layer liquid, it is preferable to use water as described above. When water is used, relatively large surface free energy operates, and thus there is a tendency that the closest packing arrangement, which is formed at once, of the particles may stably last.

[Transition Process]

In the transition process, the particle mono-layer film, which is formed on the liquid surface of the lower-layer water by the process of forming the particle mono-layer film, is moved in a mono layer state onto the original substrate that is an object to be etched.

A specific method of moving the particle mono-layer film onto the original substrate is not particularly limited. Examples thereof include a method in which a hydrophobic original plate of a substrate is allowed to descend from the upper side while maintaining the hydrophobic original plate in a state of being approximately parallel with a particle mono-layer film so as to come into contact with the particle mono-layer film, and the particle mono-layer film is moved onto the original substrate using affinity between the particle mono-layer film and the substrate that have hydrophobicity; a method in which the original substrate is disposed in advance within the lower-layer water in the water tank in an approximately horizontal direction before forming the particle mono-layer film, the particle mono-layer film is formed on the liquid surface, and the liquid surface is allowed to gradually descend to move the particle mono-layer film onto the original substrate; and the like. According to the methods, the particle mono-layer film may be moved onto the substrate without using a particular apparatus. However, from the viewpoint that even when the particle mono-layer film has a relatively large area, the particle mono-layer film is easily moved onto the original substrate while maintaining the two-dimensional closest packing state, a so-called LB trough method is preferably adapted.

In the LB trough method, the original substrate is immersed in the lower-layer water inside the water tank in advance in an approximately vertical direction, and in this state, the above-described process of forming the particle mono-layer film is carried out to form the particle mono-layer film. In addition, after the process of forming the particle mono-layer film, the original substrate is pulled toward the upper side to move the particle mono-layer film onto the original substrate.

At this time, since the particle mono-layer film has been already formed in a mono-layer state on the liquid surface by the process of forming the particle mono-layer film, even when the temperature condition (the temperature of the lower-layer water) in the transition process, the pulling velocity of the original substrate, and the like vary slightly, there is no concern the particle mono-layer film collapses into multiple layers, or the like.

Commonly, the temperature of the lower-layer water depends on an environmental temperature that varies according to a season or weather, and is approximately 10° C. to 30° C.

In addition, at this time, as the water tank, when using an LB trough apparatus provided with a surface-pressure sensor that measures a surface pressure of the particle mono-layer film based on the principle of Wilhelmy plate or the like, and a movable barrier that compresses the particle mono-layer film in a direction along the liquid surface, it is possible to move the particle mono-layer film having a relatively large area onto the original substrate in a relatively stable manner. According to the apparatus, it is possible to compress the particle mono-layer film at a preferred diffusion pressure (density) while measuring the surface pressure of the particle mono-layer film. In addition, the particle mono-layer film may be moved toward the original substrate at a constant velocity. Accordingly, the transition of the particle mono-layer film from the liquid surface to the original substrate smoothly proceeds, and thus a trouble that the movement of only a particle mono-layer film with a small area onto the original substrate is allowed, or the like is not likely to occur.

It is preferable that the diffusion pressure be 5 to 80 mNm$^{-1}$, and more preferably 10 to 40 mNm$^{-1}$. With this diffusion pressure, a particle mono-layer film in which the respective particles are closely packed in two dimensions with relatively high accuracy may be easily obtained. In addition, the pulling velocity of the original substrate is preferably 0.5 to 20 mm/minute.

According to the transition process, the surface of the original substrate may be coated with the particle mono-layer film.

Furthermore, after the transition process, a fixing process of fixing the particle mono-layer film onto the original substrate may be carried out as necessary. When the particle mono-layer film is fixed onto the original substrate, a possibility that the particle moves on the original substrate during the subsequent dry etching is suppressed, and thus the surface of the original substrate may be etched with high accuracy in a relatively stable manner. Particularly, when the dry etching proceeds, the diameter of the particles gradually decreases, and thus the possibility that the particles moves on the original substrate increases.

Examples of a method of the fixing process include a method using a binder and a sintering method.

In the method using a binder, a binder solution is supplied to the side of particle mono-layer film of the original substrate on which the particle mono-layer film so as to penetrate into between the particle mono-layer film and the original substrate.

A used amount of the binder is preferably 0.001 to 0.02 times the mass of the particle mono-layer film. When the used amount of the binder is within the range, the particles may be sufficiently fixed without causing a problem that due to an excessive amount of the binder, the binder is filled up between particles, and thus accuracy of the particle mono-layer film is adversely affected. In a case where too much of the binder solution is supplied, after penetration of the binder solution, a surplus portion of the binder solution may be removed by using a spin coater or by inclining the substrate.

As a kind of binder, alkoxysilane that is previously exemplified as the hydrophobizing agent, a general organic binder, an inorganic binder, and the like may be used, and after the penetration of the binder solution, an appropriate heating treatment may be performed according to the kind of binder. In a case of using alkoxysilane as the binder, it is preferable to carry out the heating treatment under conditions of 40° C. to 80° C. and 3 to 60 minutes.

In the case of adapting the sintering method, the original substrate on which the particle mono-layer film is formed may be heated to fuse the respective particles constituting the particle mono-layer film onto the substrate. The heating temperature may be determined according to a material of the particles and a material of the substrate. However, in particles having a particle size of 1 μm or less, since an interface reaction initiates at a temperature lower than the intrinsic melting point of the material, the sintering is completed at a relatively lower temperature. When the heating temperature is too high, a fusion area of the particles increases, and as as a result, there is a possibility that accuracy is affected by the increased fusion area, for example, the shape of the particle mono-layer film varies. In addition, when the heating is carried out in the air, the substrate or the respective particle may be oxidized, and thus the heating is preferably carried out in an inert gas atmosphere. In a case where the sintering is carried out in an oxygen-containing atmosphere, it is necessary to set conditions in consideration of an oxidation layer in an etching process to be described later.

In the particle mono-layer film that is obtained as described above, a deviation D(%) in arrangement of the particles, which is defined by Expression (9) described below, is preferably 10% or less.

[Mathematical Expression 9]

$$D(\%)=|B-A|\times 100/A \qquad (9)$$

[in Expression (9), A represents an average particle size of the particles, and B represents an average pitch between the particles in the particle mono-layer film.]

In Expression (9), the "average particle size of the particles" of A represents an average primary particle size of the particles constituting the particle mono-layer film, and may be obtained by a usual method from a peak obtained by fitting a particle size distribution obtained by a particle dynamic scattering method to a Gauss curve.

The "pitch between particles" of B is a distance between vertexes of two adjacent particles, and the "average pitch" is an average value in the particle mono-layer film. In addition, the particles have a spherical shape, the distance between vertexes of the two adjacent particles is the same as a distance between the centers of the adjacent particles.

The average pitch between particles in the particle mono-layer film may be obtained by AFM in the same manner as the distance p between the centers of the convex portions 15.

In the particle mono-layer film in which the deviation D in the arrangement of the particles is 10% or less, the respective particles are closely packed in two dimensions, and the gap between the particles is controlled. Accordingly, accuracy of the arrangement is high.

{Dry Etching Process}

As described above, the substrate surface coated with the particle mono-layer film is dry-etched, and accordingly, a substrate having a structure in which a plurality of convex portions are periodically and two-dimensionally ordered may be obtained.

Specifically, when the dry etching is initiated, first, an etching gas passes through a gap between the respective particles constituting the particle mono-layer film, and reaches the surface of the original substrate. Accordingly, concave portions are formed at the surface portion, and convex portions appear at portions corresponding to the respective particles, respectively. When the dry etching continues, the particles on the respective convex portions are gradually etched, and the size of the particles decreases. At the same time, the concave portions on the surface of the original substrate become deep. In addition, finally, the respective particles are removed by the dry etching, and along with this, a structure in which the plurality of convex portions are periodically and two-dimensionally ordered is formed on the surface of the original substrate.

At this time, the height or shape of the convex portions that are formed may be adjusted by adjusting dry etching conditions (bias, a gas flow rate, a kind of the deposition gas and an amount thereof, and the like).

Examples of the etching gas that is used for the dry etching include Ar, $SF_6$, $F_2$, $CF_4$, $C_4F_8$, $C_5F_8$, $C_2F_6$, $C_3F_6$, $C_4F_6$, $CHF_3$, $CH_2F_2$, $CH_3F$, $C_3F_8$, $Cl_2$, $CCl_4$, $SiCl_4$, $BCl_2$, $BCl_3$, $BC_2$, $Br_2$, $Br_3$, HBr, $CBrF_3$, HCl, $CH_4$, $NH_3$, $O_2$, $H_2$, $N_2$, CO, $CO_2$, and the like. The etching gas is not limited to the gases as long as the effect of the invention does not deteriorate. Among these gases, one or more kinds may be used according to the particles constituting the particle mono-layer film, the material of the substrate, and the like.

Examples of an etching apparatus that may be used include a reactive ion etching apparatus, an ion beam etching apparatus, and the like that are capable of realizing anisotropic etching, and there is no particular limitation to specifications such as a type of plasma generation, a structure of an electrode, a structure of a chamber, and a frequency of high-frequency power source, as long as a bias electric field as small as approximately 20 W may occur.

In the invention, it is preferable to set respective etching conditions (the material of the particles constituting the particle mono-layer film, the material of the substrate, a kind of etching gas, a bias power, antenna power, a flow rate and a pressure of the gas, etching time, and the like) in such a manner that an etching selectivity (an etching rate of the substrate/an etching rate of the particle mono-layer film) in the dry etching process becomes 1.0 or less.

For example, in a case where colloidal silica particles are selected as particles constituting a particle mono-layer film etching mask, a quartz substrate is selected as the substrate, and these are used in combination, when a gas such as Ar and $CF_4$ is used as the etching gas, etching may be carried out with a relatively low ratio between amplitude and pitch.

In addition, when the bias of an electric field is set from tens of W to several hundreds of W, electrostatic particles in the etching gas, which enter a plasma state, are accelerated and are incident to the substrate at a high speed in a direction that is approximately orthogonal to the substrate. Accordingly, when a gas having reactivity with respect to the substrate is used, a reaction velocity of vertical physicochemical etching may be raised.

Although depending on the combination of the material of the substrate and the kind of etching gas, in the dry etching, isotropic etching due to radicals generated by plasma occur concurrently. The etching by the radicals is chemical etching, and etching is isotropically carried out in all directions of an object to be etched. The radicals do not have a charge, and thus the etching rate is not controlled through setting of the bias power, and is managed by a concentration of the etching gas in a chamber. It is necessary to maintain a gas pressure to a certain degree so as to carry out anisotropic etching by charged particles, and thus it is difficult to totally remove the influence of the radicals as long as the reactive gas is used. However, a method of making a reaction velocity slow by cooling a base material has been widely used, and a number of apparatuses provided with the mechanism are available. Accordingly, it is preferable to use this method.

In addition, in the dry etching process, when the bias power is mainly adjusted, and a so-called deposition gas is used in combination according to circumstances, it is possible to form a two-dimensional lattice structure in which a ratio between the distance between the centers of convex portions and the height (distance between the centers/height) is relatively low in the substrate surface.

With regard to the structure that is formed in the substrate surface as described above, when a distance C between the centers of the convex portions is obtained in the same manner as the method of obtaining the average pitch B between the particles in the particle mono-layer film as described previously, the distance C is substantially the same as the average pitch B of the particle mono-layer film that is used. In addition, with regard to the structure, a deviation D' (%) in arrangement that is defined in Expression (10) described below is obtained, the resultant value is also substantially the same as the deviation D in arrangement in the particle mono-layer film that is used.

[Mathematical Expression 10]

$$D'(\%)=|C-A|\times 100/A \qquad (10)$$

[in Expression (10), A represents an average particle size of the particles constituting the particle mono-layer film that is used, and C represents the distance between the centers of the convex portions.]

In addition, in a case of preparing a substrate having a structure in which a plurality of concave portions are periodically and two-dimensionally ordered by the dry etching method, a method in which a metallic mesh mask prepared using the particle mono-layer film is used may be exemplified. That is, the particle mono-layer film is prepared on a surface of the original substrate, a metal such as Cr, Ni, Fe, and Co is vacuum-deposited from an upper side of the particle mono-layer film, and then an operation of wiping the particle mono-layer film is carried out. The metal reaches the surface of the original substrate through a gap in the particle mask during the vacuum deposition, but the metal immediately below the particles is not deposited. Accordingly, when the particles are wiped after the vacuum deposition, a mask, which is constituted by a mesh-shaped metallic deposition layer in which an opening is formed at sites at which the particles are present, is formed.

When the mesh-shaped metallic layer is used as a mask of dry etching, a portion at which the metal is not present is etched, and thus a microstructure surface, in which a number of convex holes are formed on the surface, may be obtained.

The substrate 11 may be prepared in such a manner that the substrate having a structure in which the plurality of convex portions are periodically and two-dimensionally ordered on a surface is used as a mold, and the structure in the mold surface is transferred onto the original substrate in an even number of times.

The transfer of the structure of the mold surface may be carried out by methods in the related art such as a nano imprint method, a thermal pressing method, an injection molding method, and an UV embossing method that are disclosed in Japanese Unexamined Patent Application, First Publication No. 2009-158478.

When the number of transfer times increases, a shape of the fine concavity and convexity gets dull, and thus the practical number of transfer times is preferably 2 or 4 times.

The organic light emitting diode 10 may be obtained by sequentially laminating the anodic conductive layer 12, the hole implantation layer 13a, the hole transport layer 13b, the light emitting layer 13c, the electron transport layer 13d, and the electron implantation layer 13e, and the cathodic conductive layer 14 on the structure of the substrate 11 prepared as described above.

A method of laminating these respective layers is not particularly limited, and a method in the related art, which has been used in the manufacturing of a general organic light emitting diode, may be used. For example, the anodic conductive layer 12 and the cathodic conductive layer 14 may be formed, respectively, by a sputtering method, a vacuum deposition method, and the like. In addition, the hole implantation layer 13a, the hole transport layer 13b, the light emitting layer 13c, the electron transport layer 13d, and the electron implantation layer 13e are formed according to the vacuum deposition method.

Since the thickness of these respective layers is very small, when these layers are sequentially laminated as described above, the structure on the surface of the substrate 11 is reflected up to the cathodic conductive layer 14. Accordingly, the cathodic conductive layer 14, which has the two-dimensional periodic structure on a surface thereof on an organic EL layer 13 side, is formed.

Hereinbefore, the organic light emitting diode and the manufacturing method thereof of the first aspect of the invention has been described with reference to the embodiment shown in FIG. 1, but the invention is not limited thereto. For example, in the embodiment, the description has been made with respect to an example in which the organic EL layer 13 is constituted by five layers of the hole implantation layer 13a, the hole transport layer 13b, the light emitting layer 13c, the electron transport layer 13d, and the electron implantation layer 13e, but the invention is not limited thereto. For example, among the hole implantation layer 13a, the hole transport layer 13b, the light emitting layer 13c, the electron transport layer 13d, and the electron implantation layer 13e, one layer may have the functions of two more more layers. In addition, the light emitting layer 13c is requisite, but the other layers, for example, the hole implantation layer 13a, the hole transport layer 13b, the electron transport layer 13d, and the electron implantation layer 13e may be omitted. In the simplest system, the organic EL layer 13 is constituted by only the light emitting layer 13c.

In addition, the description has been made with respect to an example in which the electron implantation layer 13e is provided. However, in a case where the cathodic conductive layer 14 also has a function of the electron implantation layer, the electron implantation layer 13e may not be provided. For example, when the cathodic conductive layer 14 is constituted by an magnesium alloy such as Mg/Ag=10/90, the electron implantation effect is obtained as described above, and thus the cathodic conductive layer 14 also has the function of the electron implantation layer.

<<Organic Light Emitting Diode of Second Aspect>>

In the organic light emitting diode of the second aspect of the invention, at least a cathodic conductive layer formed from Ag or an alloy containing 70% by mass or more of Ag, an organic EL layer that includes a light emitting layer containing an organic light emitting material, and an anodic conductive layer are sequentially laminated on a substrate. A two-dimensional lattice structure, in which a plurality of concave portions are periodically and two-dimensionally ordered, is provided on a surface of the cathodic conductive layer on an organic EL layer side.

An extraction wavelength λ (nm) of light from the organic light emitting diode and a distance p (nm) between centers of the concave portions in the two-dimensional lattice structure are within a region surrounded by straight lines sequentially connecting the following coordinates A, B, C, D, E, F, G, H, I, J, and A in a graph illustrating a relationship between the light extraction wavelength and the distance, and the depth of the concave portions is 15 nm to 70 nm.

A (λ=450, p=258+W(½)), B (λ=500, p=319+W(½)), C (λ=600, p=406+W(½)), D (λ=700, p=484+W(½)), E (λ=800, p=561+W(½)), F (λ=800, p=493−W(½)), G (λ=700, p=425−W(½)), H (λ=600, p=353−W(½)), I (λ=500, p=262−W(½)), and J (λ=450, p=110−W(½)), in which W(½) represents a half width at half maximum of a light emitting peak in a spectrum of the light emitting material that constitutes the light emitting layer.

The organic light emitting diode of this aspect is an organic light emitting diode having a layer configuration of a type generally called a top emission type. The organic light emitting diode is the same as the organic light emitting diode of the first aspect except that the lamination sequence of the cathodic conductive layer, the organic EL layer, and the anodic conductive layer on the substrate is reversed.

Hereinafter, the organic light emitting diode of this aspect will be described with reference to the attached drawings. In addition, in the following embodiment, the same reference numerals are given to the same parts corresponding to the configuration shown in the drawings shown previously, and a detailed description thereof will be omitted here.

Figure 5:
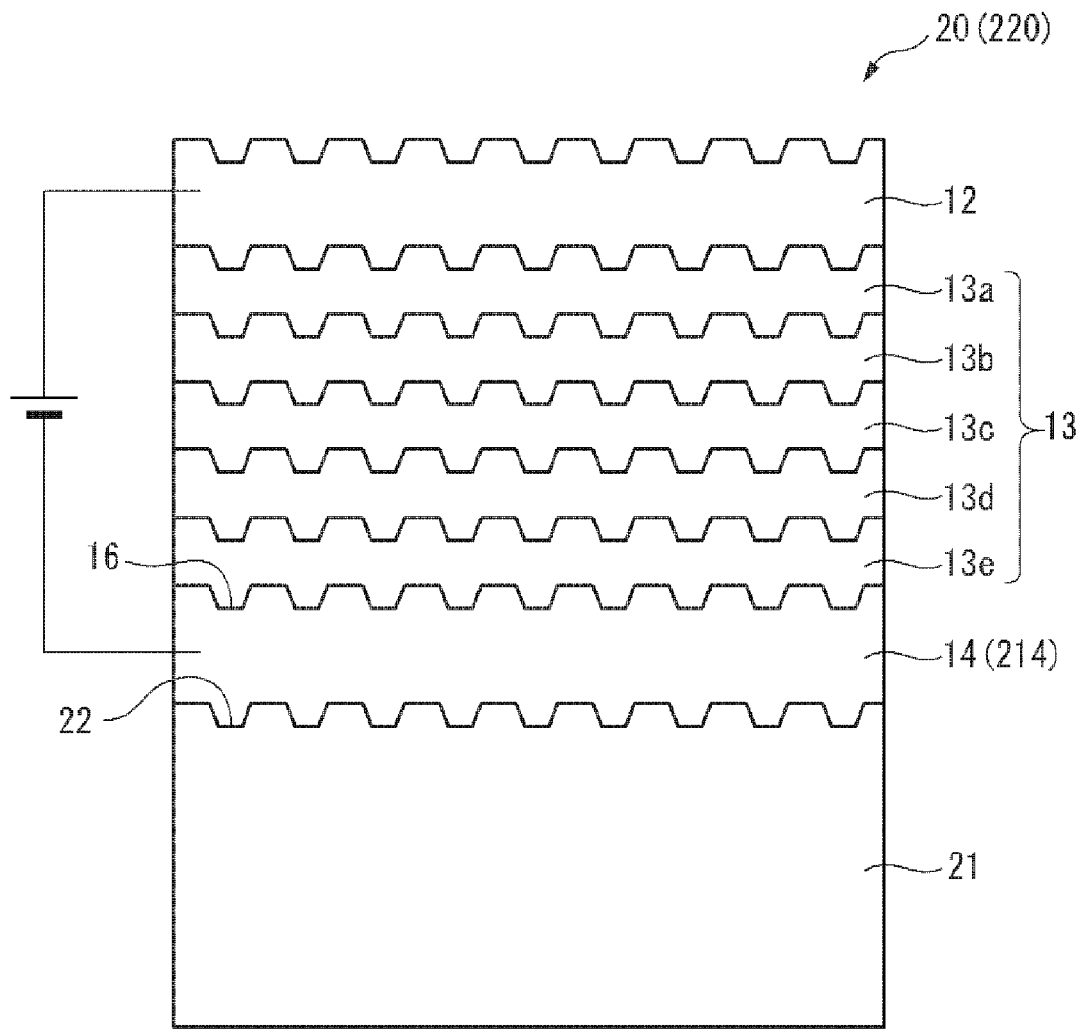
FIG. 5 is a schematic diagram illustrating an example of the structure of organic light emitting diodes of second and sixth aspects.

FIG. 5 shows a partial schematic cross-sectional diagram illustrating a configuration of an embodiment of the organic light emitting diode of this aspect.

In the organic light emitting diode 20 of this embodiment, a cathodic conductive layer 14, an organic EL layer 13, and an anodic conductive layer 12 are sequentially laminated on a substrate 21.

The organic EL layer 13 includes an electron implantation layer 13e, an electron transport layer 13d, a light emitting layer 13c, a hole transport layer 13b, and a hole implantation layer 13a that are sequentially laminated from the side of the cathodic conductive layer 14.

A voltage may be applied to the anodic conductive layer 12 and the cathodic conductive layer 14.

In this aspect, a structure in which a plurality of concave portions 22 are periodically and two-dimensionally ordered is provided on a surface of the substrate 21 on a side at which the cathodic conductive layer 14 is laminated. When the cathodic conductive layer 14 is laminated on the structure, a structure that is the same as that of the surface of the substrate 21, that is, a structure (two-dimensional lattice structure) in which a plurality of concave portions 16 are periodically and two-dimensionally ordered is formed on the surface of the negative conductive layer 14 on an organic EL layer 13 side.

As a material constituting the substrate 21, the same material as the substrate 11 may be exemplified. However, in this aspect, light is extracted from a side that is opposite to the substrate 21, and thus the substrate 21 may be not necessarily transparent.

The cathodic conductive layer 14, the organic EL layer 13, and the anodic conductive layer 12 are the same as the layers described above, respectively.

The organic light emitting diode 20 of this aspect may be manufactured by the same manner as the organic light emitting diode 10 except that the cathodic conductive layer 14, the organic EL layer 13, and the anodic conductive layer 12 are sequentially laminated on the structure of the substrate 21 having a structure in which the plurality of concave portions 22 corresponding to the two-dimensional lattice structure are periodically and two-dimensionally ordered on a surface.

Examples of a method for preparing the substrate 21 include photolithography, electron beam photolithography, mechanical cutting, layer machining, two-beam interference exposure, reduction exposure, and the like.

However, as described above, among the methods, methods other than the two-beam interference exposure is not suitable for manufacturing a periodic lattice structure in a large area, and thus has restrictions on an area in an industrial use aspect. In addition, the two-beam interference exposure may manufacture a substrate having a small area to a certain degree. However, in a case of an large area in which a side is several cm or more, the manufacturing is affected by various disturbance factors such as vibration, wind, thermal expansion and shrinkage, fluctuation of air, and voltage variation with respect to the entirety of optical setup, and thus it is very difficult to prepare a uniform, correct, and periodic lattice structure.

Therefore, in this aspect, in the manufacturing of the substrate 21, it is preferable to use the dry etching method in which the particle mono-layer film is used as an etching mask similar to the substrate 11.

The manufacturing of the substrate 21 by using the dry etching method in which the particle mono-layer film is used as the etching mask may be carried out, for example, by preparing a mold having a structure in which the plurality of convex portions corresponding to the two-dimensional lattice structure are periodically and two-dimensionally ordered on a surface according to the dry etching method in which the particle mono-layer film is used as the etching mask, and by transfer the structure of the structure in the mold surface to the original substrate in an odd number of times.

The preparation of the mold according to the dry etching method in which the particle mono-layer film is used as the etching mask may be carried out in the same sequence as the manufacturing of the substrate in the first aspect.

The transfer of the structure of the mold surface may be carried out by methods in the related art such as the nano imprint method, the thermal pressing method, the injection molding method, and the UV embossing method that are disclosed in Japanese Unexamined Patent Application, First Publication No. 2009-158478.

When the number of transfer times increases, a shape of the fine concavity and convexity gets dull, and thus a practical number of transfer times is preferably 1 or 3 times.

In addition, as another method, a method in which a metallic mesh mask prepared using the particle mono-layer film is used may be exemplified. That is, the particle mono-layer film is prepared on a surface of the original substrate, a metal such as Cr, Ni, Fe, and Co is vacuum-deposited from an upper side of the particle mono-layer film, and then an operation of wiping the particle mono-layer film is carried out. The metal reaches the surface of the original substrate through a gap in the particle mask during the vacuum deposition, but the metal immediately below the particles is not deposited. Accordingly, when the particles are wiped after the vacuum deposition, a mask, which is constituted by a mesh-shaped metallic deposition layer in which an opening is formed at sites at which the particles are present, is formed.

When the mesh-shaped metallic layer is used as a mask of dry etching, a portion at which the metal is not present is etched, and thus a microstructure surface, in which a number of concave holes are formed on the surface, may be obtained.

<<Organic Light Emitting Diode of Third Aspect>>

In the organic light emitting diode of the third aspect of the invention, at least an anodic conductive layer, an organic electroluminescence layer that includes a light emitting layer containing an organic light emitting material, and a cathodic conductive layer formed from Ag or an alloy containing 70% by mass or more of Ag are sequentially laminated on a substrate. A two-dimensional lattice structure, in which a plurality of convex portions are periodically and two-dimensionally ordered, is provided on a surface of the cathodic conductive layer on an organic electroluminescence layer side.

An extraction wavelength $\lambda$ (nm) of light from the organic light emitting diode and a distance p (nm) between centers of the convex portions in the two-dimensional lattice structure are within a region surrounded by straight lines sequentially connecting the following coordinates A, B, C, D, E, F, G, H, I, J, and A in a graph illustrating a relationship between the light extraction wavelength and the distance, and the height of the convex portions is 12 nm to 180 nm.

A ($\lambda$=450, p=258+W(½)), B ($\lambda$=500, p=319+W(½)), C ($\lambda$=600, p=406+W(½)), D ($\lambda$=700, p=484+W(½)), E ($\lambda$=800, p=561+W(½)), F ($\lambda$=800, p=493−W(½)), G ($\lambda$=700, p=425−W(½)), H ($\lambda$=600, p=353−W(½)), I ($\lambda$=500, p=262−W(½)), and J ($\lambda$=450, p=110−W(½)), in which W(½) represents a half width at half maximum of a light emitting peak in a spectrum of the light emitting material that constitutes the light emitting layer.

The organic light emitting diode of this aspect is an organic light emitting diode having a layer configuration of a type generally called a bottom emission type. The organic light emitting diode is the same as the organic light emitting diode of the first aspect except that the convex portions of the substrate of the organic light emitting diode of the first aspect are changed to concave portions, and the concave portions on the surface of the cathodic conductive layer on the organic EL layer side are changed to convex portions.

Hereinafter, the organic light emitting diode of this aspect will be described with reference to the attached drawings. In addition, in the following embodiment, the same reference numerals are given to the same parts corresponding to the configuration shown in the drawings shown previously, and a detailed description thereof will be omitted here.

Figure 8:
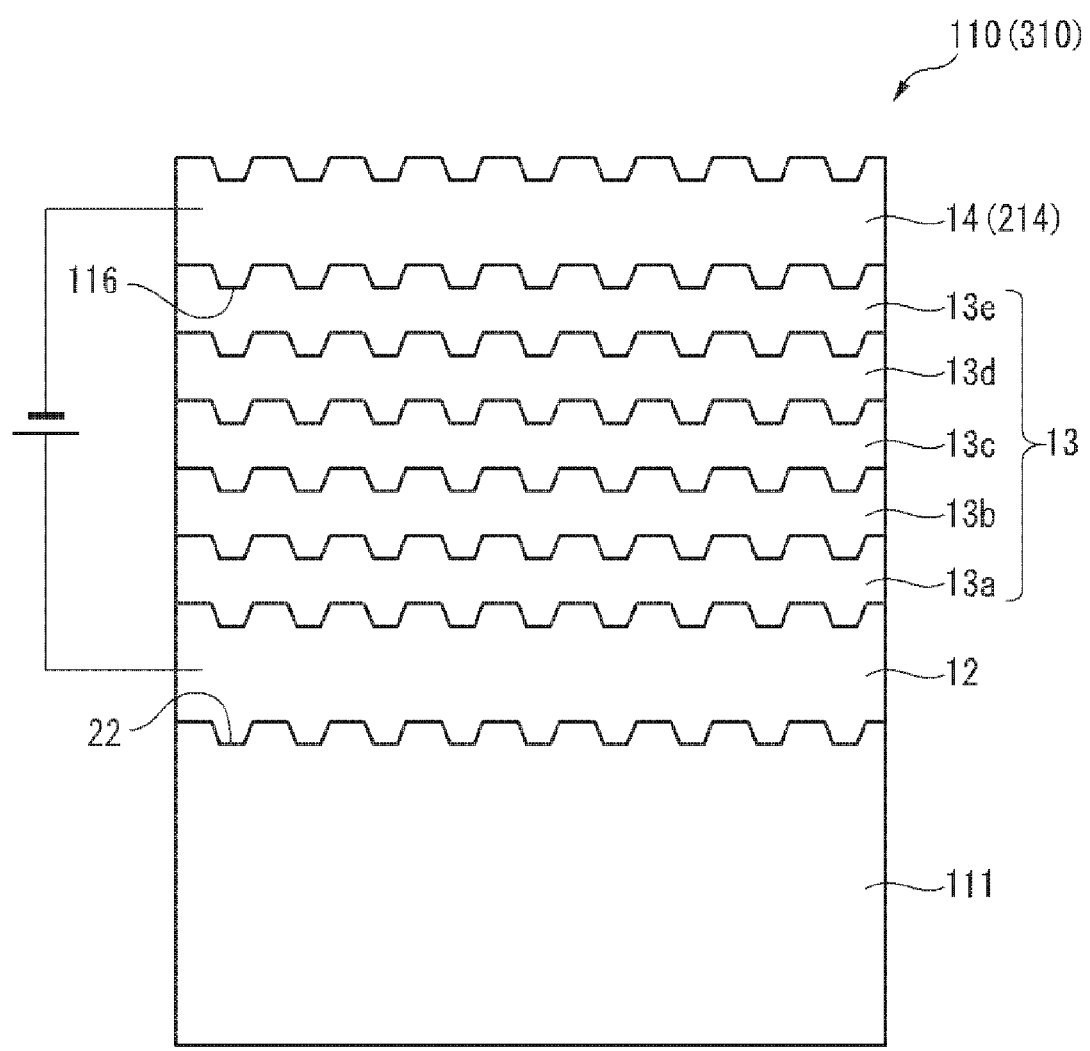
FIG. 8 is a schematic diagram illustrating an example of the structure of organic light emitting diodes of third and seventh aspects.

FIG. 8 shows a partial schematic cross-sectional diagram illustrating a configuration of an embodiment of the organic light emitting diode of this aspect.

In the organic light emitting diode 110 of this embodiment, an anodic conductive layer 12, an organic EL layer 13, and a cathodic conductive layer 14 are sequentially laminated on a substrate 111.

The organic EL layer 13 includes a hole implantation layer 13a, a hole transport layer 13b, a light emitting layer 13c, an electron transport layer 13d, and an electron implantation layer 13e that are sequentially laminated from the side of the anodic conductive layer 12.

A voltage may be applied to the anodic conductive layer 12 and the cathodic conductive layer 14.

In this aspect, a structure in which a plurality of concave portions 22 are periodically and two-dimensionally ordered is provided on a surface of the substrate 111 on a side at which the anodic conductive layer 12 is laminated. When the anodic conductive layer 12, the organic EL layer 13 (the hole implantation layer 13a, the hole transport layer 13b, the light emitting layer 13c, the electron transport layer 13d, and the electron implantation layer 13e) are sequentially laminated on the structure, the same structure as the surface of the substrate 111 is formed on surfaces of the respective layers on a cathodic conductive layer 14 side. Accordingly, when the cathodic conductive layer 14 is finally laminated on the organic EL layer 13, a structure inverted from the structure of the surface of the substrate 111, that is, a two-dimensional lattice structure, in which a plurality of convex portions 116 are periodically and two-dimensionally ordered, is formed on a surface of the cathodic conductive layer 14 on an organic EL layer 13 side.

As a material constituting the substrate 111, the same material as the substrate 11 may be exemplified.

The cathodic conductive layer 14, the organic EL layer 13, and the anodic conductive layer 12 are the same as the layers described above, respectively.

The organic light emitting diode 110 of this aspect may be manufactured by the same manner as the organic light emitting diode 10 except that the anodic conductive layer 12 is laminated on the structure of the substrate 111 having a structure in which the plurality of concave portions 22 corresponding to the two-dimensional lattice structure are periodically and two-dimensionally ordered on a surface.

The substrate 111 may be manufactured in the same manner as the substrate 21 of the second aspect, and a preferred manufacturing method is the same as the preferred manufacturing method of the substrate 21.

<<Organic Light Emitting Diode of Fourth Aspect>>

In the organic light emitting diode of the fourth aspect of the invention, at least a cathodic conductive layer formed from Ag or an alloy containing 70% by mass or more of Ag, an organic electroluminescence layer that includes a light emitting layer containing an organic light emitting material, and an anodic conductive layer are sequentially laminated on a substrate. A two-dimensional lattice structure, in which a plurality of convex portions are periodically and two-dimensionally ordered, is provided on a surface of the cathodic conductive layer on an organic electroluminescence layer side.

An extraction wavelength λ (nm) of light from the organic light emitting diode and a distance p (nm) between centers of the convex portions in the two-dimensional lattice structure are within a region surrounded by straight lines sequentially connecting the following coordinates A, B, C, D, E, F, G, H, I, J, and A in a graph illustrating a relationship between the light extraction wavelength and the distance, and the height of the convex portions is 12 nm to 180 nm.

A (λ=450, p=258+W(½)), B (λ=500, p=319+W(½)), C (λ=600, p=406+W(½)), D (λ=700, p=484+W(½)), E (λ=800, p=561+W(½)), F (λ=800, p=493−W(½)), G (λ=700, p=425−W(½)), H (λ=600, p=353−W(½)), I (λ=500, p=262−W(½)), and J (λ=450, p=110−W(½)), in which W(½) represents a half width at half maximum of a light emitting peak in a spectrum of the light emitting material that constitutes the light emitting layer.

The organic light emitting diode of this aspect is an organic light emitting diode having a layer configuration of a type generally called a top emission type. The organic light emitting diode is the same as the organic light emitting diode of the second aspect except that the concave portions of the substrate of the organic light emitting diode of the second aspect are changed to convex portions, and the convex portions on the surface of the cathodic conductive layer on the organic EL layer side are changed to concave portions.

Hereinafter, the organic light emitting diode of this aspect will be described with reference to the attached drawings. In addition, in the following embodiment, the same reference numerals are given to the same parts corresponding to the configuration shown in the drawings shown previously, and a detailed description thereof will be omitted here.

Figure 9:
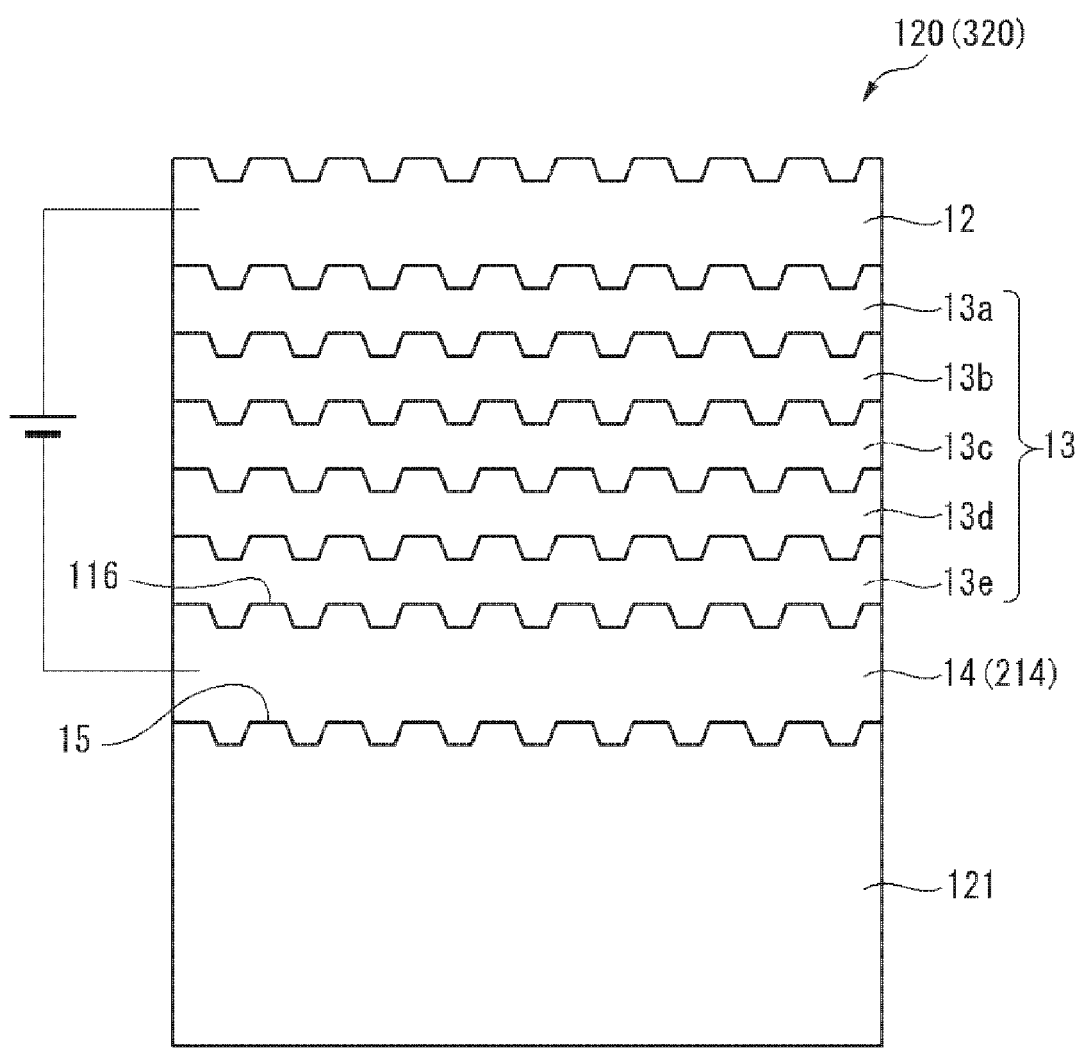
FIG. 9 is a schematic diagram illustrating an example of the structure of organic light emitting diodes of fourth and eighth aspects.

FIG. 9 shows a partial schematic cross-sectional diagram illustrating a configuration of an embodiment of the organic light emitting diode of this aspect.

In the organic light emitting diode 120 of this embodiment, a cathodic conductive layer 14, an organic EL layer 13, and an anodic conductive layer 12 are sequentially laminated on a substrate 121.

The organic EL layer 13 includes an electron implantation layer 13e, an electron transport layer 13d, a light emitting layer 13c, a hole transport layer 13b, and a hole implantation layer 13a that are sequentially laminated from the side of the cathodic conductive layer 14.

A voltage may be applied to the anodic conductive layer 12 and the cathodic conductive layer 14.

In this aspect, a structure in which a plurality of convex portions 15 are periodically and two-dimensionally ordered is provided on a surface of the substrate 121 on a side at which the cathodic conductive layer 14 is laminated. When the cathodic conductive layer 14 is laminated on the structure, a structure that is the same as the surface of the substrate 121, that is, a structure (two-dimensional lattice structure) in which a plurality of convex portions 116 are periodically and two-dimensionally ordered is formed on a surface of the cathodic conductive layer 14 on an organic EL layer 13 side.

As a material constituting the substrate 121, the same materials as the substrate 21 are exemplary examples.

The cathodic conductive layer 14, the organic EL layer 13, and the anodic conductive layer 12 are the same as the layers described above, respectively.

The organic light emitting diode 120 of this aspect may be manufactured by the same manner as the organic light emitting diode 20 except that the cathodic conductive layer 14 is laminated on the structure of the substrate 121 having a structure in which the plurality of convex portions 15 corresponding to the two-dimensional lattice structure are periodically and two-dimensionally ordered on a surface.

The substrate 121 may be manufactured in the same manner as the substrate 11 of the first aspect, and a preferred manufacturing method is the same as the preferred manufacturing method of the substrate 11.

<<Organic Light Emitting Diode of Fifth Aspect>>

In the organic light emitting diode of the fifth aspect of the invention, at least an anodic conductive layer, an organic electroluminescence layer that includes a light emitting layer containing an organic light emitting material, and a cathodic conductive layer formed from Al or an alloy containing 70% by mass or more of Al are sequentially laminated on a substrate, and a two-dimensional lattice structure, in which a plurality of concave portions are periodically and two-dimensionally ordered, is provided on a surface of the cathodic conductive layer on an organic electroluminescence layer side.

An extraction wavelength λ (nm) of light from the organic light emitting diode and a distance p (nm) between centers of the concave portions in the two-dimensional lattice structure are within a region surrounded by straight lines sequentially connecting the following coordinates A', B', C', D', E', F', G', H', I', J', K', L', and A' in a graph illustrating a relationship between the light extraction wavelength and the distance, and the depth of the concave portions is 12 nm to 180 nm.

A' (λ=300, p=220+W(½)), B' (λ=400, p=295+W(½)), C' (λ=500, p=368+W(½)), D' (λ=600, p=438+W(½)), E' (λ=700, p=508+W(½)), F' (λ=800, p=575+W(½)), G' (λ=800, p=505−W(½)), H' (λ=700, p=438−W(½)), I' (λ=600, p=368−W(½)), J' (λ=500, p=298−W(½)), K' (λ=400, p=225−W(½)), and L' (λ=300, p=150−W(½)), in which W(½) represents a half width at half maximum of a light emitting peak in a spectrum of the light emitting material that constitutes the light emitting layer.

The organic light emitting diode of this aspect is an organic light emitting diode having a layer configuration of a type generally called a bottom emission type. The organic light emitting diode is the same as the organic light emitting diode of the first aspect except that the material of the cathodic conductive layer of the organic light emitting diode of the first aspect is changed from Ag or an alloy containing 70% by mass or more of Ag to Al or an alloy containing 70% by mass or more of Al, and the distance p between the centers of the plurality of concave portions of the cathodic conductive layer is changed to the above-described range.

Hereinafter, the organic light emitting diode of this aspect will be described with reference to the attached drawings. In addition, in the following embodiment, the same reference numerals are given to the same parts corresponding to the configuration shown in the drawings shown previously, and a detailed description thereof will be omitted here.

FIG. 1 shows a partial schematic cross-sectional diagram illustrating a configuration of an embodiment of the organic light emitting diode of this aspect.

In the organic light emitting diode 210 of this embodiment, an anodic conductive layer 12, an organic EL layer 13, and a cathodic conductive layer 214 formed from Al or an alloy containing 70% by mass or more of Al are sequentially laminated on a substrate 11.

The organic EL layer 13 includes a hole implantation layer 13a, a hole transport layer 13b, a light emitting layer 13c, an electron transport layer 13*d*, and an electron implantation layer 13*e* that are sequentially laminated from the side of the anodic conductive layer 12.

A voltage may be applied to the anodic conductive layer 12 and the cathodic conductive layer 214.

In this aspect, a structure, in which a plurality of convex portions 15 are periodically and two-dimensionally ordered, is provided on a surface the substrate 11 on a side at which the anodic conductive layer 12 is laminated. When the anodic conductive layer 12, the organic EL layer 13 (the hole implantation layer 13*a*, the hole transport layer 13*b*, the light emitting layer 13*c*, the electron transport layer 13*d*, and the electron implantation layer 13*e*) are sequentially laminated on the structure, the same structure as the surface of the substrate 11 is formed on surfaces of the respective layers on a cathodic conductive layer 214 side. Accordingly, when the cathodic conductive layer 214 is finally laminated on the organic EL layer 13, a structure inverted from the structure of the surface of the substrate 11, that is, a two-dimensional lattice structure, in which a plurality of concave portions 16 are periodically and two-dimensionally ordered, is formed on a surface of the cathodic conductive layer 214 on an organic EL layer 13 side.

[Cathodic Conductive Layer 214]

The cathodic conductive layer 214 is formed from Al or an alloy containing 70% by mass or more of Al.

The thickness of the cathodic conductive layer 214 is commonly 50 to 3,000 nm.

The substrate 11, the anodic conductive layer 12, and the organic EL layer 13 are the same as the layers described above.

The shorter the distance from the surface of the cathodic metallic layer on a light emitting layer side to the light emitting layer is, the larger a percentage of conversion from energy of the surface plasmon into light by light emitting energy is.

The invention is particularly effective with respect to an organic light emitting diode in which a percentage of energy converted into the surface plasmon is large. The invention is effective for an organic light emitting diode in which a distance from the surface of the cathodic metallic layer on a light emitting layer side to the light emitting layer is, for example, 100 nm or less, and as a relatively short distance, for example, 50 nm or less.

In the fifth aspect of the invention, the extraction wavelength $\lambda$ (nm) of light from the organic light emitting diode 210 and the distance p (nm) between the centers of the concave portions 16 in the two-dimensional lattice structure are within a region surrounded by straight lines sequentially connecting the following coordinates A', B', C', D', E', F', G', H', I', J', K', L', and A' in a graph illustrating a relationship between the light extraction wavelength and the distance. In addition, the depth of the concave portions 16 is 12 nm to 180 nm, and more preferably 15 nm to 70 nm. Accordingly, the light extraction efficiency is significantly improved.

A' ($\lambda$=300, p=220+W(½)), B' ($\lambda$=400, p=295+W(½)), C' ($\lambda$=500, p=368+W(½)), D' ($\lambda$=600, p=438+W(½)), E' ($\lambda$=700, p=508+W(½)), F' ($\lambda$=800, p=575+W(½)), G' ($\lambda$=800, p=505−W(½)), H' ($\lambda$=700, p=438−W(½)), I' ($\lambda$=600, p=368−W(½)), J' ($\lambda$=500, p=298−W(½)), K' ($\lambda$=400, p=225−W(½)), and L' ($\lambda$=300, p=150−W(½))

W(½) has the same meaning as W(½) in the first aspect.

The distance p (nm) between the centers of the concave portions 16 is determined by the extraction wavelength $\lambda$ (nm).

The extraction wavelength $\lambda$ (nm) is a wavelength when energy is extracted from the surface plasmon as radiant light, and most commonly, the $\lambda$ (nm) is an emission peak wavelength of the light emitting material.

When a specific extraction wavelength is $\lambda_1$ [$\lambda_1$ is a specific value within a range of 300 nm to 800 nm], the distance p between the centers of the concave portions 16 may take an arbitrary value corresponding to a coordinate of $\lambda=\lambda_1$ within the above-described region. For example, in a case where $\lambda_1$ is 600 nm, the distance p may take an arbitrary value from [368−W(½)] nm to [438+W(½)] nm.

The relationship between the extraction wavelength $\lambda$ (nm) and the distance p (nm) between the centers of the concave portions 16 will be described in more detail with reference to FIG. 10.

Figure 10:
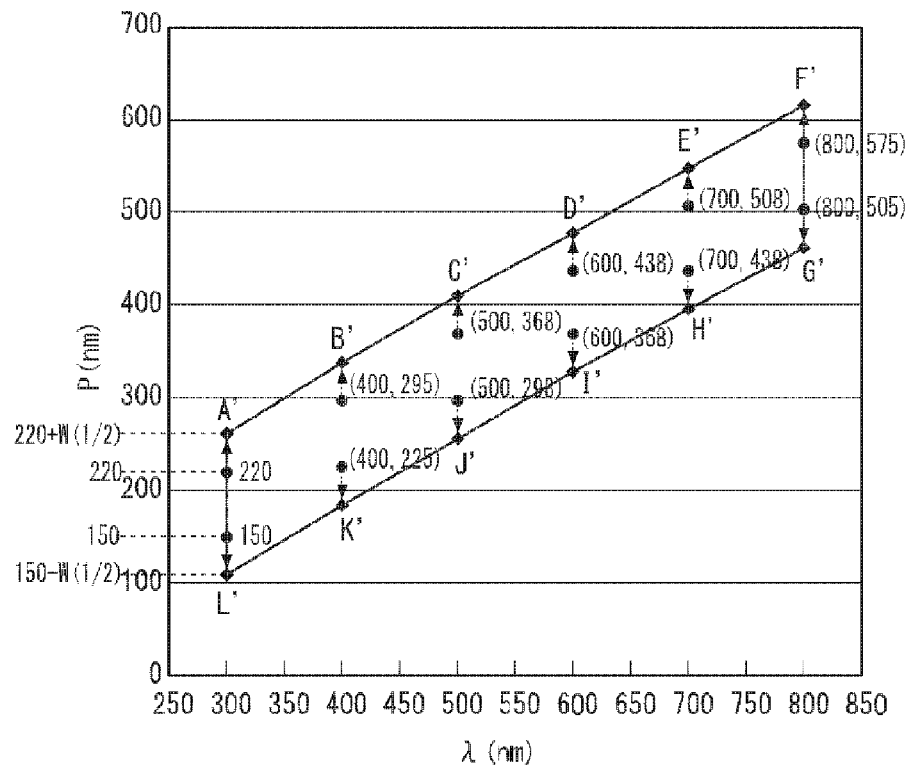
FIG. 10 is a graph in which an extraction wavelength λ (nm) of light from the organic light emitting diode is shown in the horizontal axis, and a distance p (nm) between the centers of concave portions or a distance p (nm) between the centers of convex portions in a two-dimensional lattice structure is shown in the vertical axis, and which illustrates a relationship between the extraction wavelength λ and the distance p in the fifth to eighth aspects of the invention.

FIG. 10 shows a graph in which the extraction wavelength $\lambda$ (nm) is shown in the horizontal axis, and the distance p (nm) between the centers of the concave portions is shown in the vertical axis.

As shown in FIG. 10, the coordinates A', B', C', D', E', and F' are coordinates that are obtained by shifting p of coordinates ($\lambda$, p) of (300, 220), (400, 295), (500, 368), (600, 438), (700, 508), and (800, 575) in a positive direction by W(½), respectively. The coordinates G', H', I', J', K', and L' are coordinates that are obtained by shifting the distance p of coordinates ($\lambda$, p) of (800, 505), (700, 438), (600, 368), (500, 298), (400, 225), and (300, 150) in a negative direction by W(½), respectively. When the shift width exceeds W(½), the light extraction efficiency is improved, but the effect is greatly inferior to a case where the shift width is within W(½).

The smaller the shift width is, the more preferable. It is preferable that the shift width be ⅕ W, more preferably ⅒ W, and still more preferably 0. That is, it is particularly preferable that the extraction wavelength $\lambda$ (nm) and the distance p (nm) between the centers of the concave portions 16 be within a region surrounded by straight lines sequentially connecting coordinates ($\lambda$, p) of (300, 220), (400, 295), (500, 368), (600, 438), (700, 508), (800, 575), (800, 505), (700, 438), (600, 368), (500, 298), (400, 225), and (300, 150) in a graph illustrating the relationship between the extraction wavelength and the distance.

The coordinates of 12 points of A' to L' are obtained by calculating conversion efficiency from the surface plasmon to light. In addition, practically, a significant improvement in the light extraction efficiency when the extraction wavelength and the distance are within the region surrounded by straight lines sequentially connecting the coordinates of the 12 points was confirmed with regard to a case where the extraction wavelength $\lambda$ is 470 nm in [Examples] to be described later.

In the following description, the calculation method described in the first aspect is applicable to a calculation method of conversion efficiency from the surface plasmon to light for specifying the above-described coordinates. With regard to the cathodic conductive layer 14 in the model shown in FIG. 3, the calculation may be carried out by changing silver to aluminum.

Here, the reflectance is calculated by assuming the refractive index n of the organic EL layer as 1.6, 1.7, or 1.8 and by systematically changing the distance p between the centers of the holes and depth d of the holes with respect to cases where the wavelength (corresponding to the extraction wavelength $\lambda$) of the monochromatic plane wave is 300 nm, 400 nm, 500 nm, 600 nm, 700 nm, and 800 nm.

In addition, among the above-described coordinates, coordinates at which the reflectance becomes the minimum value when the refractive index n is 1.6 include coordinates ($\lambda$, p) of (300, 220), (400, 295), (500, 368), (600, 438), (700, 508), and (800, 575), and coordinates at which the reflectance becomes the minimum value when the refractive index n is 1.8 include coordinates (λ, P) of (300, 150), (400, 225), (500, 298), (600, 368), (700, 438), and (800, 505). Coordinates at which the reflectance becomes the minimum value when the refractive index n is 1.7 are approximately intermediate values between the case where the refractive index n is 1.6 and the case where the refractive index n is 1.8.

In addition, in the case of the organic light emitting diode 210, the conversion efficiency from the surface plasmon to light, and the refractive index may be obtained in the same manner as the case where FIGS. 3A, 3B, and 4A to 4C are used in the organic light emitting diode 10.

The organic light emitting diode 210 of this aspect may be manufactured in the same manner as the organic light emitting diode 10 except that the cathodic conductive layer 214 is laminated on the organic EL layer 13.

The substrate 11 of this aspect may be manufactured in the same manner as the substrate 11 of the first aspect, and a preferred manufacturing method is the same as the preferred manufacturing method of the substrate 11 of the first aspect.

<<Organic Light Emitting Diode of Sixth Aspect>>

In the organic light emitting diode of the second aspect of the invention, at least a cathodic conductive layer formed from Al or an alloy containing 70% by mass or more of Al, an organic electroluminescence layer that includes a light emitting layer containing an organic light emitting material, and an anodic conductive layer are sequentially laminated on a substrate. A two-dimensional lattice structure, in which a plurality of concave portions are periodically and two-dimensionally ordered, is provided on a surface of the cathodic conductive layer on an organic electroluminescence layer side.

An extraction wavelength λ (nm) of light from the organic light emitting diode and a distance p (nm) between centers of the concave portions in the two-dimensional lattice structure are within a region surrounded by straight lines sequentially connecting the following coordinates A', B', C', D', E', F', G', H', I', J', K', L', and A' in a graph illustrating a relationship between the light extraction wavelength and the distance, and the depth of the concave portions is 12 nm to 180 nm.

A' (λ=300, p=220+W(½)), B' (λ=400, p=295+W(½)), C' (λ=500, p=368+W(½)), D' (λ=600, p=438+W(½)), E' (λ=700, p=508+W(½)), F' (λ=800, p=575+W(½)), G' (λ=800, p=505−W(½)), H' (λ=700, p=438−W(½)), I' (λ=600, p=368−W(½)), J' (λ=500, p=298−W(½)), K' (λ=400, p=225−W(½)), and L' (λ=300, p=150−W(½)), in which W(½) represents a half width at half maximum of a light emitting peak in a spectrum of the light emitting material that constitutes the light emitting layer.

The organic light emitting diode of this aspect is an organic light emitting diode having a layer configuration of a type generally called a top emission type. The organic light emitting diode is the same as the organic light emitting diode of the fifth aspect except that the lamination sequence of the cathodic conductive layer, the organic EL layer, and the anodic conductive layer on the substrate is reversed.

Hereinafter, the organic light emitting diode of this aspect will be described with reference to the attached drawings. In addition, in the following embodiment, the same reference numerals are given to the same parts corresponding to the configuration shown in the drawings shown previously, and a detailed description thereof will be omitted here.

FIG. 5 shows a partial schematic cross-sectional diagram illustrating a configuration of an embodiment of the organic light emitting diode of this aspect.

In the organic light emitting diode 220 of this embodiment, a cathodic conductive layer 214, an organic EL layer 13, and an anodic conductive layer 12 are sequentially laminated on a substrate 21.

The organic EL layer 13 includes an electron implantation layer 13e, an electron transport layer 13d, a light emitting layer 13c, a hole transport layer 13b, and a hole implantation layer 13a that are sequentially laminated from the side of the cathodic conductive layer 214.

A voltage may be applied to the anodic conductive layer 12 and the cathodic conductive layer 214.

In this aspect, a structure in which a plurality of concave portions 22 are periodically and two-dimensionally ordered is provided on a surface of the substrate 21 on a side at which the cathodic conductive layer 214 is laminated. When the cathodic conductive layer 214 is laminated on the structure, a structure that is the same as the surface of the substrate 21, that is, a structure (two-dimensional lattice structure) in which a plurality of concave portions 16 are periodically and two-dimensionally ordered is formed on a surface of the cathodic conductive layer 214 on an organic EL layer 13 side.

The substrate 21, the cathodic conductive layer 214, and the organic EL layer 13, and the anodic conductive layer 12 are the same as the layers described above, respectively.

The organic light emitting diode 220 of this aspect may be manufactured by the same manner as the organic light emitting diode 20 except that the cathodic conductive layer 214, the organic EL layer 13, and the anodic conductive layer 12 are sequentially laminated on the structure of the substrate 21 having a structure in which the plurality of concave portions 22 corresponding to the two-dimensional lattice structure are periodically and two-dimensionally ordered on a surface.

<<Organic Light Emitting Diode of Seventh Aspect>>

In the organic light emitting diode of the seventh aspect of the invention, at least an anodic conductive layer, an organic electroluminescence layer that includes a light emitting layer containing an organic light emitting material, and a cathodic conductive layer formed from Al or an alloy containing 70% by mass or more of Al are sequentially laminated on a substrate, and a two-dimensional lattice structure, in which a plurality of convex portions are periodically and two-dimensionally ordered, is provided on a surface of the cathodic conductive layer on an organic electroluminescence layer side.

An extraction wavelength λ (nm) of light from the organic light emitting diode and a distance p (nm) between centers of the convex portions in the two-dimensional lattice structure are within a region surrounded by straight lines sequentially connecting the following coordinates A', B', C', D', E', F', G', H', I', J', K', L', and A' in a graph illustrating a relationship between the light extraction wavelength and the distance, and the height of the convex portions is 12 nm to 180 nm.

A' (λ=300, p=220+W(½)), B' (λ=400, p=295+W(½)), C' (λ=500, p=368+W(½)), D' (λ=600, p=438+W(½)), E' (λ=700, p=508+W(½)), F' (λ=800, p=575+W(½)), G' (λ=800, p=505−W(½)), H' (λ=700, p=438−W(½)), I' (λ=600, p=368−W(½)), J' (λ=500, p=298−W(½)), K' (λ=400, p=225−W(½)), and L' (λ=300, p=150−W(½)), in which W(½) represents a half width at half maximum of a light emitting peak in a spectrum of the light emitting material that constitutes the light emitting layer.

The organic light emitting diode of this aspect is an organic light emitting diode having a layer configuration of a type generally called a bottom emission type. The organic light emitting diode is the same as the organic light emitting diode of the fifth aspect except that the convex portions of the substrate of the organic light emitting diode of the fifth aspect are changed to concave portions, and the concave portions on the surface of the cathodic conductive layer on the organic EL layer side are changed to convex portions.

Hereinafter, the organic light emitting diode of this aspect will be described with reference to the attached drawings. In addition, in the following embodiment, the same reference numerals are given to the same parts corresponding to the configuration shown in the drawings shown previously, and a detailed description thereof will be omitted here.

FIG. 8 shows a partial schematic cross-sectional diagram illustrating a configuration of an embodiment of the organic light emitting diode of this aspect.

In the organic light emitting diode 310 of this embodiment, an anodic conductive layer 12, an organic EL layer 13, and a cathodic conductive layer 214 are sequentially laminated on a substrate 111.

The organic EL layer 13 includes a hole implantation layer 13a, a hole transport layer 13b, a light emitting layer 13c, an electron transport layer 13d, and an electron implantation layer 13e that are sequentially laminated from the side of the anodic conductive layer 12.

A voltage may be applied to the anodic conductive layer 12 and the cathodic conductive layer 214.

In this aspect, a structure in which a plurality of concave portions 22 are periodically and two-dimensionally ordered is provided on a surface of the substrate 111 on a side at which the anodic conductive layer 12 is laminated. When the anodic conductive layer 12, the organic EL layer 13 (the hole implantation layer 13a, the hole transport layer 13b, the light emitting layer 13c, the electron transport layer 13d, and the electron implantation layer 13e) are sequentially laminated on the structure, the same structure as the surface of the substrate 111 is formed on surfaces of the respective layers on a cathodic conductive layer 214 side. Accordingly, when the cathodic conductive layer 214 is finally laminated on the organic EL layer 13, a structure inverted from the structure of the surface of the substrate 111, that is, a two-dimensional lattice structure, in which a plurality of convex portions 116 are periodically and two-dimensionally ordered, is formed on a surface of the cathodic conductive layer 214 on an organic EL layer 13 side.

The substrate 111, the cathodic conductive layer 214, the organic EL layer 13, and the anodic conductive layer 12 are the same as the layers described above, respectively.

The organic light emitting diode 310 of this aspect may be manufactured by the same manner as the organic light emitting diode 210 except that the anodic conductive layer 12 is laminated on the structure of the substrate 111 having a structure in which the plurality of concave portions 22 corresponding to the two-dimensional lattice structure are periodically and two-dimensionally ordered on a surface.

The substrate 111 may be manufactured in the same manner as the substrate 21 of the second aspect, and a preferred manufacturing method is the same as the preferred manufacturing method of the substrate 21.

<<Organic Light Emitting Diode of Eighth Aspect>>

In the organic light emitting diode of the eighth aspect of the invention, at least a cathodic conductive layer formed from Al or an alloy containing 70% by mass or more of Al, an organic electroluminescence layer that includes a light emitting layer containing an organic light emitting material, and an anodic conductive layer are sequentially laminated on a substrate, and a two-dimensional lattice structure, in which a plurality of convex portions are periodically and two-dimensionally ordered, is provided on a surface of the cathodic conductive layer on an organic electroluminescence layer side.

An extraction wavelength λ (nm) of light from the organic light emitting diode and a distance p (nm) between centers of the convex portions in the two-dimensional lattice structure are within a region surrounded by straight lines sequentially connecting the following coordinates A', B', C', D', E', F', G', H', I', J', K', L', and A' in a graph illustrating a relationship between the light extraction wavelength and the distance, and the height of the convex portions is 12 nm to 180 nm.

A' (λ=300, p=220+W(½)), B' (λ=400, p=295+W(½)), C' (λ=500, p=368+W(½)), D' (λ=600, p=438+W(½)), E' (λ=700, p=508+W(½)), F' (λ=800, p=575+W(½)), G' (λ=800, p=505−W(½)), H' (λ=700, p=438−W(½)), I' (λ=600, p=368−W(½)), J' (λ=500, p=298−W(½)), K' (λ=400, p=225−W(½)), and L' (λ=300, p=150−W(½)), in which W(½) represents a half width at half maximum of a light emitting peak in a spectrum of the light emitting material that constitutes the light emitting layer.

The organic light emitting diode of this aspect is an organic light emitting diode having a layer configuration of a type generally called a top emission type. The organic light emitting diode is the same as the organic light emitting diode of the sixth aspect except that the concave portions of the substrate of the organic light emitting diode of the sixth aspect are changed to convex portions, and the convex portions on the surface of the cathodic conductive layer on the organic EL layer side are changed to concave portions.

Hereinafter, the organic light emitting diode of this aspect will be described with reference to the attached drawings. In addition, in the following embodiment, the same reference numerals are given to the same parts corresponding to the configuration shown in the drawings shown previously, and a detailed description thereof will be omitted here.

FIG. 9 shows a partial schematic cross-sectional diagram illustrating a configuration of an embodiment of the organic light emitting diode of this aspect.

In the organic light emitting diode 320 of this embodiment, a cathodic conductive layer 214, an organic EL layer 13, and an anodic conductive layer 12 are sequentially laminated on a substrate 121.

The organic EL layer 13 includes an electron implantation layer 13e, an electron transport layer 13d, a light emitting layer 13c, a hole transport layer 13b, and a hole implantation layer 13a that are sequentially laminated from the side of the cathodic conductive layer 214.

A voltage may be applied to the anodic conductive layer 12 and the cathodic conductive layer 214.

In this aspect, a structure in which a plurality of convex portions 15 are periodically and two-dimensionally ordered is provided on a surface of the substrate 121 on a side at which the cathodic conductive layer 214 is laminated. When the cathodic conductive layer 214 is laminated on the structure, a structure that is the same as the surface of the substrate 121, that is, a structure (two-dimensional lattice structure) in which a plurality of convex portions 116 are periodically and two-dimensionally ordered is formed on a surface of the cathodic conductive layer 214 on an organic EL layer 13 side.

The substrate 121, the cathodic conductive layer 214, the organic EL layer 13, and the anodic conductive layer 12 are the same as the layers described above, respectively.

The organic light emitting diode 320 of this aspect may be manufactured by the same manner as the organic light emitting diode 220 except that the cathodic conductive layer 214 is laminated on the structure of the substrate 121 having a structure in which the plurality of convex portions 15 corresponding to the two-dimensional lattice structure are periodically and two-dimensionally ordered on a surface.

The substrate 121 may be manufactured in the same manner as the substrate 11 of the first aspect, and a preferred manufacturing method is the same as the preferred manufacturing method of the substrate 11.

As described above, in the organic light emitting diodes of the first to eighth aspects of the invention, the light extraction efficiency is significantly improved, and thus high-intensity light emission may be obtained.

In addition, in a case where the two-dimensional lattice structure is a square lattice, it is preferable to make a correction by multiplying coordinate values of the distance p (nm) between the centers of the concave portions or the distance p (nm) between the centers of the convex portions by ($\sqrt{3}/2$). In addition, in an organic light emitting diode of this aspect, the light extraction efficiency is also significantly improved, and high-intensity light emission may be obtained.

Accordingly, the organic light emitting diodes of the invention are useful in an image display device, an illuminating device, and the like. A low-voltage operation is possible, and thus lifetime of the organic EL element may be significantly increased, and thus saving of energy is realized. Furthermore, the light extraction efficiency is high, and thus a bright image display device or illuminating device may be obtained.

EXAMPLES

Hereinafter, an example of the embodiments of the invention will be described. The structure, configuration, and type of the organic light emitting diode that is an object is not necessarily limited as long as the concept of the invention is used.

Example 1

An aqueous dispersion (dispersed solution) of spherical colloidal silica of 5.0% by mass in which an average particle size is 395.0 nm, and a variation coefficient of a particle size is 4.0% was prepared. In addition, the average particle size and the variation coefficient of the particle size were obtained from a peak obtained by fitting a particle size distribution, which was obtained by a particle dynamic scattering method using Zetasizer Nano-ZS manufactured by Malvern Instruments Ltd., to a Gauss curve.

Next, the dispersed solution was filtered by a membrane filter having a hole diameter of 1.2 μmϕ, an aqueous hydrolysis solution of phenyltriethoxysilane having a concentration of 1.0% by mass was added to the dispersed solution passed through the membrane filter, and reaction was carried out at approximately 40° C. for 3 hours. At this time, the dispersion solution and the aqueous hydrolysis solution were mixed in such a manner that the mass of the phenyltriethoxysilane was 0.015 times the mass of the colloidal silica particles.

Next, methyl isobutyl ketone having a volume 5 times a volume of the dispersed solution was added to the dispersed solution obtained after completion of the reaction, the resultant mixture was sufficiently stirred, and oil-phase extraction of the colloidal silica that was hydrophobized was carried out.

The hydrophobized colloidal silica dispersed solution having a concentration of 1.05% by mass, which was obtained in this manner, was added dropwise at a dropwise addition rate of 0.01 mL/second to a liquid surface (water was used as the lower-layer water, and the water temperature was 26.5° C.) in a water tank (LB trough apparatus) provided with a surface-pressure sensor that measures a surface pressure of the particle mono-layer film, and a movable barrier that compresses the particle mono-layer film in a direction along the liquid surface. In addition, a quartz substrate (30 mm×30 mm×1.0 mm, both surfaces were mirror-polished) to be used as a transparent substrate of the organic light emitting diode was immersed in advance in the lower-layer water of the water tank in an approximately vertical direction.

Then, in the lower-layer water, ultrasonic waves (an output of 100 W, a frequency of 1,500 kHz) were emitted toward the water surface for 10 minutes to vaporize the methyl isobutyl ketone that is a solvent of the dispersed solution while promoting two-dimensional close packing of the particles, whereby a particle mono-layer film was formed.

Next, the particle mono-layer film was compressed by the movable barrier until a diffusion pressure became 22 to 30 mNm$^{-1}$, and the quartz substrate was pulled at a velocity of 3 mm/minute to move the particle mono-layer film on the water surface onto a surface of the substrate.

Next, a hydrolysis solution of monomethyltrimethoxysilane of 0.15% by mass as a binder was allowed to infiltrate into the quartz substrate on which the particle mono-layer film was formed, and then the surplus of the hydrolysis solution was removed by treatment of a spin coater (3,000 rpm) for 1 minute. Then, the substrate was heated at 100° C. for 10 minutes to carry out the reaction of the binder, whereby a quart substrate to which the particle mono-layer film formed from the colloidal silica was attached was obtained.

Next, the obtained quartz substrate to which the particle mono-layer film was attached was subjected to dry etching by a CHF$_3$ gas. With regard to conditions of the dry etching, the antenna power was set to 1,500 W, the bias power was set to 50 to 300 W (13.56 MHz), and the gas flow rate was set to 50 to 200 sccm.

Figure 6:
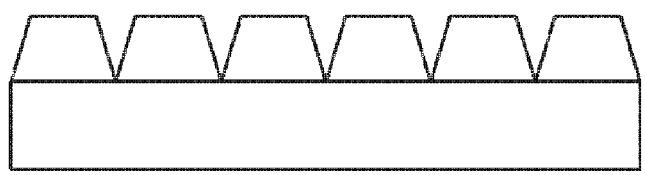
FIG. 6 is a side view of a substrate that is prepared in Example 1.

After the dry etching, a surface of the substrate that was obtained was observed by an atomic force microscope (AFM), and it could be seen that a microstructure, in which convex portions having a truncated conical cross-sectional shape as shown in FIG. 6 were disposed in a triangular lattice shape, was formed.

The distance p' (lattice constant) between the centers of the convex portions in the microstructure formed in the substrate surface as described above was measured by a laser diffraction method, and after performing a test three times, an average value was 395.0 nm. In addition, with regard to an average height h of the convex portions in the microstructure, an average value was obtained in each of total 25 sites of regions of 5 μm×5 μm randomly selected from an AFM image, and the respective average values of the 25 sites were further averaged. Form the calculation, the average height h was 30.9 nm. In addition, a deviation D' in arrangement was 4.9%. In addition, the ratio between the average height h and the average value of the distance P' between the centers (the distance p' between the centers/the average height h) that was calculated from the obtained values was 0.078.

IZO as an anodic conductive layer was formed on the quartz substrate on a microstructure surface side in a thickness of 50 nm by a sputtering method. Next, as a hole implantation material, 4,4',4''-tris(N,N-2-naphthylphenylamino)triphenylamine(2-TNATA) was formed in a thickness of 30 nm according to a deposition method. Next, as a hole transport material, 4,4'-bis[N-1-napthyl]-N-phenyl-amino]-biphenyl(α-NPD) was formed in a thickness of 70 nm according to a deposition method. Next, as an electron transport and light emitting layer, a material obtained by doping a host material (PH1) with Tris[1-phenylisoquinoline-C2,N] iridium (III) (Ir(piq)$_3$) in a concentration of 5% was formed in a thickness of 30 nm according to a deposition method. Next, as an electron transport layer, Tris(8-quinolinolato)aluminum (Alq) was formed in a thickness of 30 nm according to a deposition method. Finally, as a cathodic conductive layer, a magnesium/silver alloy of Mg/Ag=10/90 (mass ratio) was formed at a thickness of 150 nm according to a deposition method, whereby a bottom emission type organic light emitting diode was completed. A light emitting area of 2×2 mm was prepared using a shadow mask in the deposition.

Example 2

A bottom emission type organic light emitting diode, which was prepared by the same operation as Example 1 except that dry etching conditions were changed, was obtained.

At this time, the distance between the centers of convex portions of the microstructure formed on the surface of the quartz substrate was 395.0 nm, and the average height of the convex portions was 100 nm.

Comparative Example 1

A bottom emission type organic light emitting diode was obtained by the same operation as Example 1 except that the microstructure was not formed on the surface of the quartz substrate. Accordingly, the substrate surface of this element was flat.

Comparative Example 2

A bottom emission type organic light emitting diode, which was prepared by the same operation as Example 1 except that the average particle size of the spherical colloidal silica was changed, was obtained.

At this time, the distance between the centers of convex portions of the microstructure formed on the surface of the quartz substrate was 306.9 nm, and the average height of the convex portions was 30.9 nm. In addition, the deviation D' was 11.01%.

Comparative Example 3

A bottom emission type organic light emitting diode, which was prepared by the same operation as Example 1 except that the dry etching conditions were changed, was obtained.

At this time, the distance between the centers of convex portions of the microstructure formed on the surface of the quartz substrate was 395.0 nm, and the average height of the convex portions was 10.2 nm. In addition, the deviation D' in arrangement was 4.9%.

Comparative Example 4

A bottom emission type organic light emitting diode, which was prepared by the same operation as Example 1 except that the dry etching conditions were changed, was obtained.

At this time, the distance between the centers of convex portions of the microstructure formed on the surface of the quartz substrate was 395.0 nm, and the average height of the convex portions was 192.0 nm.

Test Example 1

Figure 7:
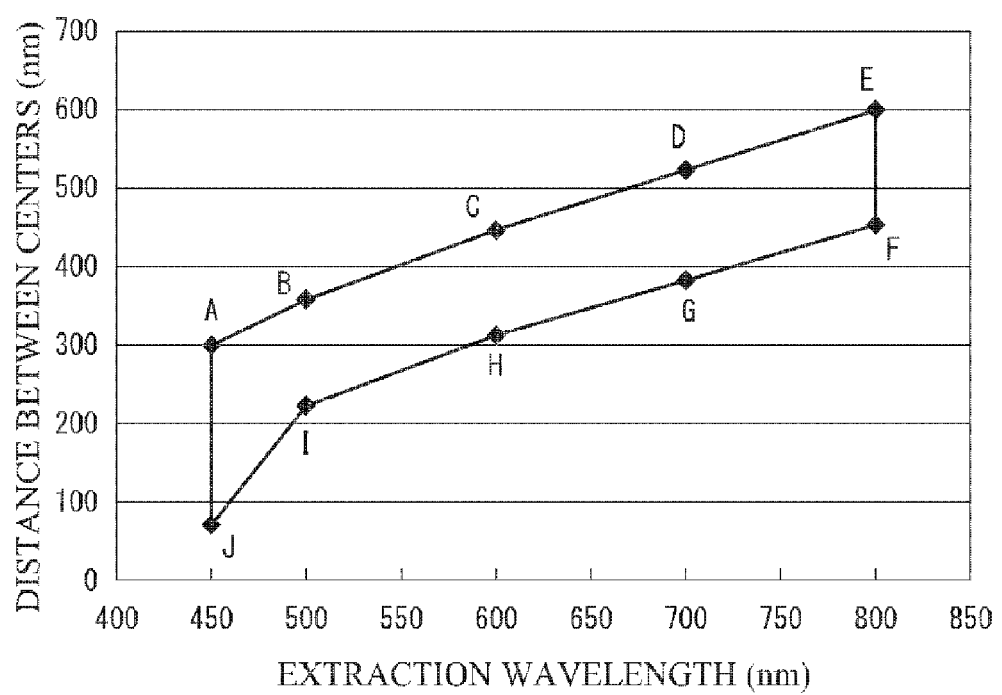
FIG. 7 is a graph that is created in Test Example 1.

1. Preparation of Graph Illustrating Relationship Between Extraction Wavelength λ (nm) and Distance p (nm) Between Centers of Concave Portions in Two-Dimensional Lattice Structure in Surface of Cathodic Conductive Layer With respect to the bottom emission type organic light emitting diodes obtained in Examples 1 and 2, and Comparative Examples 1 to 4, a half width at half maximum W(½) of a peak in an emission spectrum of a light emitting material (material obtained by doping PH1 with Ir(piq)$_3$ in a concentration of 5%) constituting the light emitting layer was obtained by drawing on peaks, and W(½) was 40 nm. Coordinates A to J in a case where W(½) was 40 nm are shown in FIG. 7.

In addition, the extraction wavelength in the configurations of the bottom emission type organic light emitting diodes obtained in Examples 1 and 2, and Comparative Examples 1 to 4 was obtained by waveform separation of the emission spectrum, and the extraction wavelength was 625 nm.

Accordingly, a range of the distance p between the centers of the concave portions within a region surrounded by the coordinates A to J corresponding to the extraction wavelength of 625 nm was 335 nm to 467 nm.

In the bottom emission type organic light emitting diodes obtained in Examples 1 and 2, and Comparative Examples 1 to 4, the distance between the centers of the convex portions and the average height in the microstructure formed on the surface of the quartz substrate are equal to the distance between the centers of the concave portions and the average depth in the two-dimensional periodic structure formed on a surface of the cathodic conductive layer, which is laminated on the microstructure, on an electron transport layer side.

Accordingly, the bottom emission type organic light emitting diode of Example 1, in which the distance between the centers of the concave portions is 395.0 nm that is within a range of 335 nm to 467 nm, and the depth of the concave portions is 30.9 nm, is within a range of the invention. In addition, the bottom emission type organic light emitting diode of Example 2, in which the distance between the centers of the concave portions is 395.0 nm similar to Example 1, and the depth of the concave portions is 100 nm, is within the range of the invention. On the other hand, since the distance between the centers of the concave portions is 306.9 nm, the bottom emission type organic light emitting diode of Comparative Example 2 is out of the range of the invention. Since the depth of the concave portions is 10.2 nm, the bottom emission type organic light emitting diode of Comparative Example 3 is out of the range of the invention. Since the depth of the concave portions is 192.0 nm, the bottom emission type organic light emitting diode of Comparative Example 4 is out of the range of the invention.

2. Evaluation of Luminous Efficiency Characteristics and Luminance Characteristics With respect to each of the bottom emission type organic light emitting diodes obtained in Examples 1 and 2, and Comparative Examples 1 to 4, the luminous efficiency characteristics and luminance characteristics were evaluated in the following order.

When the bottom emission type organic light emitting diodes were caused to emit light with a current density of 30 mA/cm$^2$, the luminance (cd/m$^2$) in a vertical direction was measured by a luminance meter, and the luminance characteristics per current density (current density (mA/cm$^2$)–luminance (cd/m$^2$)) were obtained. In addition, the voltage was measured during the measurement of the luminance. The luminance was converted into a luminous flux (lm), and the luminous efficiency per current density (current density (mA/cm$^2$)–luminous efficiency (lm/W)) was obtained.

With respect to each of the luminous efficiency per current density and the luminance, from the measurement results, a progress rate of measurement values of Example 1 against measurement values of Comparative Example 1 was calculated by the following expression. With respect to Example 2, and Comparative Examples 2 to 4, a progress rate of measurement values thereof against the measurement values of Comparative Example 1 was also calculated. The results are shown in Table 1.

Progress Rate=(measurement values of Example 1−measurement values of Comparative Example 1)/measurement values of Comparative Example 1×100

Comparative Example 5

A bottom emission type organic light emitting diode was obtained by the same operation as Example 3 except that the microstructure was not formed on the surface of the quartz substrate. Accordingly, the substrate surface of this element was flat.

Comparative Example 6

A bottom emission type organic light emitting diode, which was prepared by the same operation as Example 3 except that the average particle size of the spherical colloidal silica was changed, was obtained.

At this time, the distance between the centers of the convex portions of the microstructure formed on the surface of the quartz substrate was 500.0 nm, and the average height of the convex portions was 70 nm.

TABLE 1

|  | Microstructure of substrate surface | | Evaluation of characteristics | | | |
| --- | --- | --- | --- | --- | --- | --- |
|  | | | Luminous efficiency | | Luminance | |
|  | Distance between centers [nm] | Height (or depth) [nm] | Measurement value [lm/W] | Against comparative example [%] | Measurement value [cd/cm$^2$] | Against comparative example [%] |
| Example 1 | 395.0 | 30.9 | 2.88 | +113.3 | 3991 | +103.2 |
| Example 2 | 395.0 | 100 | 3.08 | +128.1 | 3339 | +70.0 |
| Comparative Example 1 | — | — | 1.35 | — | 1964 | — |
| Comparative Example 2 | 306.9 | 30.9 | 1.42 | +5.2 | 1995 | +1.6 |
| Comparative Example 3 | 395.0 | 10.2 | 1.47 | +8.9 | 2244 | +14.3 |
| Comparative Example 4 | 395.0 | 192.0 | 1.6 | +18.5 | 1984 | +1.0 |

* Current density: 30.0 mA/cm$^2$

As shown in the results, in the bottom emission type organic light emitting diodes of Examples 1 and 2, emission intensity greatly increased compared to Comparative Examples 1 to 4. Furthermore, current density—luminous efficiency characteristics, and current density—luminance characteristics were greatly improved.

Example 3

A bottom emission type organic light emitting diode was obtained by the same operation as Example 1 except that the substrate was prepared by changing the average particle size of the spherical colloidal silica and the dry etching conditions, and as a light emitting material, a material obtained by doping the host material (Alq$_3$) with Rubrene in a concentration of 1% was used.

At this time, the distance between the centers of the convex portions of the microstructure formed on the surface of the quartz substrate was 350.0 nm, and the average height of the convex portions was 70 nm.

Test Example 2

1. Preparation of Graph Illustrating Relationship Between Extraction Wavelength λ (nm) and Distance p (nm) between Centers of Concave Portions in Two-Dimensional Lattice Structure in Surface of Cathodic Conductive Layer With respect to the bottom emission type organic light emitting diodes obtained in Example 3, and Comparative Examples 5 and 6, a half width at half maximum W(½) of a peak in an emission spectrum of a light emitting material (material obtained by doping the host material (Alq$_3$) with Rubrene in a concentration of 1%) constituting the light emitting layer was obtained by drawing on peaks, and W(½) was 40 nm. Coordinates A to J in a case where W(½) was 40 nm are shown in FIG. 7.

In addition, the extraction wavelength in the configurations of the bottom emission type organic light emitting diodes obtained in Example 3, and Comparative Examples 5 and 6 was obtained by waveform separation of the emission spectrum, and the extraction wavelength was 565 nm.

Accordingly, a range of the distance p between the centers of the concave portions within a region surrounded by the coordinates A to J corresponding to the extraction wavelength of 565 nm was 280 nm to 416 nm.

In the bottom emission type organic light emitting diodes obtained in Example 3, and Comparative Examples 5 and 6, the distance between the centers of the convex portions and the average height in the microstructure formed on the surface of the quartz substrate are equal to the distance between the centers of the concave portions and the average depth in the two-dimensional periodic structure formed on a surface of the cathodic conductive layer, which is laminated on the microstructure, on an electron transport layer side.

Accordingly, the bottom emission type organic light emitting diode of Example 3, in which the distance between the centers of the concave portions is 350.0 nm that is within a range of 280 nm to 416 nm, and the depth of the concave portions is 70 nm, is within a range of the invention. On the other hand, since the distance between the centers of the concave portions is 500.0 nm, the bottom emission type organic light emitting diode of Comparative Example 6 is out of the range of the invention.

2. Evaluation of Luminous Efficiency Characteristics and Luminance Characteristics With respect to each of the bottom emission type organic light emitting diodes obtained in Example 3, and Comparative Examples 5 and 6, the luminous efficiency characteristics and luminance characteristics were evaluated in the same manner as Test Example 1.

In addition, a progress rate of measurement values of Example 3 against measurement values of Comparative Example 5 was calculated in the same manner as Test Example 1. Similarly, with respect to the Comparative Example 6, a progress rate of measurement values thereof against the measurement values of Comparative Example 5 was also calculated. The results are shown in Table 2.

of the spherical colloidal silica and the dry etching conditions, a material obtained by doping KLHS-04 with FIlpic in a concentration of 8% was used as a light emitting material, and the cathodic conductive layer was formed with Al.

At this time, the distance between the centers of the convex portions of the microstructure formed on the surface of the quartz substrate was 300.0 nm, and the average height of the convex portions was 31.2 nm.

Comparative Example 7

A bottom emission type organic light emitting diode was obtained by the same operation as Example 4 except that the microstructure was not formed on the surface of the quartz substrate. Accordingly, the substrate surface of this element was flat.

Comparative Example 8

A bottom emission type organic light emitting diode, which was prepared by the same operation as Example 4 except that the average particle size of the spherical colloidal silica and the dry etching conditions were changed, was obtained.

At this time, the distance between the centers of convex portions of the microstructure formed on the surface of the quartz substrate was 395.0 nm, and the average height of the convex portions was 30.2 nm.

TABLE 2

| | Microstructure of substrate surface | | Evaluation of characteristics | | | |
|---|---|---|---|---|---|---|
| | | | Luminous efficiency | | Luminance | |
| | Distance between centers [nm] | Height (or depth) [nm] | Measurement value [lm/W] | Against comparative example [%] | Measurement value [cd/cm$^2$] | Against comparative example [%] |
| Example 3 | 350.0 | 70 | 6.13 | +156.5 | 1270 | +179.7 |
| Comparative Example 5 | — | — | 2.39 | — | 454 | — |
| Comparative Example 6 | 500.0 | 70 | 2.86 | +19.7 | 463 | +2.0 |

* Current density: 7.0 mA/cm$^2$

As shown in the results, in the bottom emission type organic light emitting diodes of Example 3, emission intensity greatly increased compared to Comparative Examples 5 and 6. Furthermore, current density—luminous efficiency characteristics, and current density—luminance characteristics were greatly improved.

Example 4

A bottom emission type organic light emitting diode was obtained by the same operation as Example 1 except that the substrate was prepared by changing the average particle size Test Example 3

Figure 11:
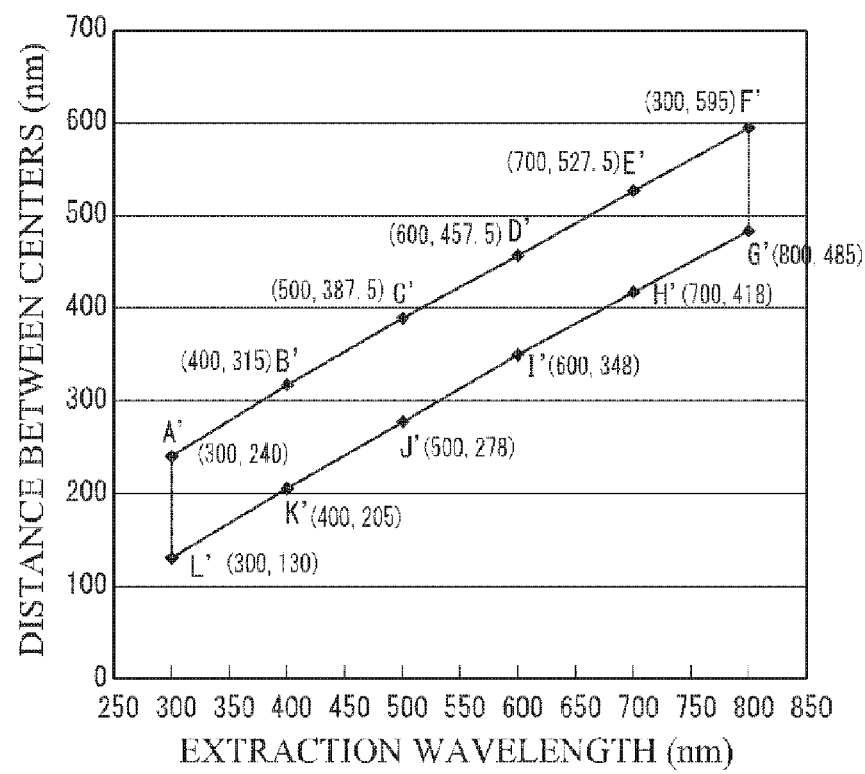
FIG. 11 is a graph that is created in Test Example 3.

1. Preparation of Graph Illustrating Relationship Between Extraction Wavelength λ (Nm) and Distance p (Nm) Between Centers of Concave Portions or Convex Portions in Two-Dimensional Lattice Structure in Surface of Cathodic Conductive Layer With respect to the bottom emission type organic light emitting diodes obtained in Example 4, and Comparative Examples 7 and 8, a half width at half maximum W(½) of a peak in an emission spectrum of a light emitting material (material obtained by doping KLHS-04 with FIlipic in a concentration of 8%) constituting the light emitting layer was obtained by drawing on peaks, and W(½) was 20 nm. Coordinates A' to L' in a case where W(½) was 20 nm are shown in FIG. 11.

In addition, the extraction wavelength in the configurations of the bottom emission type organic light emitting diodes obtained in Example 4, and Comparative Examples 7 and 8 was obtained by waveform separation of the emission spectrum, and the extraction wavelength was 470 nm.

Accordingly, a range of the distance p between the centers of the concave portions within a region surrounded by the coordinates A' to L' corresponding to the extraction wavelength of 470 nm was 256 nm to 366 nm.

In the bottom emission type organic light emitting diodes obtained in Example 4, and Comparative Examples 7 and 8, the distance between the centers of the convex portions and the average height in the microstructure formed on the surface of the quartz substrate are equal to the distance between the centers of the concave portions and the average depth in the two-dimensional periodic structure formed on a surface of the cathodic conductive layer, which is laminated on the microstructure, on an electron transport layer side.

Accordingly, the bottom emission type organic light emitting diode of Example 4, in which the distance between the centers of the concave portions is 300.0 nm that is within a range of 256 nm to 366 nm, and the depth of the concave portions is 31.2 nm, is within a range of the invention. On the other hand, since the distance between the centers of the concave portions is 395.0 nm, the bottom emission type organic light emitting diode of Comparative Example 8 is out of the range of the invention.

2. Evaluation of Luminous Efficiency Characteristics and Luminance Characteristics With respect to each of the bottom emission type organic light emitting diodes obtained in Example 4, and Comparative Examples 7 and 8, the luminous efficiency characteristics and luminance characteristics were evaluated in the same manner as Test Example 1.

In addition, a progress rate of measurement values of Example 4 against measurement values of Comparative Example 7 was calculated in the same manner as Test Example 1. Similarly, with respect to the Comparative Example 8, a progress rate of measurement values thereof against the measurement values of Comparative Example 7 was also calculated. The results are shown in Table 3.

TABLE 3

| | Microstructure of substrate surface | | Evaluation of characteristics | | | |
|---|---|---|---|---|---|---|
| | | | Luminous efficiency | | Luminance | |
| | Distance between centers [nm] | Height (or depth) [nm] | Measurement value [lm/W] | Against comparative example [%] | Measurement value [cd/m$^2$] | Against comparative example [%] |
| Example 4 | 300.0 | 31.2 | 5.92 | +166.7 | 3042 | +176.0 |
| Comparative Example 7 | — | — | 2.22 | — | 1102 | — |
| Comparative Example 8 | 395.0 | 30.2 | 2.44 | +9.9 | 1157 | +5.0 |

* Current density: 11.0 mA/cm$^2$

As shown in the results, in the bottom emission type organic light emitting diode of Example 4, emission intensity greatly increased compared to Comparative Examples 7 and 8. Furthermore, current density—luminous efficiency characteristics, and current density—luminance characteristics were greatly improved.

INDUSTRIAL APPLICABILITY

The organic light emitting diode of the invention is excellent in light extraction efficiency, and thus may be appropriately used in an image display device and an illuminating device that are provided with the organic light emitting diode.

DESCRIPTION OF THE REFERENCE SYMBOLS 10, 110, 210, 310: Organic light emitting diode (bottom emission type)
11, 111: Substrate
12: Anodic conductive layer
13: Organic EL layer
13a: Hole implantation layer
13b: Hole transport layer
13c: Light emitting layer
13d: Electron transport layer
13e: Electron implantation layer
14, 214: Cathodic conductive layer
15, 116: Convex portion
16: Concave portion
20, 120, 220, 320: Organic light emitting diode (top emission type)
21, 121: Substrate
22: Concave portion

The invention claimed is:

1. An organic light emitting diode selected from the group consisting of:
(a) an organic light emitting diode in which at least an anodic conductive layer formed from a transparent conductor, an organic electroluminescence layer that includes a light emitting layer containing an organic light emitting material, and a cathodic conductive layer formed from Al or an alloy containing 70% by mass or more of Al are sequentially laminated on a transparent substrate, and a lattice structure, in which a plurality of concave portions are periodically and two-dimensionally arranged, wherein the concave portions are provided to the cathodic conductive layer at an interface between the cathodic conductive layer and the organic electroluminescence layer, wherein the lattice structure is a triangular lattice structure;

wherein an extraction wavelength λ (nm) of light from the organic light emitting diode and a distance p (nm) between centers of the concave portions in the lattice structure are within a polygonal-shaped region defined by straight lines sequentially connecting the following coordinates A', B', C', D', E', F', G', H', I', J', K', L', and A' in a graph illustrating a relationship between the light extraction wavelength and the distance p (nm) between centers of the concave portions in the lattice structure, wherein A' (λ=300, p=220), B' (λ=400, p=295), C' (λ=500, p=368), D' (λ=600, p=438), E' (λ=700, p=508), F' (λ=800, p=575), G' (λ=800, p=505), H' (λ=700, p=438), I' (λ=600, p=368), J' (λ=500, p=298), K' (λ=400, p=225), and L' (λ=300, p=150); and a depth of the concave portions is 12 nm to 180 nm,
wherein the relationship between the extraction wavelength and distance between adjacent centers of the concave portions in the lattice structure and a depth of corresponding concave portions in the lattice structure combine to enhance luminous efficiency;

(b) an organic light emitting diode in which at least a cathodic conductive layer formed from Al or an alloy containing 70% by mass or more of Al, an organic electroluminescence layer that includes a light emitting layer containing an organic light emitting material, and an anodic conductive layer formed from a transparent conductor are sequentially laminated on a substrate, and a lattice structure, in which a plurality of concave portions are periodically and two-dimensionally arranged, wherein the concave portions are provided to the cathodic conductive layer at an interface between the cathodic conductive layer and the organic electroluminescence layer, wherein the lattice structure is a triangular lattice structure;

wherein an extraction wavelength λ (nm) of light from the organic light emitting diode and a distance p (nm) between centers of the concave portions in the lattice structure are within a polygonal-shaped region defined by straight lines sequentially connecting the following coordinates A', B', C', D', E', F', G', H', I', J', K', L', and A' in a graph illustrating a relationship between the light extraction wavelength and the distance p (nm) between centers of the concave portions in the lattice structure, wherein A' (λ=300, p=220), B' (λ=400, p=295), C' (λ=500, p=368), D' (λ=600, p=438), E' (λ=700, p=508), F' (λ=800, p=575), G' (λ=800, p=505), H' (λ=700, p=438), I' (λ=600, p=368), J' (λ=500, p=298), K' (λ=400, p=225), and L' (λ=300, p=150); and a depth of the concave portions is 12 nm to 180 nm,
wherein the relationship between the extraction wavelength and distance between adjacent centers of the concave portions in the lattice structure and a depth of corresponding concave portions in the lattice structure combine to enhance luminous efficiency;

(c) an organic light emitting diode in which at least an anodic conductive layer formed from a transparent conductor, an organic electroluminescence layer that includes a light emitting layer containing an organic light emitting material, and a cathodic conductive layer formed from Al or an alloy containing 70% by mass or more of Al are sequentially laminated on a transparent substrate, and a lattice structure, in which a plurality of convex portions are periodically and two-dimensionally arranged, wherein the convex portions are provided to the cathodic conductive layer at an interface between the cathodic conductive layer and the organic electroluminescence layer, wherein the lattice structure is a triangular lattice structure;

wherein an extraction wavelength λ (nm) of light from the organic light emitting diode and a distance p (nm) between centers of the convex portions in the lattice structure are within a polygonal-shaped region defined by straight lines sequentially connecting the following coordinates A', B', C', D', E', F', G', H', I', J', K', L', and A' in a graph illustrating a relationship between the light extraction wavelength and the distance p (nm) between centers of the convex portions in the lattice structure, wherein A' (λ=300, p=220), B' (λ=400, p=295), C' (λ=500, p=368), D' (λ=600, p=438), E' (λ=700, p=508), F' (λ=800, p=575), G' (λ=800, p=505), H' (λ=700, p=438), I' (λ=600, p=368), J' (λ=500, p=298), K' (λ=400, p=225), and L' (λ=300, p=150); and a height of the convex portions is 12 nm to 180 nm,
wherein the relationship between the extraction wavelength and distance between adjacent centers of the convex portions in the lattice structure and a height of corresponding convex portions in the lattice structure combine to enhance luminous efficiency;

(d) an organic light emitting diode in which at least a cathodic conductive layer formed from Al or an alloy containing 70% by mass or more of Al, an organic electroluminescence layer that includes a light emitting layer containing an organic light emitting material, and an anodic conductive layer formed from a transparent conductor are sequentially laminated on a substrate, and a lattice structure, in which a plurality of convex portions are periodically and two-dimensionally arranged, wherein the convex portions are provided to the cathodic conductive layer at an interface between the cathodic conductive layer and the organic electroluminescence layer, wherein the lattice structure is a triangular lattice structure;

wherein an extraction wavelength λ (nm) of light from the organic light emitting diode and a distance p (nm) between centers of the convex portions in the lattice structure are within a polygonal-shaped region defined by straight lines sequentially connecting the following coordinates A', B', C', D', E', F', G', H', I', J', K', L', and A' in a graph illustrating a relationship between the light extraction wavelength and the distance p (nm) between centers of the convex portions in the lattice structure, wherein A' (λ=300, p=220), B' (λ=400, p=295), C' (λ=500, p=368), D' (λ=600, p=438), E' (λ=700, p=508), F' (λ=800, p=575), G' (λ=800, p=505), H' (λ=700, p=438), I' (λ=600, p=368), J' (λ=500, p=298), K' (λ=400, p=225), and L' (λ=300, p=150); and a height of the convex portions is 12 nm to 180 nm,
wherein the relationship between the extraction wavelength and distance between adjacent centers of the convex portions in the lattice structure and a height of corresponding convex portions in the lattice structure combine to enhance luminous efficiency.

2. The organic light emitting diode according to claim 1,
wherein the organic light emitting diode is selected from the group consisting of (a) and (b), and
a depth of the concave portions is 15 nm to 70 nm.

3. The organic light emitting diode according to claim 2, wherein
a shape of the concave portions is the shape obtained by transfer of a truncated conical shape or a columnar shape on the substrate.

4. The organic light emitting diode according to claim 1,
wherein the organic light emitting diode is selected from the group consisting of (a) and (b),
a shape of the concave portions is the shape obtained by transfer of a sinusoidal wave shape on the substrate, and
a depth of the concave portions is 50 nm to 160 nm.

5. The organic light emitting diode according to claim 1, wherein the organic light emitting diode is selected from the group consisting of (c) and (d),
a shape of the convex portions is a truncated conical shape or a columnar shape on the substrate, and
a height of the convex portions is 15 nm to 70 nm.

6. The organic light emitting diode according to claim 1, wherein the organic light emitting diode is selected from the group consisting of (c) and (d),
a shape of the convex portions is a sinusoidal wave shape on the substrate, and
a height of the convex portions is 50 nm to 160 nm.

7. An image display device, comprising the organic light emitting diode according to claim 1.

8. An illuminating device, comprising the organic light emitting diode according to claim 1.

9. The organic light emitting diode according to claim 1, wherein a thickness of the anodic conductive layer is 50 nm to 500 nm, a total thickness of the organic electroluminescence layer is 30 to 500 nm, and a thickness of the cathodic conductive layer is 50 to 3,000 nm.

* * * * *